(12) United States Patent
Matsuno et al.

(10) Patent No.: US 12,712,543 B2
(45) Date of Patent: Aug. 18, 2026

(54) SEMICONDUCTOR CIRCUIT AND SEMICONDUCTOR DEVICE

(71) Applicant: Kioxia Corporation, Tokyo (JP)

(72) Inventors: Junya Matsuno, Yokohama Kanagawa (JP); Yasuhiro Hirashima, Kawasaki Kanagawa (JP); Toshiyuki Kouchi, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 2 days.

(21) Appl. No.: 19/059,786

(22) Filed: Feb. 21, 2025

(65) Prior Publication Data

US 2025/0192774 A1 Jun. 12, 2025

Related U.S. Application Data

(63) Continuation of application No. PCT/JP2022/035382, filed on Sep. 22, 2022.

(51) Int. Cl.
*H03K 17/687* (2006.01)

(52) U.S. Cl.
CPC ................................ *H03K 17/6871* (2013.01)

(58) Field of Classification Search
CPC ................................................ H03K 17/6871
USPC ........................................................ 327/574
See application file for complete search history.

(56) References Cited

U.S. PATENT DOCUMENTS 8,791,735 B1 7/2014 Shibasaki
9,891,116 B2 * 2/2018 Obayashi ................ G01K 7/01
2004/0155892 A1 * 8/2004 Tsuchi ................ G09G 3/3688 345/690
2008/0136464 A1 * 6/2008 Kim .................... H10D 10/421 438/234
2011/0316619 A1 12/2011 Numano
2012/0049901 A1 3/2012 Takewaki et al.
2012/0263223 A1 10/2012 Rajaee et al.

(Continued)

FOREIGN PATENT DOCUMENTS

CN 111277233 A 6/2020
CN 115051702 A 9/2022

(Continued)

OTHER PUBLICATIONS

International Search Report (ISR) (and English language translation thereof) and Written Opinion dated Nov. 29, 2022, issued in International Application No. PCT/JP2022/035382.

(Continued)

*Primary Examiner* — Tomi Skibinski
(74) *Attorney, Agent, or Firm* — Holtz, Holtz & Volek PC

(57) ABSTRACT

According to one embodiment, a semiconductor circuit includes first to third first-conduction-type transistors, first and second second-conduction-type transistors and a constant current source. One end and another end of the first first-conduction-type transistor are respectively coupled to a first power supply node and a first node, and a gate end of the first first-conduction-type transistor is coupled to the first node via a resistor. One end and another end of the second first-conduction-type transistor are respectively coupled to the first power supply node and a second node, the second node is coupled to an output node, and a gate end of the second first-conduction-type transistor is coupled to the first node.

20 Claims, 29 Drawing Sheets

(56) References Cited

U.S. PATENT DOCUMENTS

| | | | |
|---|---|---|---|
| 2013/0049864 | A1 | 2/2013 | Ikehata et al. |
| 2016/0173066 | A1 | 6/2016 | Yang et al. |
| 2017/0025549 | A1 | 1/2017 | Miyake |
| 2017/0085239 | A1 | 3/2017 | Yuan et al. |
| 2021/0036662 | A1 | 2/2021 | Al-Shyoukh |
| 2021/0343328 | A1 | 11/2021 | Shin et al. |
| 2021/0407574 | A1 | 12/2021 | Kim |
| 2022/0058143 | A1 | 2/2022 | Brox et al. |
| 2022/0209729 | A1 | 6/2022 | Lim et al. |
| 2022/0224321 | A1 | 7/2022 | Kinoshita et al. |
| 2022/0247362 | A1* | 8/2022 | Yang ........................ H03F 3/195 |
| 2024/0339976 | A1* | 10/2024 | Li ......................... H03F 1/0216 |

FOREIGN PATENT DOCUMENTS

| | | | |
|---|---|---|---|
| EP | 4024706 | A1 | 7/2022 |
| JP | 2009212729 | A | 9/2009 |
| JP | 2014204234 | A | 10/2014 |
| JP | 2018527843 | A | 9/2018 |
| KR | 102088668 | B1 | 3/2020 |
| TW | 201214965 | A | 4/2012 |
| TW | 201229713 | A | 7/2012 |
| TW | 201314702 | A | 4/2013 |
| TW | 201735539 | A | 10/2017 |
| TW | 202232900 | A | 8/2022 |

OTHER PUBLICATIONS

Chi, et al., "2.2 An 8.5Gb/s/pin 12Gb-LPDDR5 SDRAM with a Hybrid-Bank Architecture using Skew-Tolerant, Low-Power and Speed-Boosting Techniques in a 2nd generation 10nm DRAM Process", 2020 IEEE International Solid-State Circuits Conference—(ISSCC).

* cited by examiner

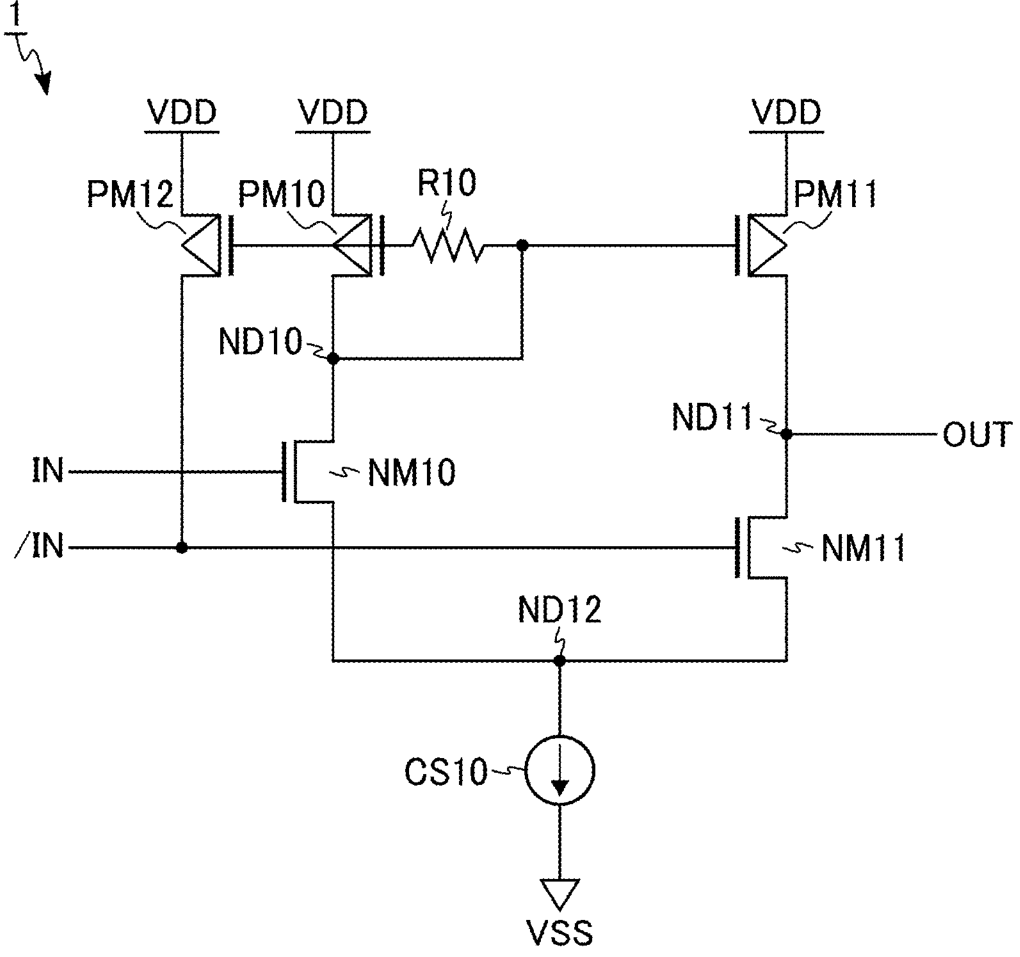
F I G. 1

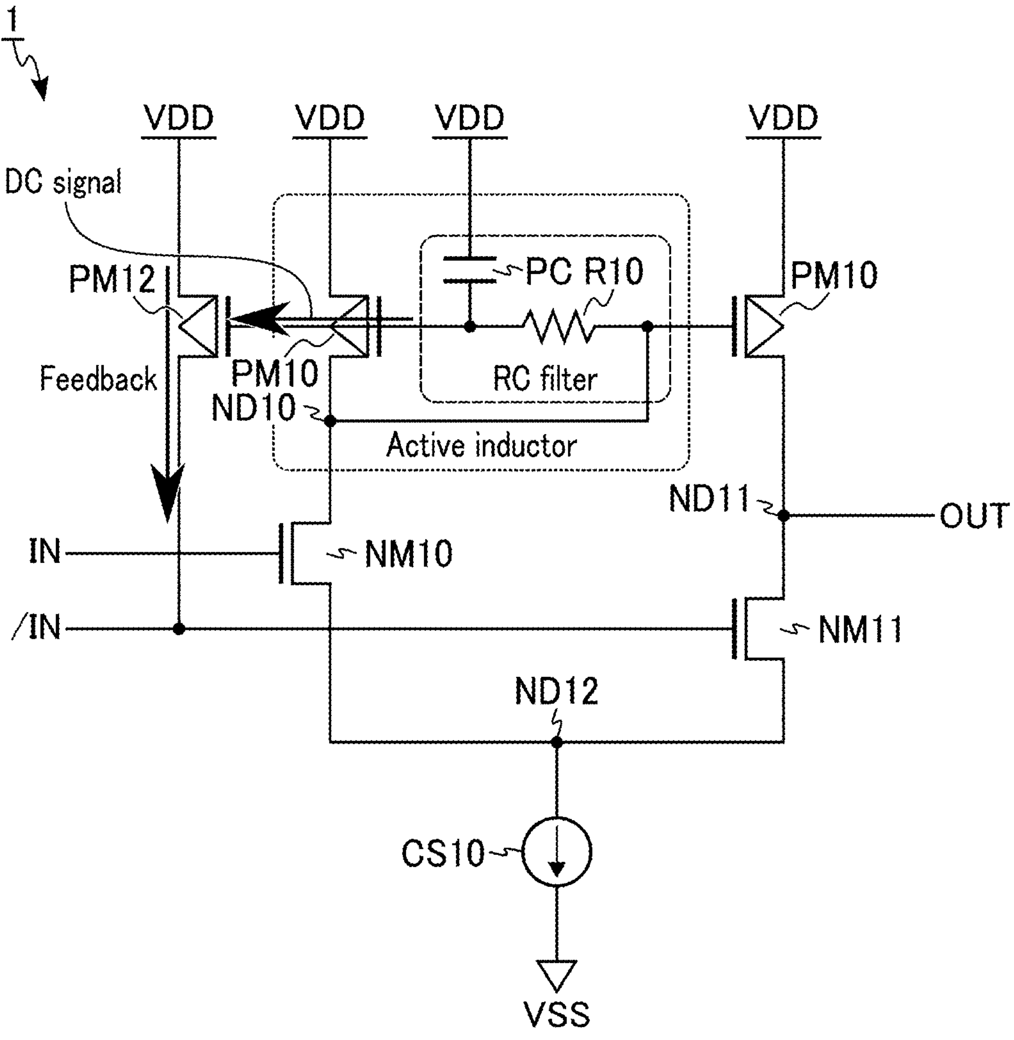
F I G. 3

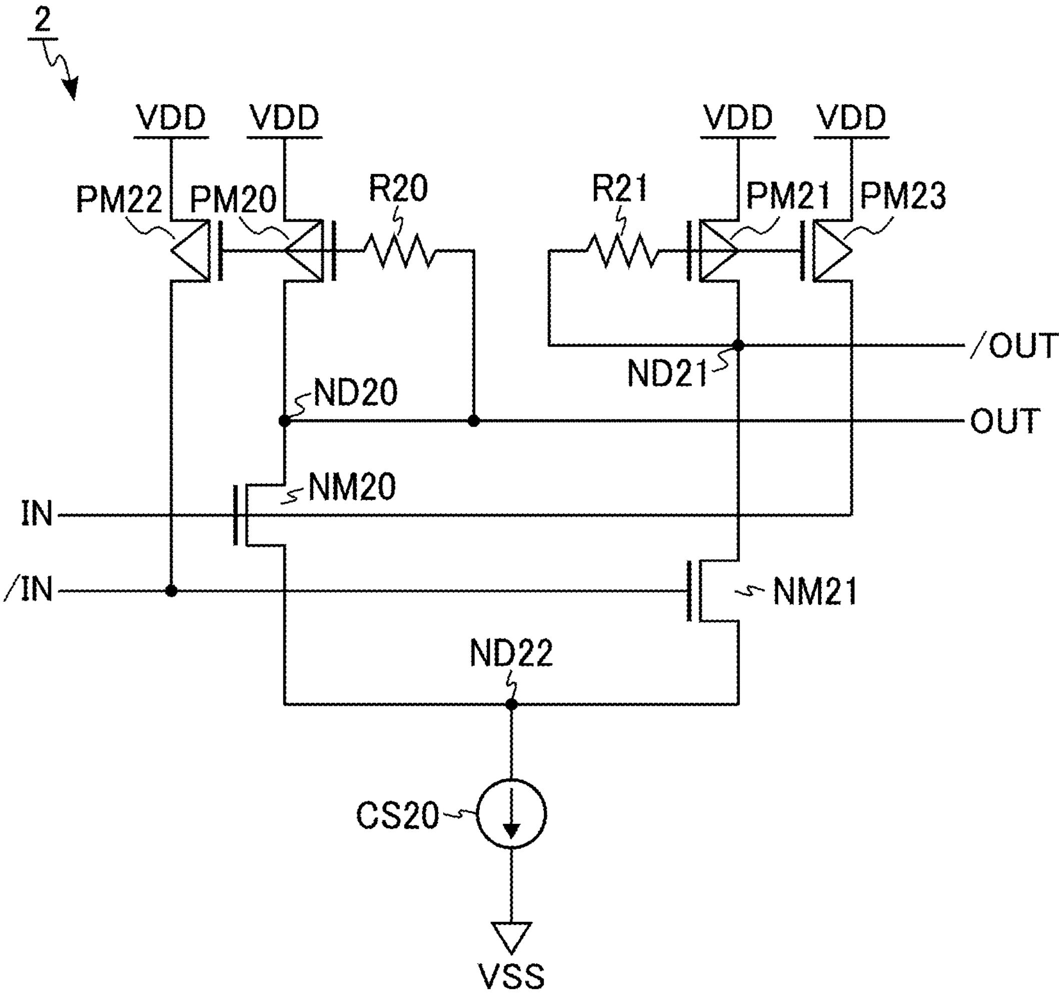
F I G. 7

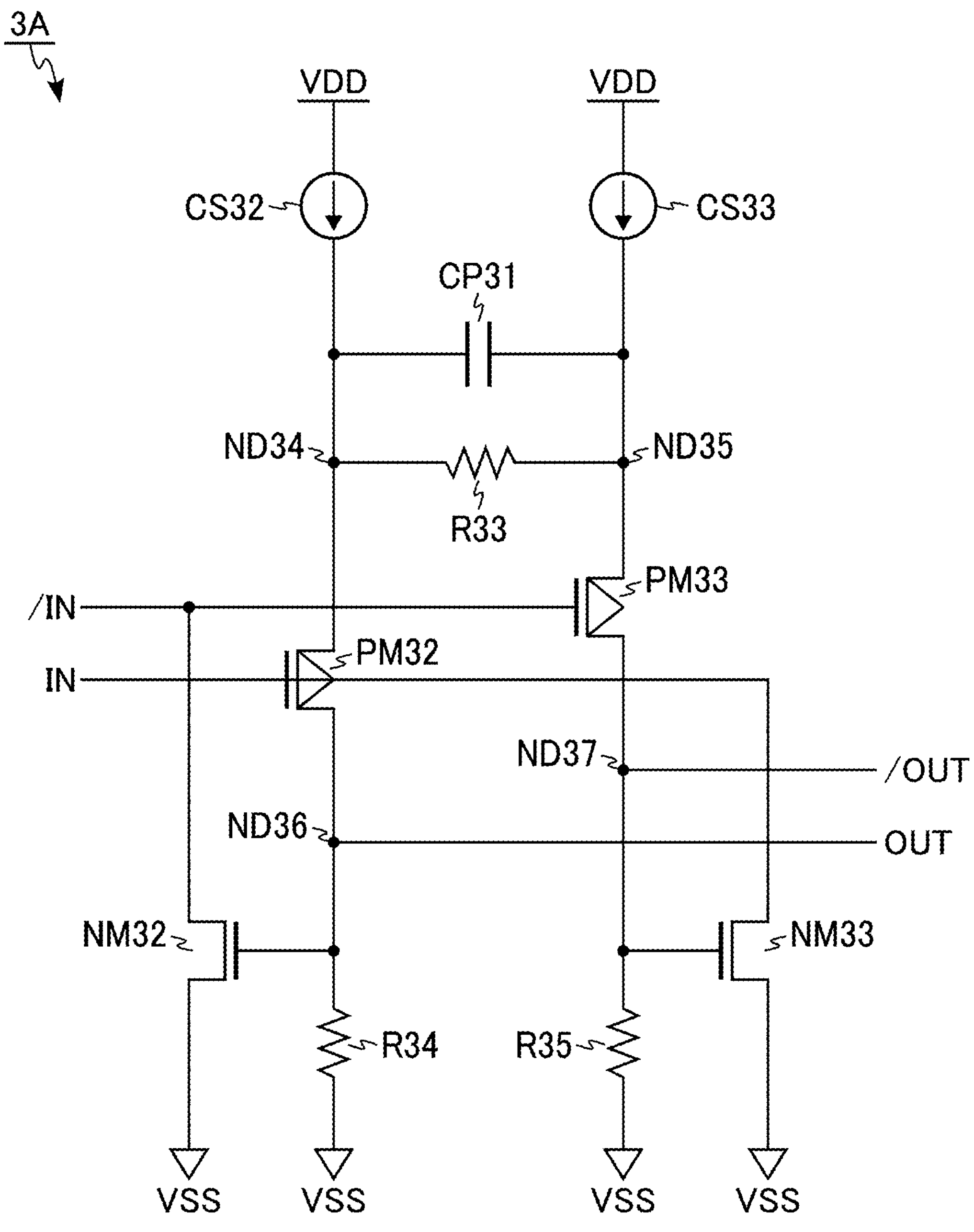
F I G. 10

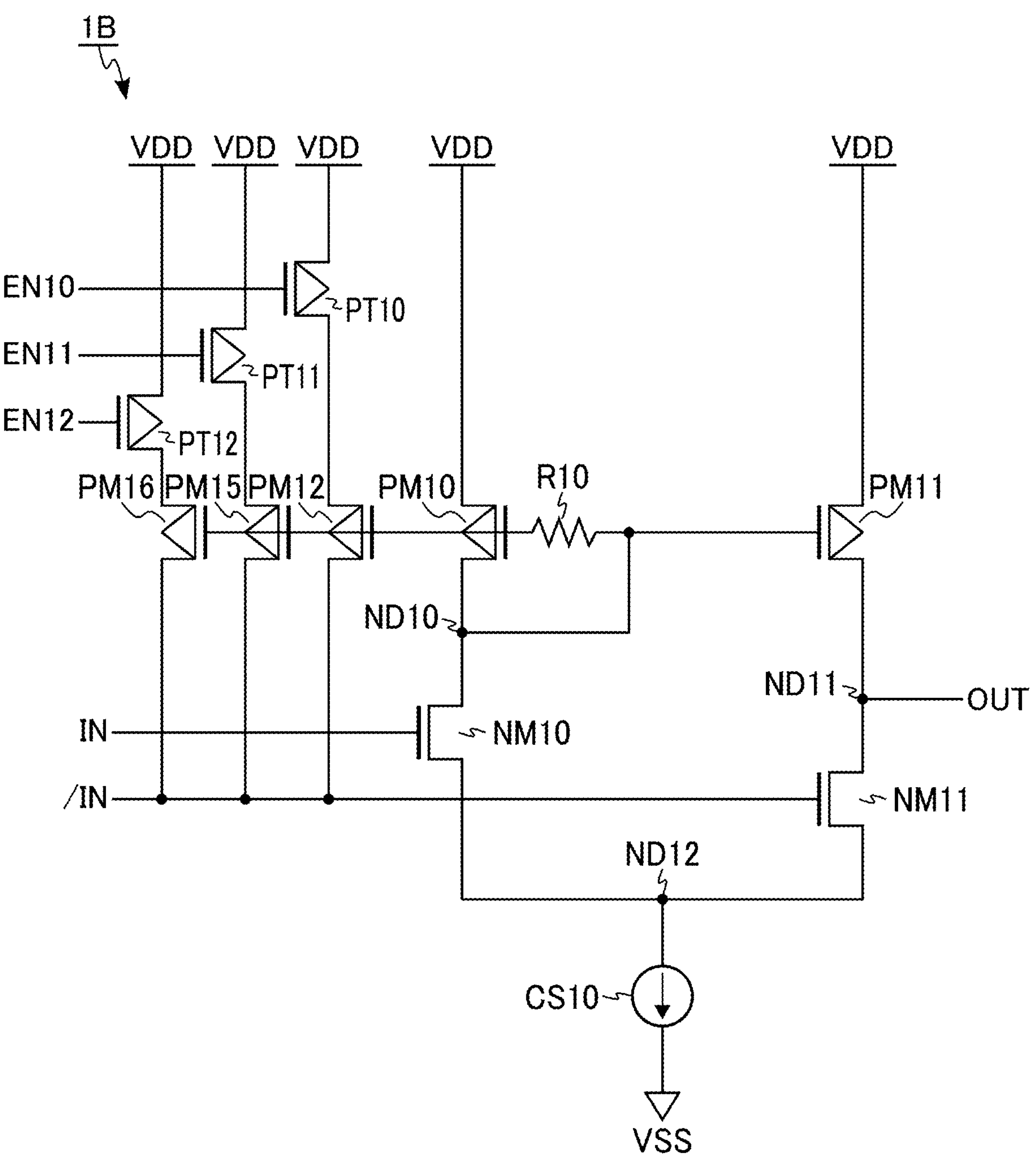
F I G. 11

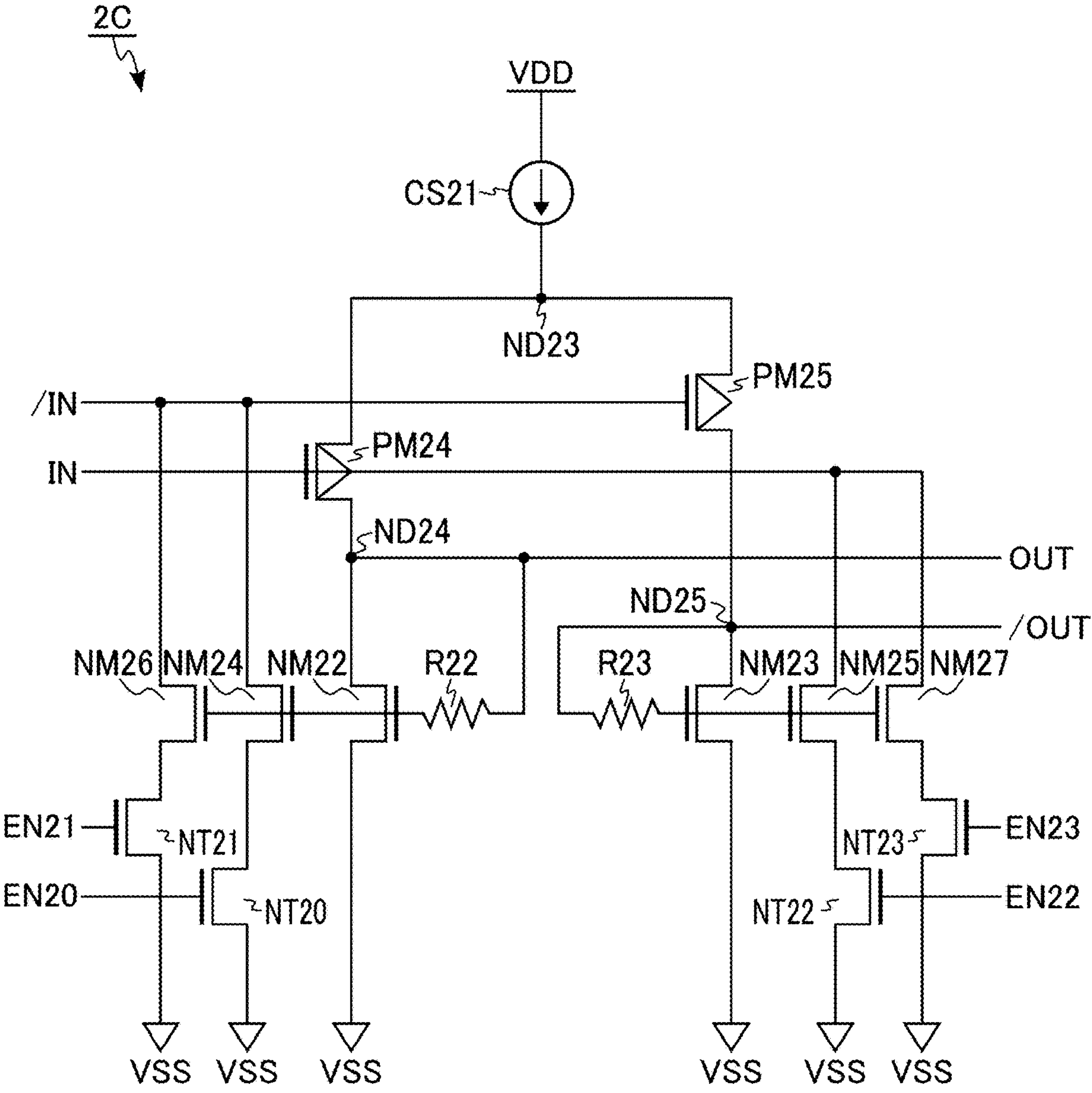
F I G. 14

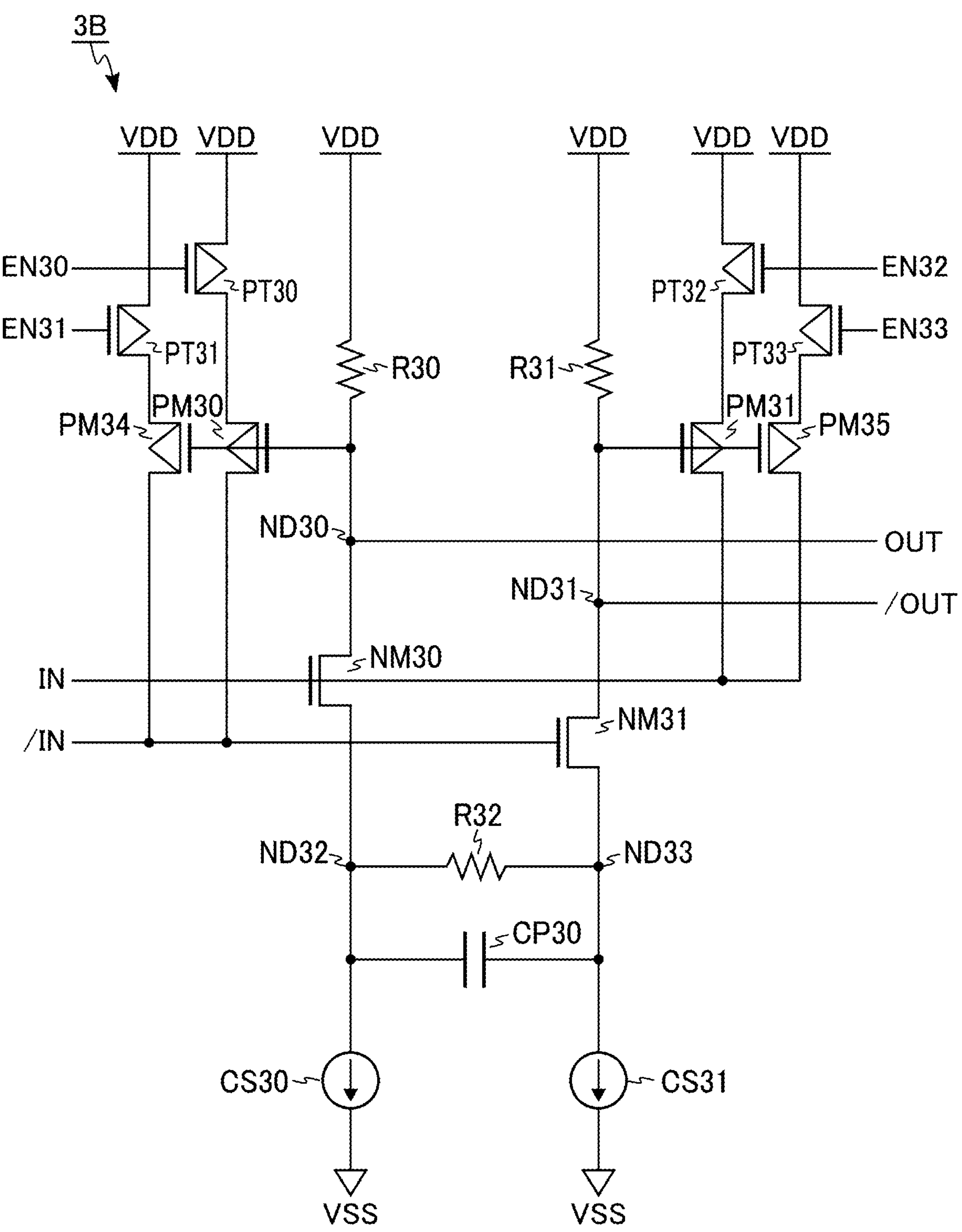
F I G. 15

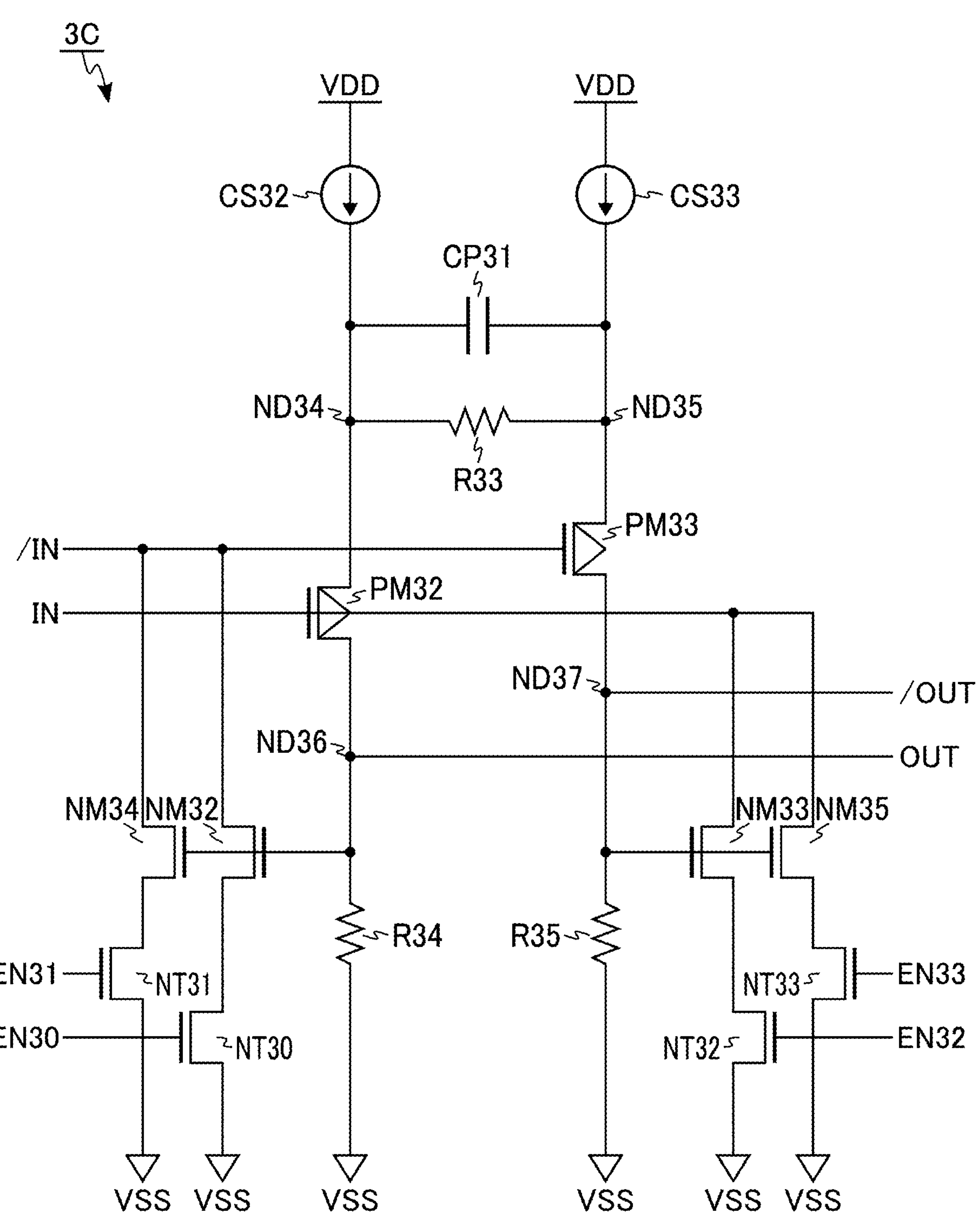
F I G. 16

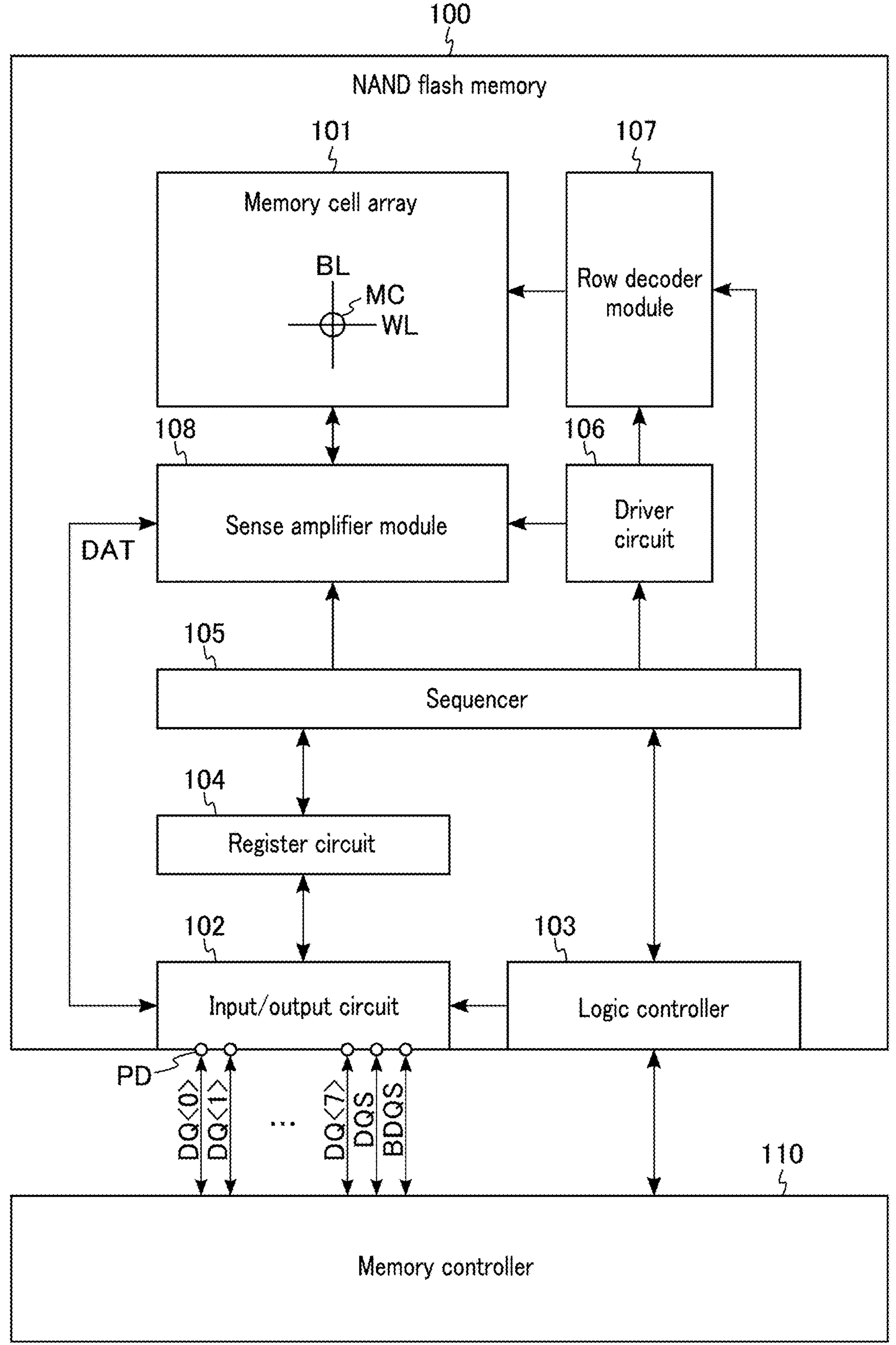
F I G. 17

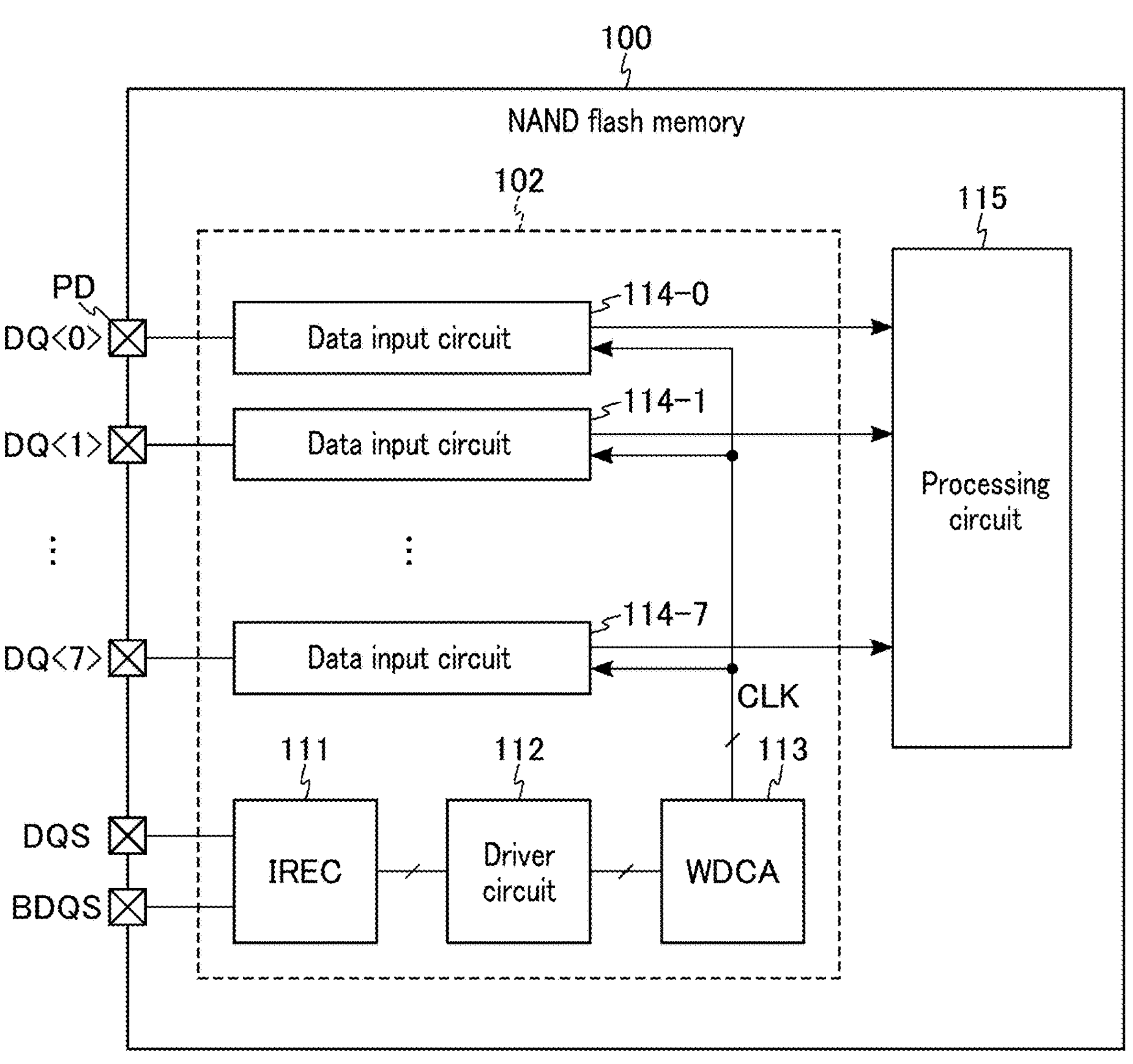
F I G. 18

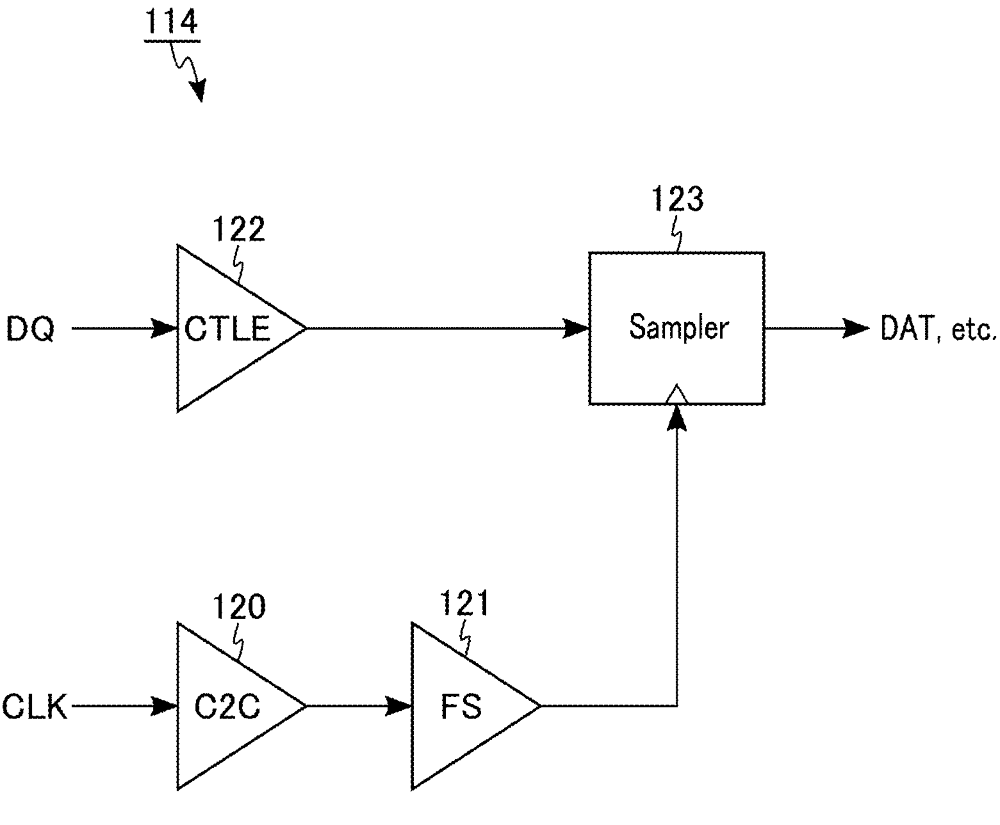
F I G. 19

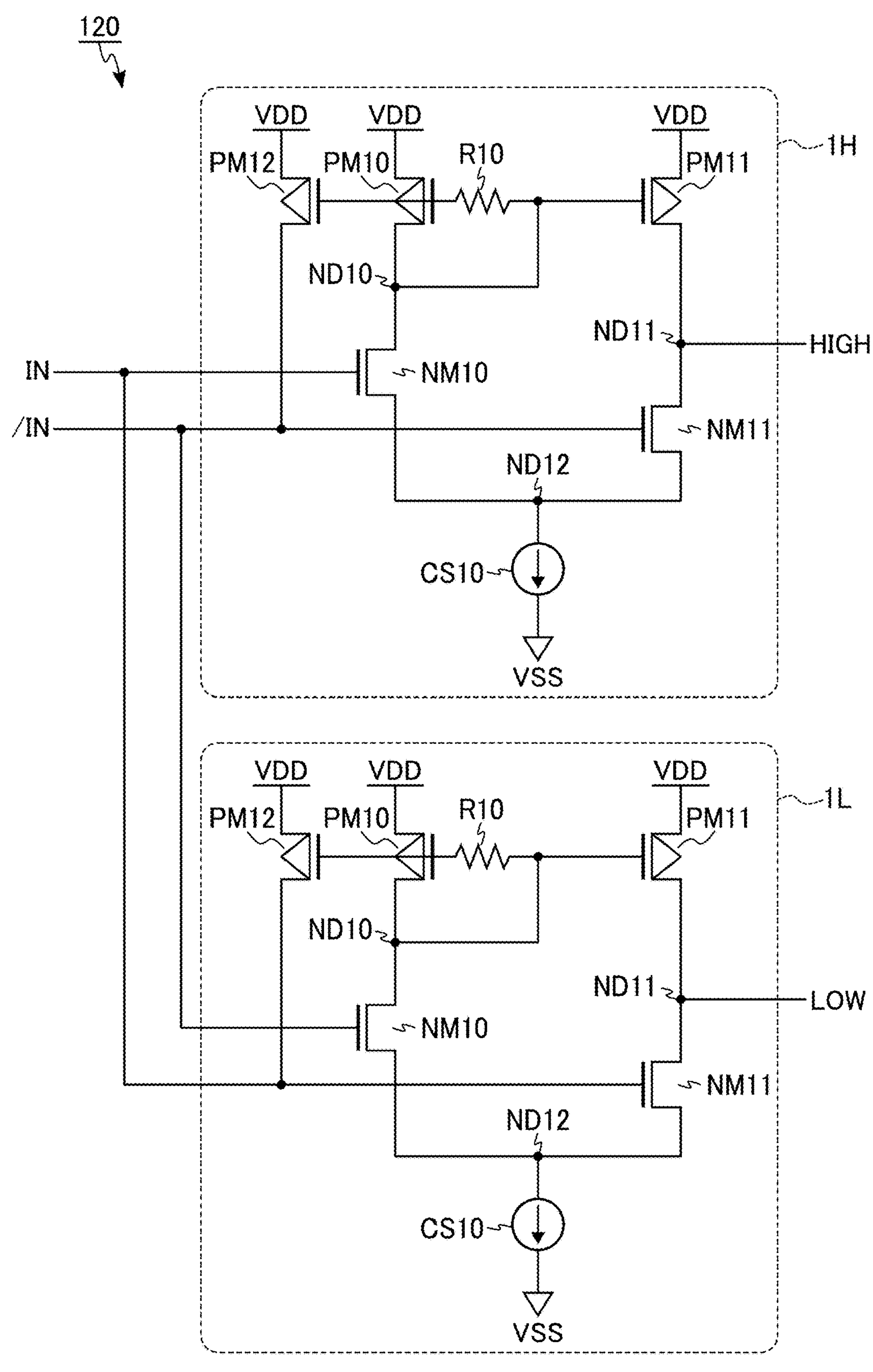
F I G. 20

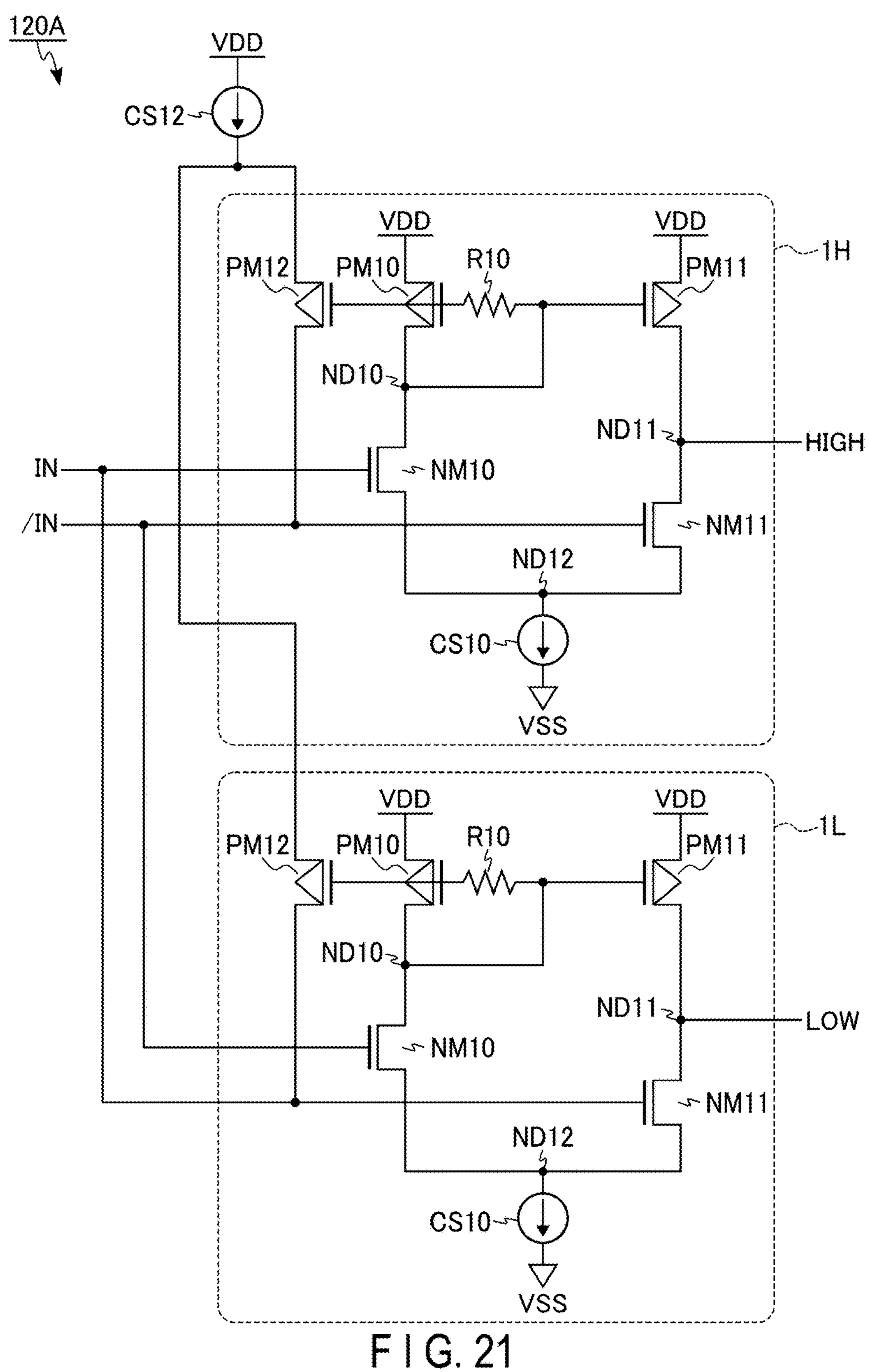
F I G. 21

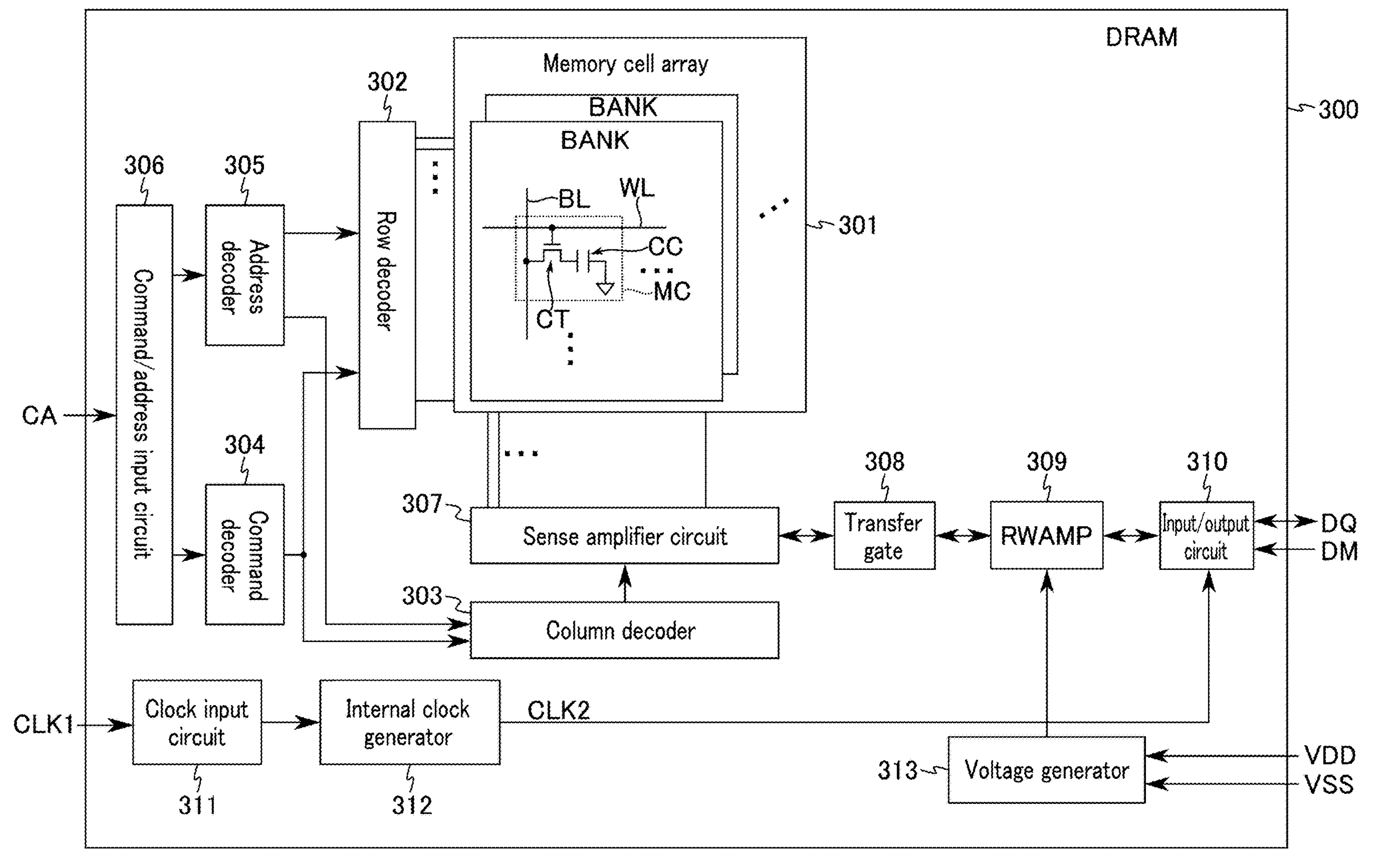
F I G. 23

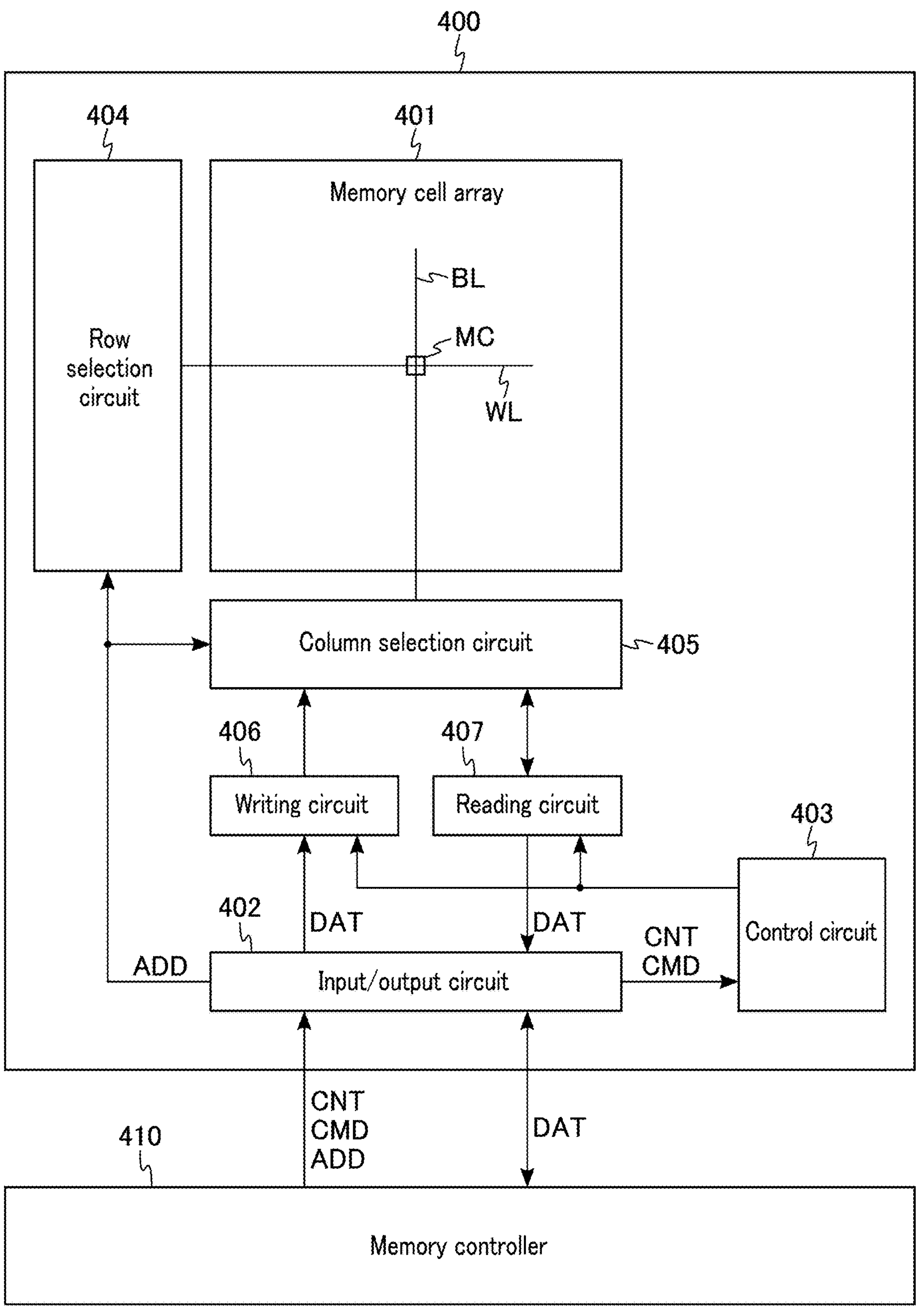
F I G. 24

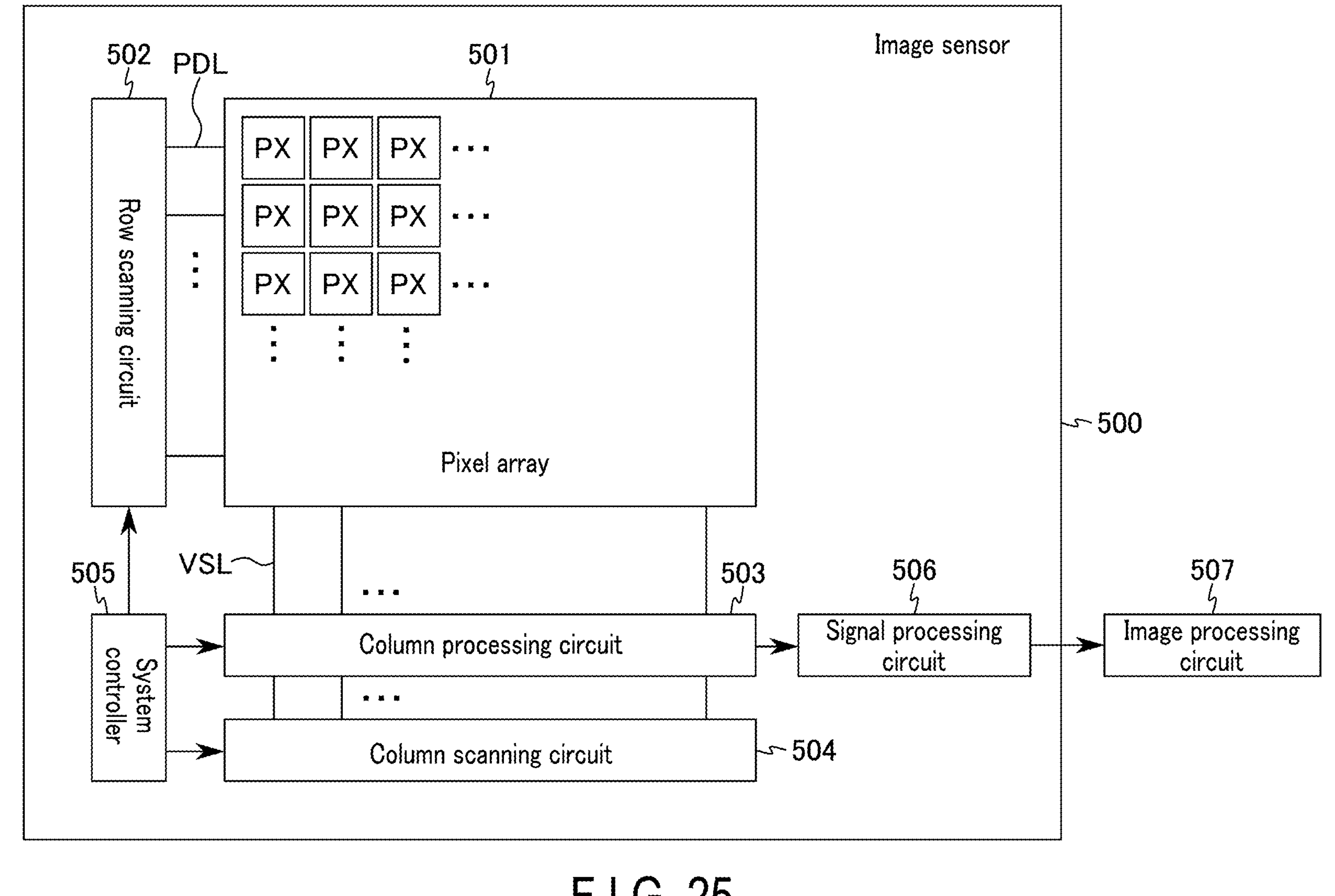
F I G. 25

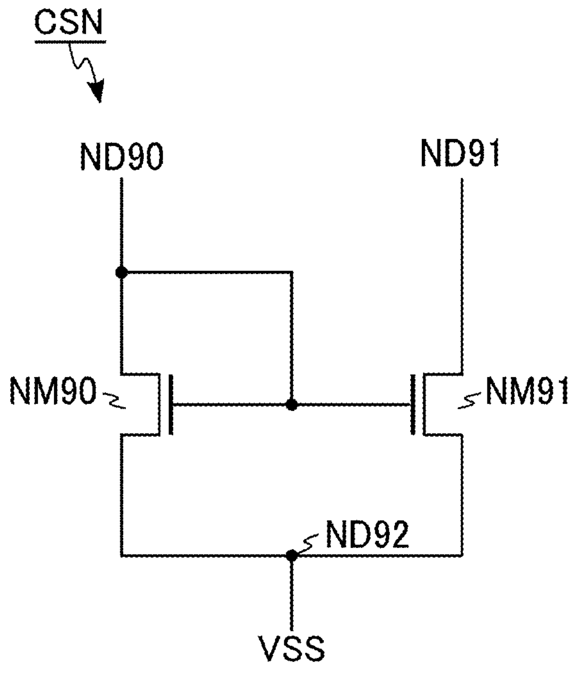
F I G. 29
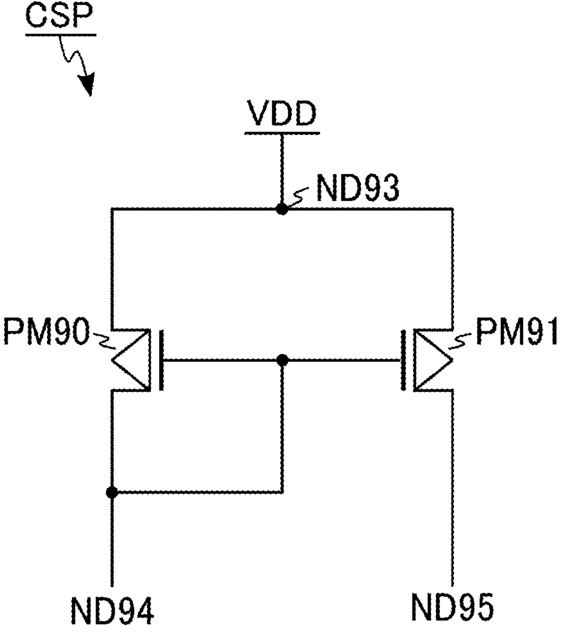
F I G. 30

SEMICONDUCTOR CIRCUIT AND SEMICONDUCTOR DEVICE

CROSS-REFERENCE TO RELATED APPLICATIONS

This application is a Continuation Application of PCT Application No. PCT/JP2020/035382, filed Sep. 22, 2022, the entire contents of which are incorporated herein by reference.

FIELD

Embodiments relate to a semiconductor circuit and a semiconductor device.

BACKGROUND

Semiconductor circuits used for transmission of high-speed signals in integrated circuits are known.

BRIEF DESCRIPTION OF THE DRAWINGS

FIG. 1 is a circuit diagram illustrating an example of a circuit configuration of a semiconductor circuit according to a first embodiment.

FIG. 3 is a schematic diagram illustrating an outline of an operation of the semiconductor circuit according to the first embodiment.

FIG. 7 is a circuit diagram illustrating an example of a circuit configuration of a semiconductor circuit according to a second embodiment.

FIG. 10 is a circuit diagram illustrating an example of a circuit configuration of a semiconductor circuit according to a modification of the third embodiment.

FIG. 11 is a circuit diagram illustrating an example of a circuit configuration of a semiconductor circuit according to a first configuration example of a fourth embodiment.

FIG. 14 is a circuit diagram illustrating an example of a circuit configuration of a semiconductor circuit according to a fourth configuration example of the fourth embodiment.

FIG. 15 is a circuit diagram illustrating an example of a circuit configuration of a semiconductor circuit according to a fifth configuration example of the fourth embodiment.

FIG. 16 is a circuit diagram illustrating an example of a circuit configuration of a semiconductor circuit according to a sixth configuration example of the fourth embodiment.

FIG. 17 is a block diagram illustrating an example of a configuration of a semiconductor device according to a first configuration example of a fifth embodiment.

FIG. 18 is a block diagram illustrating an example of a configuration of an input/output circuit included in the semiconductor device according to the first configuration example of the fifth embodiment.

FIG. 19 is a block diagram illustrating an example of a configuration of a data input circuit in the semiconductor device according to the first configuration example of the fifth embodiment.

FIG. 20 is a circuit diagram illustrating an example of a configuration of a C2C circuit included in a data input circuit in the semiconductor device according to the first configuration example of the fifth embodiment.

FIG. 21 is a circuit diagram illustrating an example of a configuration of the C2C circuit included in the data input circuit in the semiconductor device according to the first configuration example of the fifth embodiment.

FIG. 23 is a block diagram illustrating an example of a configuration of a semiconductor device according to a third configuration example of the fifth embodiment.

FIG. 24 is a block diagram illustrating an example of a configuration of a semiconductor device according to a fourth configuration example of the fifth embodiment.

FIG. 25 is a block diagram illustrating an example of a configuration of a semiconductor device according to a fifth configuration example of the fifth embodiment.

FIG. 29 is a circuit diagram illustrating an example of a circuit configuration of a constant current source including an N-type transistor.

FIG. 30 is a circuit diagram illustrating an example of a circuit configuration of a constant current source including a P-type transistor.

DETAILED DESCRIPTION

Figure 2:
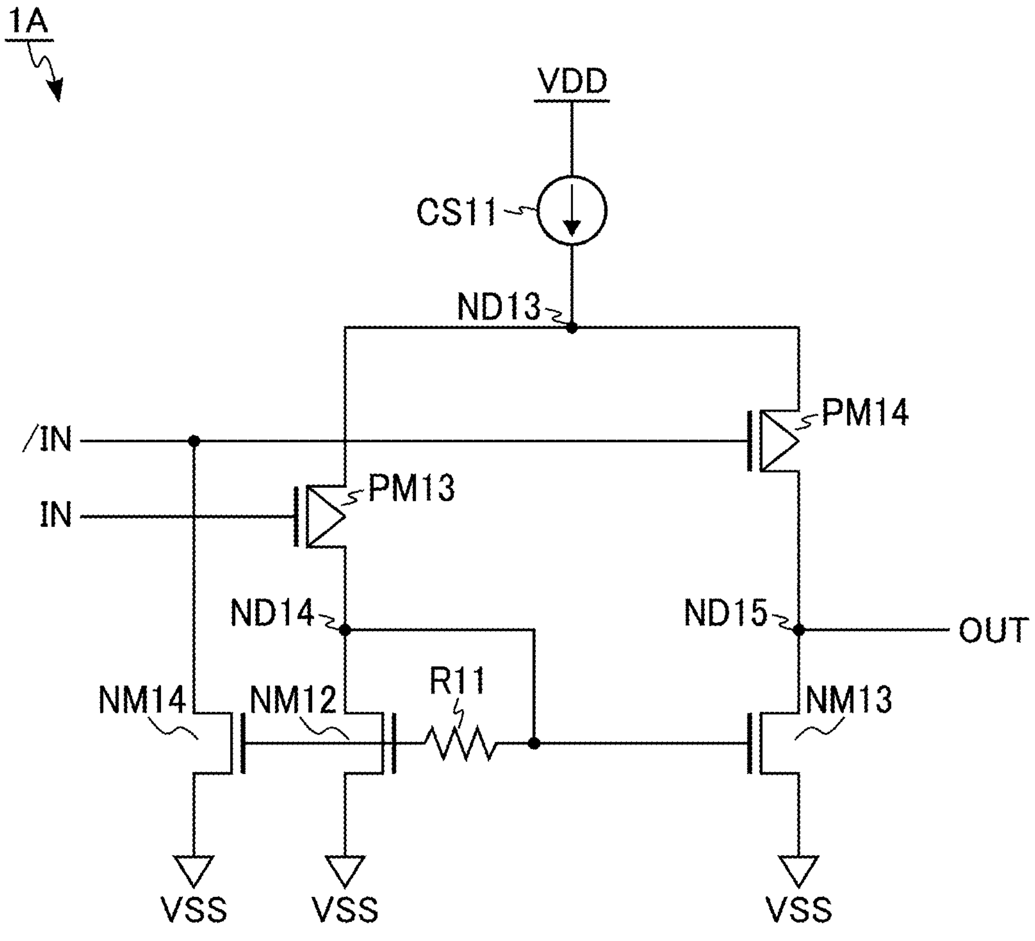
FIG. 2 is a circuit diagram illustrating an example of a circuit configuration of a semiconductor circuit according to a modification of the first embodiment.

In general, according to one embodiment, a semiconductor circuit includes first to third first-conduction-type transistors, first and second second-conduction-type transistors and a constant current source. One end and another end of the first first-conduction-type transistor are respectively coupled to a first power supply node and a first node, and a gate end of the first first-conduction-type transistor is coupled to the first node via a resistor. One end and another end of the second first-conduction-type transistor are respectively coupled to the first power supply node and a second node, the second node is coupled to an output node, and a gate end of the second first-conduction-type transistor is coupled to the first node. One end and another end of the first second-conduction-type transistor are respectively coupled to the first node and a third node, and a gate end of the first second-conduction-type transistor is coupled to a first input node. One end and another end of the second second-conduction-type transistor are respectively coupled to the second node and the third node, and a gate end of the second second-conduction-type transistor is coupled to a second input node. One end and another end of the constant current source are respectively coupled to the third node and a second power supply node. One end and another end of the third first-conduction-type transistor are respectively coupled to the first power supply node and the second input node, and a gate end of the third first-conduction-type transistor is coupled to a gate end of the first first-conduction-type transistor.

Hereinafter, each embodiment will be described with reference to the drawings. Each embodiment exemplifies an apparatus and a method for embodying the technical idea of the invention. The drawings are schematic or conceptual. The illustration of the configuration is omitted as appropriate. In the present specification, components having substantially the same function and configuration are denoted by the same reference numerals. Numbers, characters, and the like added to the reference numerals are referred to by the same reference numerals, and are used to distinguish between similar elements.

Note that, in the present specification, each of N-type transistors NM and NT is, for example, an N-type MOS transistor. Each of P-type transistors PM and PT is, for example, a P-type MOS transistor. A resistor R may be provided as an element or may be provided as wiring. The constant current source CS is a power supply circuit that controls output current to be constant. A power supply voltage is applied to a power supply node VDD. A ground voltage is applied to a ground node VSS. The power supply voltage is a voltage higher than the ground voltage. An input signal is input to an input node. An output signal is output from an output node. The voltages of the input node and the output node are also referred to as "input voltage" and "output voltage", respectively. A character "/" added to the reference sign indicates that an inverted signal of a signal input to the node of the combined reference sign is input or output.

<1> First Embodiment

A semiconductor circuit 1 according to a first embodiment is a 2-in 1-out) current mode logic (CML) to CMOS circuit (hereinafter, referred to as a "C2C circuit") having a configuration for feeding back a signal of an active inductor. Hereinafter, details of the semiconductor circuit 1 according to the first embodiment will be described.

<1-1> Configuration

FIG. 1 is a circuit diagram illustrating an example of a circuit configuration of the semiconductor circuit 1 according to the first embodiment. As illustrated in FIG. 1, the semiconductor circuit 1 is a C2C circuit that receives an analog small signal to an input nodes IN and/IN and outputs a digital large signal from an output node OUT. The semiconductor circuit 1 includes, for example, P-type transistors PM10 to PM12, N-type transistors NM10 and NM11, a resistor R10, a constant current source CS10, and nodes ND10 to ND12.

A source end and a drain end of the P-type transistor PM10 are coupled to the power supply node VDD and the node ND10, respectively. A gate end of the P-type transistor PM10 is coupled to the node ND10 via the resistor R10. A drain end and a source end of the N-type transistor NM10 are coupled to the nodes ND10 and ND12, respectively. A gate end of the N-type transistor NM10 is coupled to the input node IN.

A source end and a drain end of the P-type transistor PM11 are coupled to the power supply node VDD and the node ND11, respectively. A gate end of the P-type transistor PM11 is coupled to the node ND10. The node ND11 is coupled to the output node OUT. A drain end and a source end of the N-type transistor NM11 are coupled to the nodes ND11 and ND12, respectively. A gate end of the N-type transistor NM11 is coupled to the input node/IN.

An input end and an output end of the constant current source CS10 are coupled to the node ND12 and a ground node VSS, respectively.

A source end and a drain end of the P-type transistor PM12 are coupled to the power supply node VDD and the input node/IN, respectively. A gate end of the P-type transistor PM12 is coupled to the gate end of the P-type transistor PM10. The P-type transistor PM12 may be smaller than the P-type transistor PM10. The ratio between the size of the P-type transistor PM12 and the size of the P-type transistor PM10 is, for example, 1:1.2 to 7.

In the C2C circuit according to the first embodiment, the transistor that receives the input signal may be a P-type transistor. Hereinafter, as a C2C circuit according to a modification of the first embodiment, a semiconductor device 1A including a PMOS transistor that receives an input signal will be described.

FIG. 2 is a circuit diagram illustrating an example of a circuit configuration of the semiconductor circuit 1A according to the modification of the first embodiment. As illustrated in FIG. 2, the semiconductor circuit 1A includes, for example, P-type transistors PM13 and PM14, N-type transistors NM12 to NM14, a resistor R11, a constant current source CS11, and nodes ND13 to ND15.

An input end and an output end of the constant current source CS11 are coupled to the power supply node VDD and the node ND13, respectively.

A source end and a drain end of the P-type transistor PM13 are coupled to the nodes ND13 and ND14, respectively. A gate end of the P-type transistor PM13 is coupled to the input node IN. A drain end and a source end of the N-type transistor NM12 are coupled to the node ND14 and a ground node VSS, respectively. A gate end of the N-type transistor NM12 is coupled to the node ND14 via the resistor R11.

A source end and a drain end of the P-type transistor PM14 are coupled to the nodes ND13 and ND15, respectively. A gate end of the P-type transistor PM14 is coupled to an input node/IN. The node ND15 is coupled to an output node OUT. A drain end and a source end of the N-type transistor NM13 are coupled to the node ND15 and a ground node VSS, respectively. A gate end of the N-type transistor NM13 is coupled to the node ND14.

A drain end and a source end of the N-type transistor NM14 are coupled to the input node/IN and a ground node VSS, respectively. A gate end of the N-type transistor NM14 is coupled to the gate end of the N-type transistor NM12. The N-type transistor NM14 may be smaller than the N-type transistor NM12. The ratio between the size of the N-type transistor NM14 and the size of the N-type transistor NM12 is, for example, 1:1.2 to 7.

<1-2> Operation

FIG. 3 is a schematic diagram illustrating an outline of an operation of the semiconductor circuit 1 according to the first embodiment. As illustrated in FIG. 3, in the semiconductor circuit 1, a parasitic capacitance PC is formed at the gate end of the P-type transistor PM10. In the semiconductor circuit 1, a set of the parasitic capacitance PC and the resistor R10 functions as an RC filter. As a result, a set of the P-type transistor PM10, the parasitic capacitance PC, and the resistor R10 functions as an active inductor. Then, in the semiconductor circuit 1, the P-type transistor PM12 feeds back the signal of the active inductor to the input node/IN.

Specifically, the on/off state of the N-type transistors NM10 and NM11 change according to the input signals IN and/IN. Then, the voltage of the node ND10 changes according to the states of the N-type transistors NM10 and NM11. In a case where a high frequency signal is input to the input nodes IN and/IN, the parasitic capacitance PC is charged in a case where the N-type transistor NM10 is in an on-state. As a result, at the gate end of the P-type transistor PM10, the high frequency signal is suppressed to be a DC signal. Then, in the semiconductor circuit 1, the gate end of the P-type transistor PM12 is coupled to the gate end of the P-type transistor PM10, and the P-type transistor PM12 is coupled between the power supply node VDD and the input node/IN. With this configuration, the P-type transistor PM12 can feed back a signal based on the voltage of the gate end of the P-type transistor PM10 to the node/IN, and can reduce the gain near the direct current of the semiconductor circuit 1.

Note that, in the semiconductor circuit 1A, similarly to the semiconductor circuit 1, the N-type transistor NM14 can feed back a signal based on the voltage of the gate end of the N-type transistor NM12 to the node/IN, and the gain of the semiconductor circuit 1A in the vicinity of direct current can be reduced.

<1-3> Advantageous Effects of First Embodiment

According to the semiconductor circuits 1 and 1A of the first embodiment described above, high-speed signal transmission can be realized. Hereinafter, advantageous effects of the first embodiment will be described in detail.

The frequency of a signal used for transmission and reception of data between two devices tends to improve as data communication speeds increase. Therefore, it is desirable that a circuit used for signal transmission is capable of handling a high frequency signal. However, in a case where the frequency of the signal increases, the reception circuit cannot be in a full swing state (a rail-to-rail state), and skew may occur.

As a method of suppressing the skew, it is conceivable to provide a plurality of CMLs in the path of the input node to reduce the gain near the direct current. In a case where the gain near the direct current decreases, the reception circuit can be in a full swing state (a rail-to-rail state), and a high-speed operation becomes possible. However, providing a plurality of CMLs in the path of the input node requires a wide circuit area and a large current consumption, which may cause an increase in cost of the semiconductor circuit.

Therefore, the semiconductor circuits 1 and 1A according to the first embodiment include one transistor that operates based on the voltage of the active inductor. With this configuration, the semiconductor circuits 1 and 1A can feed back the voltage based on the signal input to the input node IN to the paired input node/IN.

Figure 4:
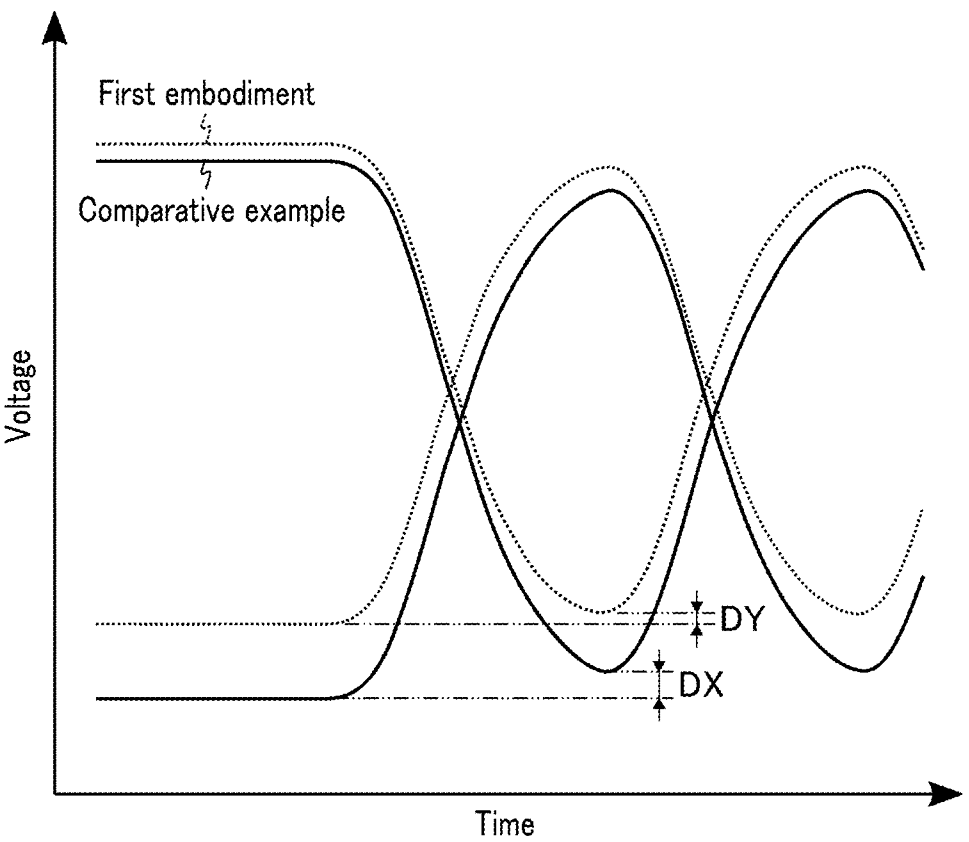
FIG. 4 is a waveform diagram illustrating a simulation result of the operation of the semiconductor circuit according to the first embodiment.

FIG. 4 is a waveform diagram illustrating a simulation result of the operation of the semiconductor circuit 1 according to the first embodiment. FIG. 4 illustrates a change in the voltage of the output node of the semiconductor circuit 1 in a case where the signal input to the input node changes from the DC signal to the high frequency signal. A change in the voltage of the output node of the semiconductor circuit 1 corresponding to the first embodiment is indicated by a broken line. In addition, in FIG. 4, as a comparative example, a simulation result in a case where the P-type transistor PM12 is omitted from the semiconductor circuit 1 is indicated by a solid line.

As illustrated in FIG. 4, in the comparative example, the difference between the output voltage based on the DC signal and the peak of the output voltage at the time of the first swing when the DC signal changes to the high frequency signal is DX. On the other hand, in the first embodiment, the difference between the output voltage based on the DC signal and the voltage at the peak of the output voltage at the time of the first swing when the DC signal changes to the high frequency signal is DY smaller than DX. In other words, in the semiconductor circuit 1 according to the first embodiment, the gain in the vicinity of direct current of the semiconductor circuit 1 (transmission circuit) is reduced by the P-type transistor PM12. Similarly to the semiconductor circuit 1, the semiconductor circuit 1A can also reduce the gain near the direct current by the N-type transistor NM14.

Figure 5:
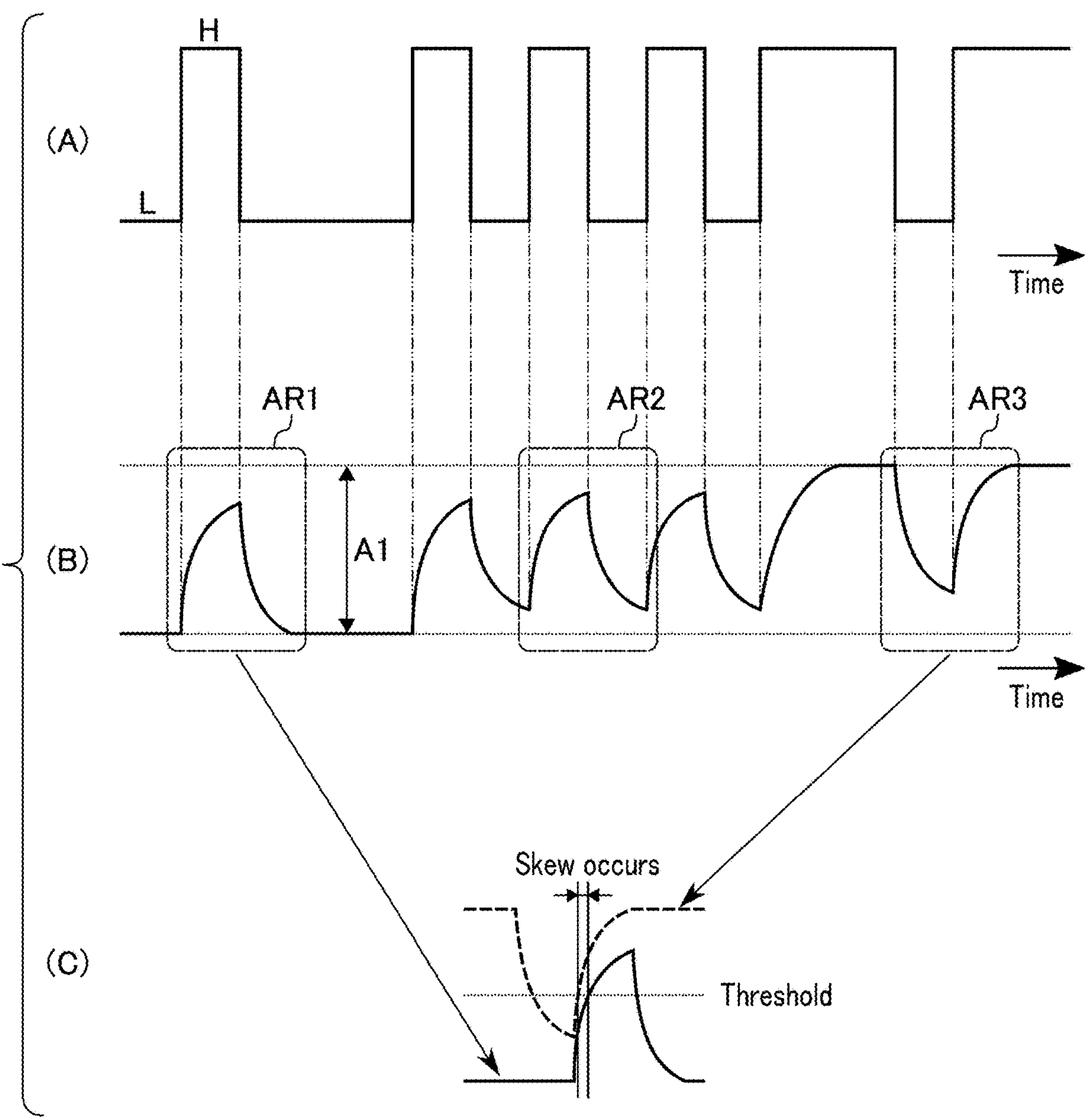
FIG. 5 is a waveform diagram illustrating a specific example of an operation of a semiconductor circuit according to a comparative example.
Figure 6:
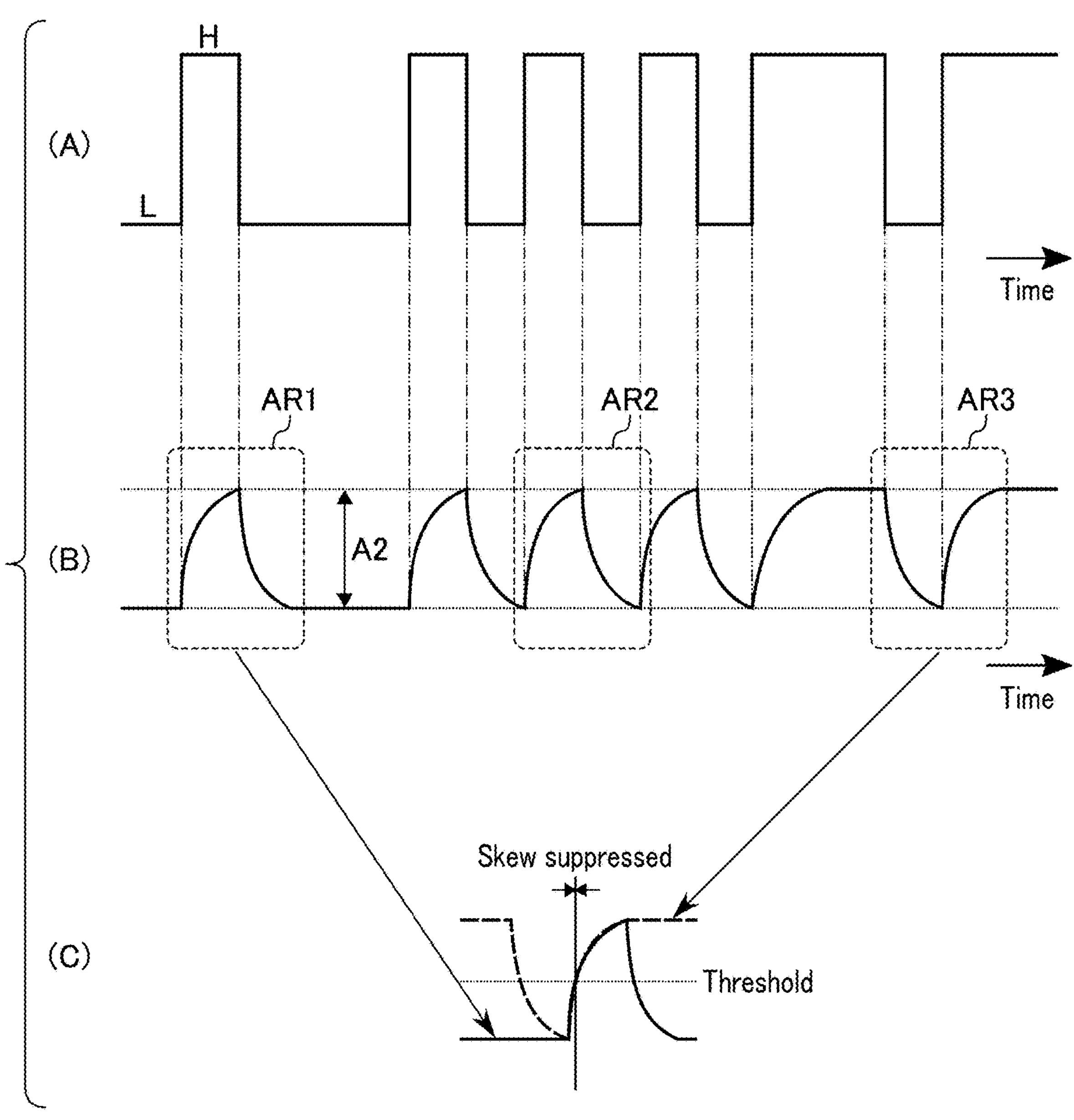
FIG. 6 is a waveform diagram illustrating a specific example of the operation of the semiconductor circuit according to the first embodiment.

FIGS. 5 and 6 are waveform diagrams illustrating specific examples of the operation of the semiconductor circuit 1. FIGS. 5 and 6 correspond to the comparative example and the first embodiment, respectively. Waveforms illustrated in (A) of FIGS. 5 and 6 indicate timings at which a signal input to the semiconductor circuit 1 transitions between an “L” level and an “H” level. Waveforms illustrated in (B) of FIGS. 5 and 6 indicate an output signal of the semiconductor circuit 1 based on the signal illustrated in (A). Regions AR1 to AR3 illustrated in (B) of FIGS. 5 and 6 respectively extract a period corresponding to one pulse. Specifically, the region AR1 extracts the waveform of the output voltage when the signal at the “H” level corresponding to one pulse is input from the DC signal at the “L” level. The region AR2 extracts the waveform of the output voltage when the high frequency signal is input. The region AR3 extracts the waveform of the output voltage when the signal at the “L” level corresponding to one pulse is input from the DC signal at the “H” level.

As illustrated in (B) of FIG. 5, in each of the regions AR1 to AR3 of the comparative example, the output voltage cannot be fully swung. Specifically, in the comparative example, the difference (amplitude) between the output voltage based on the DC signal at the “L” level and the output voltage based on the DC signal at the “H” level is indicated as “A1”. In the comparative example, the variation amount of the output voltage is smaller than A1 in any of the regions AR1 to AR3. (C) of FIG. 5 illustrates waveforms of the regions AR1 and AR3 in the comparative example in an overlapping manner so that timings of transition from the “L” level to the “H” level are aligned. As illustrated in (C) of FIG. 5, since the full swing cannot be performed in each of the regions AR1 and AR3 of the comparative example, the timings of crossing the thresholds used for determination of the “H” level and the “L” level are different when transitioning from the “L” level to the “H” level. In other words, in the comparative example, skew may occur.

On the other hand, as illustrated in (B) of FIG. 6, in each of the regions AR1 to AR3 of the first embodiment, the output voltage can be fully swung. Specifically, in the first embodiment, the difference (amplitude) between the output voltage based on the DC signal at the "L" level and the output voltage based on the DC signal at the "H" level is indicated as "A2". According to the first embodiment, the variation amount of the output voltage is equal to A2 in any of the regions AR1 to AR3. (C) of FIG. 6 illustrates a state in which the waveforms of the regions AR1 and AR3 in the first embodiment are superimposed. As illustrated in (C) of FIG. 6, in each of the regions AR1 and AR3 of the first embodiment, since the full swing is possible, the timings of crossing the thresholds used for determination of the "H" level and the "L" level at the time of transition from the "L" level to the "H" level are substantially the same. In other words, according to the first embodiment, skew can be suppressed.

As described above, the semiconductor circuits 1 and 1A according to the first embodiment can improve the output voltage to be close to the full swing state as compared with a case where the voltage of the active inductor is not fed back. As a result, the semiconductor circuits 1 and 1A can suppress skew and can realize high-speed operation for high frequencies. In other words, the semiconductor can circuits 1 and 1A realize high-speed signal transmission.

In the semiconductor circuits 1 and 1A according to the first embodiment, one transistor is added to feed back the voltage of the active inductor. With such one transistor, an advantageous effect similar to that in a case where a plurality of CMLs is provided in the path of the input node is realized. Therefore, the semiconductor circuits 1 and 1A according to the first embodiment can realize a circuit having a smaller area than a case where a plurality of CMLs is provided in the path of the input node.

According to the first embodiment, the case where the number of transistors added to feed back the voltage of the active inductor is one has been exemplified, but the present invention is not limited thereto. According to the layout of the circuit area around the semiconductor circuits 1 and 1A according to the first embodiment, the P-type transistor PM12 and the N-type transistor NM14 may include a plurality of transistors. Specifically, for example, in the semiconductor circuit 1, the gate ends of the plurality of P-type transistors PM12 are coupled to the gate ends of the P-type transistors PM10, and the plurality of P-type transistors PM12 are coupled between the power supply node VDD and the input node/IN. The total size of the plurality of P-type transistors PM12 may be smaller than that of the P-type transistor PM10. The ratio between the total size of the plurality of P-type transistors PM12 and the size of the P-type transistor PM10 is, for example, 1:1.2 to 7. Specifically, for example, in the semiconductor circuit 1A, the drain ends and the source ends of the plurality of N-type transistors NM14 are coupled to the input node/IN and the ground node VSS, respectively. The gate ends of the plurality of N-type transistors NM14 are coupled to the gate ends of the N-type transistors NM12. The total size of the plurality of N-type transistors NM14 may be smaller than that of the N-type transistor NM12. The ratio between the total size of the plurality of N-type transistors NM14 and the size of the N-type transistor NM12 is, for example, 1:1.2 to 7.

Note that the semiconductor circuits 1 and 1A according to the first embodiment are preferably selectively used according to an input signal (input circuit). By selectively using the NMOS based semiconductor circuit 1 and the PMOS based semiconductor circuit 1A according to the characteristics of the input signal, more desirable efficiency and high speed signal transmission can be realized.

<2> Second Embodiment

A semiconductor circuit 2 according to a second embodiment is a 2-in 2-out differential amplifier circuit having a configuration for feeding back a signal of an active inductor. Hereinafter, details of the semiconductor circuit 2 according to the second embodiment will be described.

<2-1> Configuration

FIG. 7 is a circuit diagram illustrating an example of a circuit configuration of the semiconductor circuit 2 according to the second embodiment. As illustrated in FIG. 7, the semiconductor circuit 2 is a differential amplifier circuit that amplifies a difference between two input voltages input to input nodes IN and/IN and outputs the amplified difference from output nodes OUT and/OUT. The semiconductor circuit 2 includes, for example, P-type transistors PM20 to PM23, N-type transistors NM20 and NM21, resistors R20 and R21, a constant current source CS20, and nodes ND20 to ND22.

A source end and a drain end of the P-type transistor PM20 are coupled to a power supply node VDD and ND20, respectively. A gate end of the P-type transistor PM20 is coupled to the node ND20 via the resistor R20. The node ND20 is coupled to the output node OUT. A drain end and a source end of the N-type transistor NM20 are coupled to the nodes ND20 and ND22, respectively.

A source end and a drain end of the P-type transistor PM21 are coupled to the power supply node VDD and ND21, respectively. A gate end of the P-type transistor PM21 is coupled to the node ND21 via the resistor R21. The node ND21 is coupled to the output node/OUT. A drain end and a source end of the N-type transistor NM21 are coupled to the nodes ND21 and ND22, respectively.

An input end and an output end of the constant current source CS20 are coupled to the node ND22 and the ground node VSS, respectively.

A source end and a drain end of the P-type transistor PM22 are coupled to a power supply node VDD and the input node/IN, respectively. A gate end of the P-type transistor PM22 is coupled to the gate end of the P-type transistor PM20. The P-type transistor PM22 may be smaller than the P-type transistor PM20. The ratio between the size of the P-type transistor PM22 and the size of the P-type transistor PM20 is, for example, 1:1.2 to 7.

A source end and a drain end of the P-type transistor PM23 are coupled to a power supply node VDD and the input node IN, respectively. A gate end of the P-type transistor PM23 is coupled to the gate end of the P-type transistor PM21. The P-type transistor PM23 may be smaller than the P-type transistor PM21. The ratio between the size of the P-type transistor PM23 and the size of the P-type transistor PM21 is, for example, 1:1.2 to 7.

In the differential amplifier circuit according to the second embodiment, the transistor that receives the input signal may be a P-type transistor. Hereinafter, as a differential amplifier circuit according to a modification of the second embodiment, a semiconductor device 2A including a PMOS transistor that receives an input signal will be described.

Figure 8:
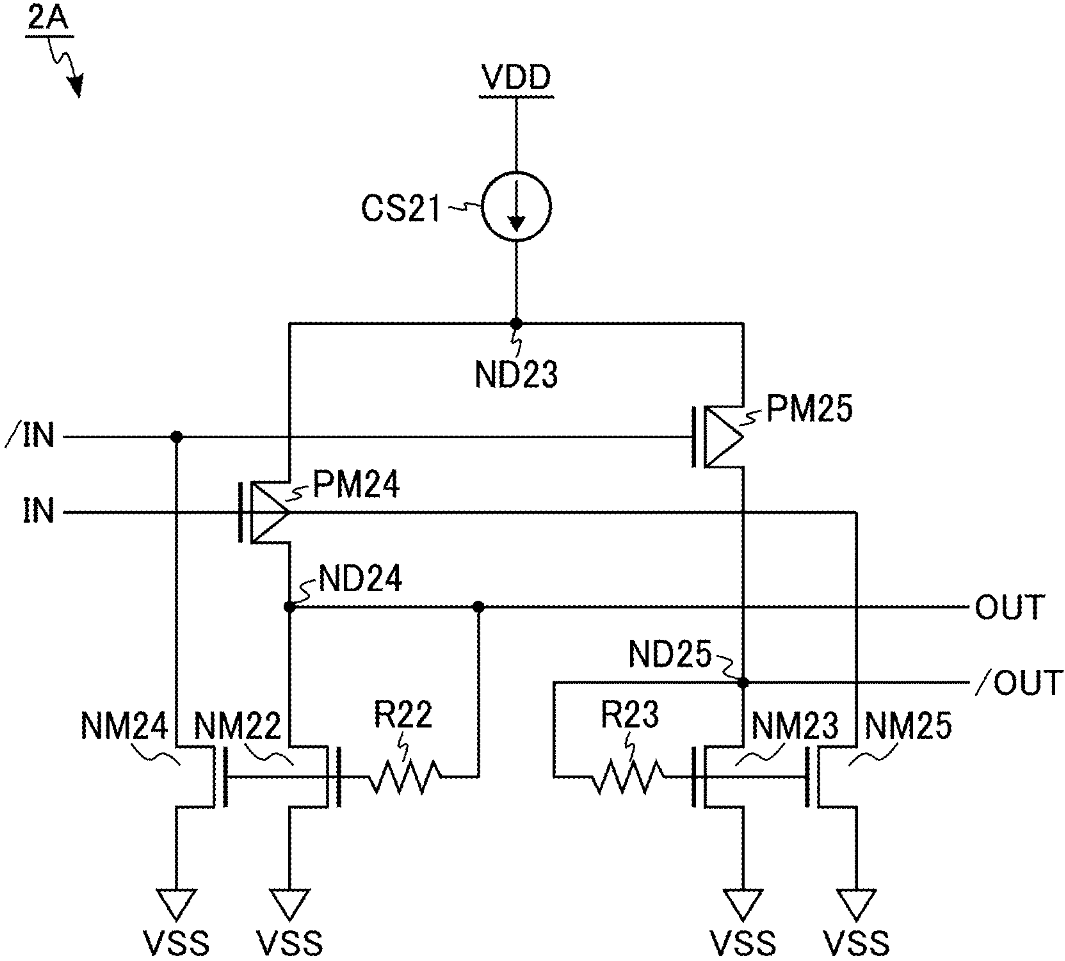
FIG. 8 is a circuit diagram illustrating an example of a circuit configuration of a semiconductor circuit according to a modification of the second embodiment.

FIG. 8 is a circuit diagram illustrating an example of a circuit configuration of the semiconductor circuit 2A according to the modification of the second embodiment. As illustrated in FIG. 8, the semiconductor circuit 2A includes, for example, P-type transistors PM24 and PM25, N-type transistors NM22 to NM25, resistors R22 and R23, a constant current source CS21, and nodes ND23 to ND25.

An input end and an output end of the constant current source CS21 are coupled to a power supply node VDD and the node ND23, respectively.

A source end and a drain end of the P-type transistor PM24 are coupled to the nodes ND23 and ND24, respectively. A gate end of the P-type transistor PM24 is coupled to an input node IN. The node ND24 is coupled to an output node OUT. A drain end and a source end of the N-type transistor NM22 are coupled to the node ND24 and a ground node VSS, respectively. A gate end of the N-type transistor NM22 is coupled to the node ND24 via the resistor R22.

A source end and a drain end of the P-type transistor PM25 are coupled to the nodes ND23 and ND25, respectively. A gate end of the P-type transistor PM25 is coupled to an input node/IN. The node ND25 is coupled to an output node/OUT. A drain end and a source end of the N-type transistor NM23 are coupled to the node ND25 and a ground node VSS, respectively. A gate end of the N-type transistor NM23 is coupled to the node ND25 via the resistor R23.

A drain end and a source end of the N-type transistor NM24 are coupled to the input node/IN and a ground node VSS, respectively. A gate end of the N-type transistor NM24 is coupled to the gate end of the N-type transistor NM22. The N-type transistor NM24 may be smaller than the N-type transistor NM22. The ratio between the size of the N-type transistor NM24 and the size of the N-type transistor NM22 is, for example, 1:1.2 to 7.

A drain end and a source end of the N-type transistor NM25 are coupled to the input node IN and a ground node VSS, respectively. A gate end of the N-type transistor NM25 is coupled to the gate end of the N-type transistor NM23. The N-type transistor NM25 may be smaller than the N-type transistor NM23. The ratio between the size of the N-type transistor NM25 and the size of the N-type transistor NM23 is, for example, 1:1.2 to 7.

<2-2> Advantageous Effects of Second Embodiment

In the semiconductor circuit 2, the P-type transistor PM22 feeds back a signal based on the voltage of the gate end of the P-type transistor PM20 corresponding to the active inductor to the node/IN. In the semiconductor circuit 2, the P-type transistor PM23 feeds back a signal based on the voltage of the gate end of the P-type transistor PM21 corresponding to the active inductor to the node IN. As a result, the semiconductor circuit 2 can reduce the gain near the direct current.

Similarly, in the semiconductor circuit 2A, the N-type transistor NM24 feeds back a signal based on the voltage of the gate end of the N-type transistor NM22 corresponding to the active inductor to the node/IN. In the semiconductor circuit 2A, the N-type transistor NM25 feeds back a signal based on the voltage of the gate end of the N-type transistor NM23 corresponding to the active inductor to the node IN. As a result, the semiconductor circuit 2A can reduce the gain near the direct current.

Therefore, the semiconductor circuits 2 and 2A according to the second embodiment can improve the output voltage to a state close to the full swing, as in the first embodiment. As a result, the semiconductor circuits 2 and 2A can suppress skew and can realize high-speed operation for high frequencies. In addition, the semiconductor circuits 2 and 2A according to the second embodiment can be realized by a circuit having a small area, as in the first embodiment. Furthermore, the semiconductor circuits 2 and 2A according to the second embodiment are selectively used in accordance with an input signal, so that it is possible to realize high-speed signal transmission with more desirable efficiency.

<3> Third Embodiment

Similarly to the active inductor, a semiconductor circuit 3 according to a third embodiment is a 2-in 2-out continuous time linear equalizer (CTLE) configured to feed back a signal of an operating node. Hereinafter, details of the semiconductor circuit 3 according to the third embodiment will be described.

<3-1> Configuration

Figure 9:
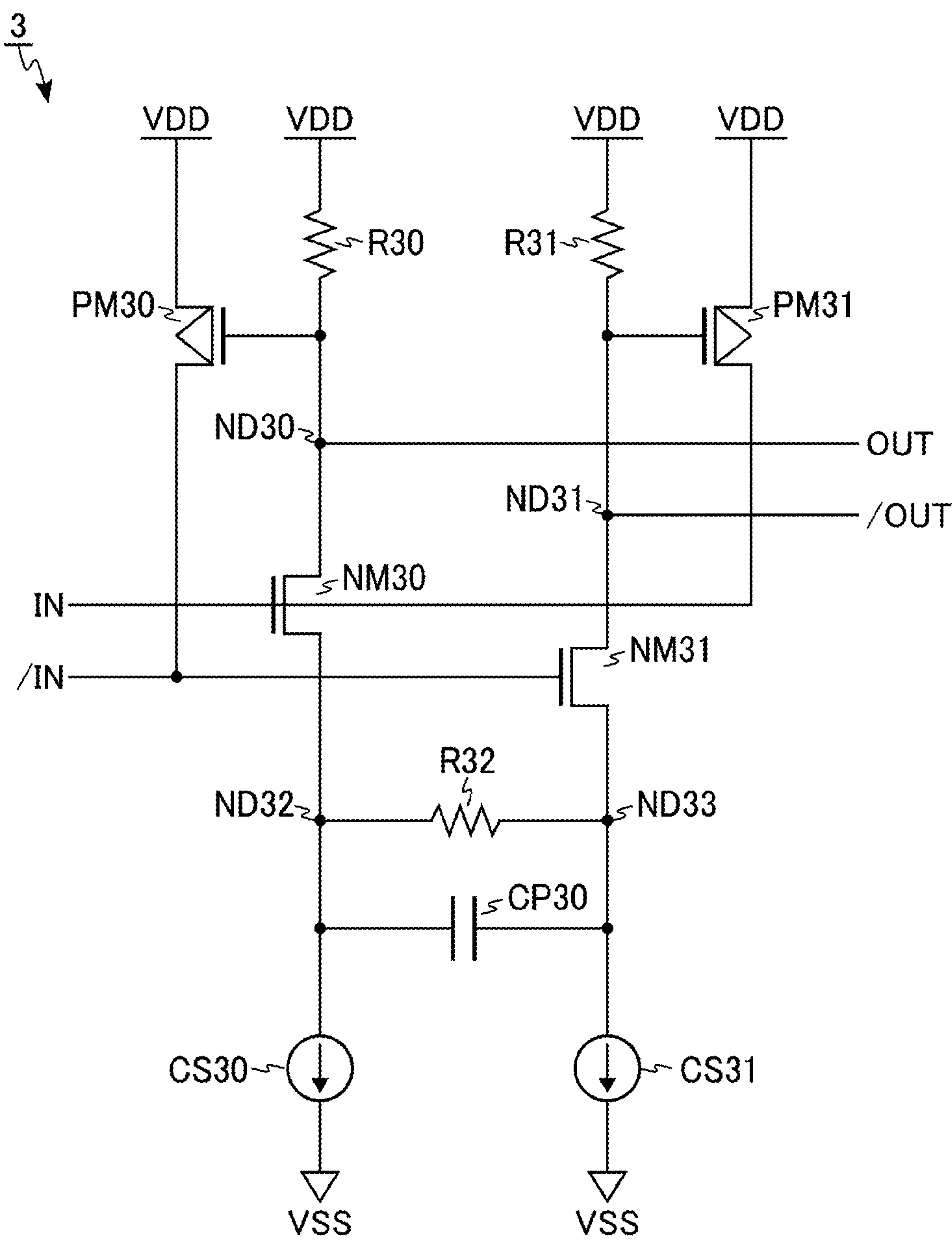
FIG. 9 is a circuit diagram illustrating an example of a circuit configuration of a semiconductor circuit according to a third embodiment.

FIG. 9 is a circuit diagram illustrating an example of a circuit configuration of the semiconductor circuit 3 according to the third embodiment. As illustrated in FIG. 9, the semiconductor circuit 3 is a CTLE that amplifies two input voltages input to input nodes IN and/IN and outputs the two amplified input voltages from output nodes OUT and/OUT. The semiconductor circuit 3 can amplify a specific frequency band of a signal. The semiconductor circuit 3 includes, for example, P-type transistors PM30 and PM31, N-type transistors NM30 and NM31, resistors R30 to R32, a capacitance element (capacitor) CP30, constant current sources CS30 and CS31, and nodes ND30 to ND33.

The node ND30 is coupled to the output node OUT. The node ND30 is coupled to a power supply node VDD via the resistor R30. A drain end and a source end of the N-type transistor NM30 are coupled to the nodes ND30 and ND32, respectively. An input end and an output end of the constant current source CS30 are coupled to the node ND32 and a ground node VSS, respectively.

The node ND31 is coupled to the output node/OUT. The node ND31 is coupled to a power supply node VDD via the resistor R31. A drain end and a source end of the N-type transistor NM31 are coupled to the nodes ND31 and ND33, respectively. An input end and an output end of the constant current source CS31 are coupled to the node ND33 and a ground node VSS, respectively.

The resistor R32 and the capacitance element CP30 are coupled in parallel between the nodes ND32 and ND33. The resistor R32 and the capacitance element CP30 function as an RC filter.

A source end and a drain end of the P-type transistor PM30 are coupled to a power supply node VDD and the input node/IN, respectively. A gate end of the P-type transistor PM30 is coupled to the node ND30.

A source end and a drain end of the P-type transistor PM31 are coupled to a power supply node VDD and the input node IN, respectively. A gate end of the P-type transistor PM31 is coupled to the node ND31.

In the CTLE of the third embodiment, the transistor that receives the input signal may be a P-type transistor. Hereinafter, as a CTLE according to a modification of the third embodiment, a semiconductor device 3A having a PMOS transistor that receives an input signal will be described.

FIG. 10 is a circuit diagram illustrating an example of a circuit configuration of the semiconductor circuit 3A according to the modification of the third embodiment. As illustrated in FIG. 10, the semiconductor circuit 3A includes, for example, P-type transistors PM32 and PM33, N-type transistors NM32 and NM33, resistors R33 to R35, a capacitance element CP31, constant current sources CS32 and CS33, and nodes ND34 to ND37.

An input end and an output end of the constant current source CS32 are coupled to a power supply node VDD and the node ND34, respectively. A source end and a drain end of the P-type transistor PM32 are coupled to the nodes ND34 and ND36, respectively. The node ND36 is coupled to an output node OUT. The node ND36 is coupled to a ground node VSS via the resistor R34.

An input end and an output end of the constant current source CS33 are coupled to a power supply node VDD and the node ND35, respectively. A source end and a drain end of the P-type transistor PM33 are coupled to the nodes ND35 and ND37, respectively. The node ND37 is coupled to an output node/OUT. The node ND37 is coupled to a ground node VSS via the resistor R35.

The resistor R33 and the capacitance element CP31 are coupled in parallel between the nodes ND34 and ND35. The resistor R33 and the capacitance element CP31 function as an RC filter.

A drain end and a source end of the N-type transistor NM32 are coupled to an input node/IN and a ground node VSS, respectively. A gate end of the N-type transistor NM32 is coupled to the node ND36.

A drain end and a source end of the N-type transistor NM33 are coupled to an input node IN and a ground node VSS, respectively. A gate end of the N-type transistor NM33 is coupled to the node ND37.

Note that the resistance values of the resistors R32 and R33, the capacitance values of the capacitance elements CP30 and CP31, and the like included in the semiconductor circuits 3 and 3A may be configured to be adjustable based on a control signal input from the outside.

<3-2> Advantageous Effects of Third Embodiment

In the semiconductor circuit 3, the P-type transistor PM30 feeds back a signal based on the voltage of the node ND30 operating similarly to the active inductor to the node/IN. In the semiconductor circuit 3, the P-type transistor PM31 feeds back a signal based on the voltage of the node ND31 operating similarly to the active inductor to the node IN. As a result, the semiconductor circuit 3 can reduce the gain near the direct current.

Similarly, in the semiconductor circuit 3A, the N-type transistor NM32 feeds back a signal based on the voltage of the node ND36 operating similarly to the active inductor to the node/IN. In the semiconductor circuit 3A, the N-type transistor NM33 feeds back a signal based on the voltage of the node ND37 operating similarly to the active inductor to the node IN. As a result, the semiconductor circuit 3 can reduce the gain near the direct current.

Therefore, the semiconductor circuits 3 and 3A according to the third embodiment can improve the output voltage to a state close to the full swing as in the first embodiment. As a result, the semiconductor circuits 3 and 3A can suppress skew and can realize high-speed operation for high frequencies. In addition, the semiconductor circuits 3 and 3A according to the third embodiment can be realized by a circuit having a small area, as in the first embodiment. Furthermore, the semiconductor circuits 3A and 3A according to the third embodiment are selectively used in accordance with an input signal, so that it is possible to realize high-speed signal transmission with more desirable efficiency.

<4> Fourth Embodiment

A semiconductor circuit according to a fourth embodiment has a configuration in which a circuit capable of switching whether or not to use a transistor that feeds back a signal of an active inductor is added to each of the semiconductor circuits 1, 1A, 2, 2A, 3, and 3A of the first to third embodiments. Hereinafter, details of the semiconductor circuit according to the fourth embodiment will be described.

<4-1> Configuration

Hereinafter, the semiconductor device 1 to which the fourth embodiment is applied is referred to as a semiconductor circuit 1B according to a first configuration example of the fourth embodiment. The semiconductor device 1A to which the fourth embodiment is applied is referred to as a semiconductor circuit 1C according to a second configuration example of the fourth embodiment. The semiconductor device 2 to which the fourth embodiment is applied is referred to as a semiconductor circuit 2B according to a third configuration example of the fourth embodiment. The semiconductor device 2A to which the fourth embodiment is applied is referred to as a semiconductor circuit 2C according to a fourth configuration example of the fourth embodiment. The semiconductor device 3 to which the fourth embodiment is applied is referred to as a semiconductor circuit 3B according to a fifth configuration example of the fourth embodiment. The semiconductor device 3A to which the fourth embodiment is applied is referred to as a semiconductor circuit 3C according to a sixth configuration example of the fourth embodiment.

First Configuration Example: C2C Circuit (NMOS Base)

FIG. 11 is a circuit diagram illustrating an example of a circuit configuration of the semiconductor circuit 1B according to the first configuration example of the fourth embodiment. As illustrated in FIG. 11, the semiconductor circuit 1B has, for example, a configuration in which P-type transistors PM15 and PM16 and P-type transistors PT10 to PT12 are added to the semiconductor circuit 1.

In the semiconductor circuit 1B, a circuit similar to the semiconductor circuit 1 is formed by P-type transistors PM10 to PM12, N-type transistors NM10 and NM11, a resistor R10, a constant current source CS10, and nodes ND10 to ND12 corresponding to the semiconductor circuit 1.

Drain ends of the P-type transistors PM15 and PM16 are coupled to an input node/IN. Gate ends of the P-type transistors PM15 and PM16 are coupled to a gate end of the P-type transistor PM10.

The P-type transistor PT10 is coupled between a power supply node VDD and a source end of the P-type transistor PM12. The P-type transistor PT11 is coupled between a power supply node VDD and a source end of the P-type transistor PM15. The P-type transistor PT12 is coupled between a power supply node VDD and a source end of the P-type transistor PM16.

In other words, the source ends of the P-type transistors PT10 to PT12 are coupled to the power supply node VDD. A drain end of the P-type transistor PT10 is coupled to the source end of the P-type transistor PM12. A drain end of the P-type transistor PT11 is coupled to the source end of the P-type transistor PM15. A drain end of the P-type transistor PT12 is coupled to the source end of the P-type transistor PM16.

A control signal EN10 is input to a gate end of the P-type transistor PT10. A control signal EN11 is input to a gate end of the P-type transistor PT11. A control signal EN12 is input to a gate end of the P-type transistor PT12. The control signals to EN12 to EN10 are individually controllable by an external control circuit. The on/off state of each of the P-type transistors PT10 to PT12 can be controlled based on the control signals EN10 to EN12.

In the first configuration example of the fourth embodiment, the number of sets of the P-type transistors PM and PT coupled in series (for example, the P-type transistors PM12 and PT10) between the power supply nodes VDD and the input node/IN may be one or more. In the first configuration example of the fourth embodiment, the plurality of P-type transistors PT included in the plurality of sets of P-type transistors PM and PT coupled in series between the power supply nodes VDD and the input node/IN may be configured to be individually capable of controlling the on/off state.

Second Configuration Example: C2C Circuit (PMOS Base)

Figure 12:
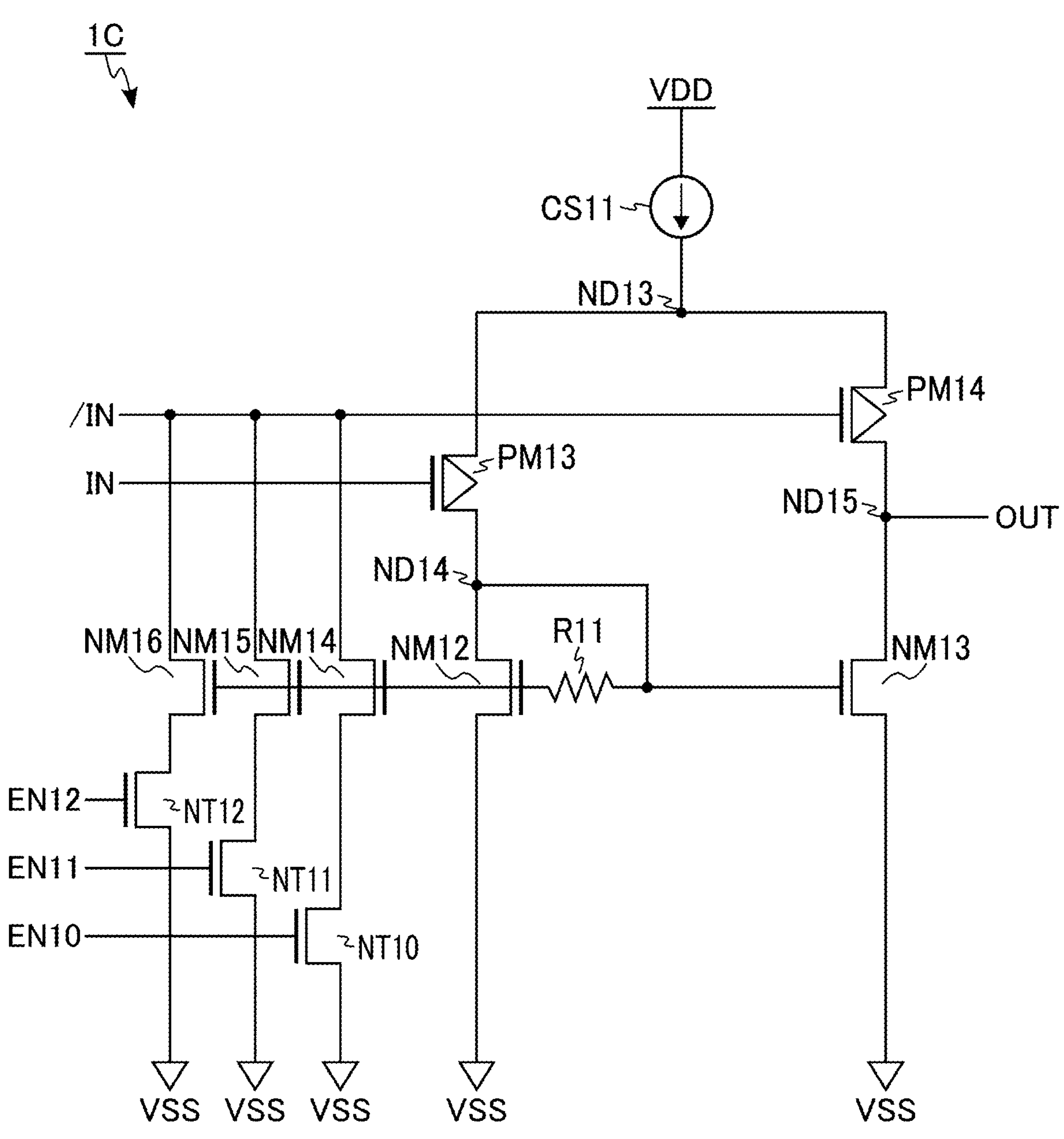
FIG. 12 is a circuit diagram illustrating an example of a circuit configuration of a semiconductor circuit according to a second configuration example of the fourth embodiment.

FIG. 12 is a circuit diagram illustrating an example of a circuit configuration of the semiconductor circuit 1C according to the second configuration example of the fourth embodiment. As illustrated in FIG. 12, the semiconductor circuit 1C has, for example, a configuration in which N-type transistors NM15 and NM16 and N-type transistors NT10 to NT12 are added to the semiconductor circuit 1A.

In the semiconductor circuit 1C, a circuit similar to the semiconductor circuit 1A is formed by P-type transistors PM13 and PM14, N-type transistors NM12 to NM14, a resistor R11, a constant current source CS11, and nodes ND13 to ND15.

Drain ends of the N-type transistors NM15 and NM16 are coupled to an input node/IN. Gate ends of the N-type transistors NM15 and NM16 are coupled to a gate end of the N-type transistor NM12.

The N-type transistor NT10 is coupled between the N-type transistor NM14 and a ground node VSS. The N-type transistor NT11 is coupled between the N-type transistor NM15 and a ground node VSS. The N-type transistor NT12 is coupled between the N-type transistor NM16 and a ground node VSS. Specifically, a source end of each of the N-type transistors NT10 to NT12 is coupled to the ground node VSS. A drain end of the N-type transistor NT10 is coupled to a source end of the N-type transistor NM14. A drain end of the N-type transistor NT11 is coupled to a source end of the N-type transistor NM15. A drain end of the N-type transistor NT12 is coupled to a source end of the N-type transistor NM16.

A control signal EN10 is input to a gate end of the N-type transistor NT10. A control signal EN11 is input to a gate end of the N-type transistor NT11. A control signal EN12 is input to a gate end of the N-type transistor NT12. An on/off state of each of the N-type transistors NT10 to NT12 can be controlled based on the control signals EN10 to EN12.

In the second configuration example of the fourth embodiment, the number of sets of the N-type transistors NM and NT (for example, the N-type transistors NM14 and NT10) coupled in series between the input node/IN and the ground nodes VSS may be one or more. In the second configuration example of the fourth embodiment, a plurality of N-type transistors NT included in the plurality of sets of N-type transistors NM and NT coupled in series between the input node/IN and the ground nodes VSS may be configured to be individually capable of controlling the on/off state.

Third Configuration Example: Differential Amplifier Circuit (NMOS Base)

Figure 13:
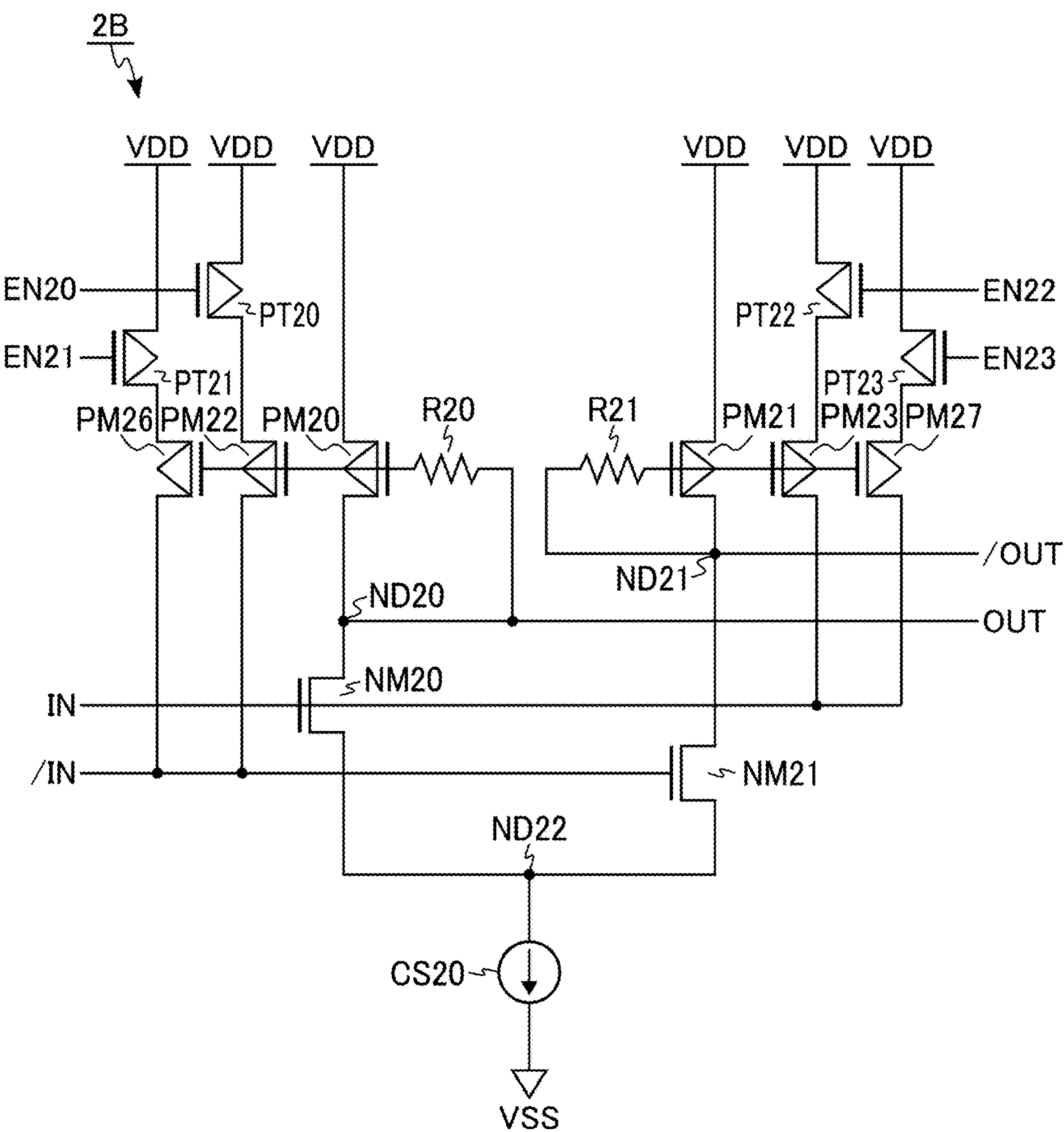
FIG. 13 is a circuit diagram illustrating an example of a circuit configuration of a semiconductor circuit according to a third configuration example of the fourth embodiment.

FIG. 13 is a circuit diagram illustrating an example of a circuit configuration of the semiconductor circuit 2B according to the third configuration example of the fourth embodiment. As illustrated in FIG. 13, the semiconductor circuit 2B has, for example, a configuration in which P-type transistors PM26 and PM27 and P-type transistors PT20 to PT23 are added to the semiconductor circuit 2.

In the semiconductor circuit 2B, a circuit similar to the semiconductor circuit 2 is formed by P-type transistors PM20 to PM23, N-type transistors NM20 and NM21, resistors R20 and R21, a constant current source CS20, and nodes ND20 to ND22.

A drain end of the P-type transistor PM26 is coupled to an input node/IN. A gate end of the P-type transistor PM26 is coupled to a gate end of the P-type transistor PM20. A drain end of the P-type transistor PM27 is coupled to an input node IN. A gate end of the P-type transistor PM27 is coupled to a gate end of the P-type transistor PM21.

The P-type transistor PT20 is coupled between a power supply node VDD and the P-type transistor PM22. The P-type transistor PT21 is coupled between a power supply node VDD and the P-type transistor PM26. The P-type transistor PT22 is coupled between a power supply node VDD and the P-type transistor PM23. The P-type transistor PT23 is coupled between a power supply node VDD and the P-type transistor PM27. Specifically, the source ends of the P-type transistors PT20 to PT23 are coupled to the power supply nodes VDD. A drain end of the P-type transistor PT20 is coupled to a source end of the P-type transistor PM22. A drain end of the P-type transistor PT21 is coupled to a source end of the P-type transistor PM26. A drain end of the P-type transistor PT22 is coupled to a source end of the P-type transistor PM23. A drain end of the P-type transistor PT23 is coupled to a source end of the P-type transistor PM27.

A control signal EN20 is input to a gate end of the P-type transistor PT20. A control signal EN21 is input to a gate end of the P-type transistor PT21. A control signal EN22 is input to a gate end of the P-type transistor PT22. A control signal EN23 is input to a gate end of the P-type transistor PT23. The control signals EN20 to EN23 are individually controllable by an external control circuit. The on/off state of each of the P-type transistors PT20 to NT23 can be controlled based on the control signals EN20 to EN23.

In the third configuration example of the fourth embodiment, the number of sets of the P-type transistors PM and PT (for example, the P-type transistors PM22 and PT20) coupled in series between the power supply node VDD and the input node IN or/IN may be one or more. In the third configuration example of the fourth embodiment, the plurality of P-type transistors PT included in the plurality of sets of P-type transistors PM and PT coupled in series between the power supply node VDD and the input node IN or/IN may be configured e individually capable of controlling the on/off state. As a set of the P-type transistors PM and PT, at least one of the transistors coupled to the input node IN and the transistors coupled to the input node/IN may be provided.

Fourth Configuration Example: Differential Amplifier Circuit (PMOS Base)

FIG. 14 is a circuit diagram illustrating an example of a circuit configuration of the semiconductor circuit 2C according to the fourth configuration example of the fourth embodiment. As illustrated in FIG. 14, the semiconductor circuit 2C has, for example, a configuration in which N-type transistors NM26 and NM27 and N-type transistors NT20 to NT23 are added to the semiconductor circuit 2A.

In the semiconductor circuit 2C, a circuit similar to the semiconductor circuit 2A is formed by P-type transistors PM24 and PM25, N-type transistors NM22 to NM25, resistors R22 and R23, a constant current source CS21, and nodes ND23 to ND25.

A drain end of the N-type transistor NM26 is coupled to an input node/IN. A gate end of the N-type transistor NM26 is coupled to a gate end of the N-type transistor NM22. A drain end of the N-type transistor NM27 is coupled to an input node IN. A gate end of the N-type transistor NM27 is coupled to a gate end of the N-type transistor NM23.

The N-type transistor NT20 is coupled between the N-type transistor NM24 and a ground node VSS. The N-type transistor NT21 is coupled between the N-type transistor NM26 and a ground node VSS. The N-type transistor NT22 is coupled between the N-type transistor NM25 and a ground node VSS. The N-type transistor NT23 is coupled between the N-type transistor NM27 and a ground node VSS. Specifically, the source end of each of the N-type transistors NT20 to NT23 is coupled to the ground nodes VSS. A drain end of the N-type transistor NT20 is coupled to a source end of the N-type transistor NM24. A drain end of the N-type transistor NT21 is coupled to a source end of the N-type transistor NM26. A drain end of the N-type transistor NT22 is coupled to a source end of the N-type transistor NM25. A drain end of the N-type transistor NT23 is coupled to a source end of the N-type transistor NM27.

A control signal EN20 is input to a gate end of the N-type transistor NT20. A control signal EN21 is input to a gate end of the N-type transistor NT21. A control signal EN22 is input to a gate end of the N-type transistor NT22. A control signal EN23 is input to a gate end of the N-type transistor NT23. An on/off state of each of the N-type transistors NT20 to NT23 can be controlled based on the control signals EN20 to EN23.

In the fourth configuration example of the fourth embodiment, the number of sets of the N-type transistors NM and NT (for example, the N-type transistors NM24 and NT20) coupled in series between the input node IN or/IN and the ground nodes VSS may be one or more. In the fourth configuration example of the fourth embodiment, the plurality of N-type transistors NT included in the plurality of sets of the N-type transistors NM and NT coupled in series between the input node IN or/IN and the ground nodes VSS may be configured to be individually capable of controlling the on/off state. As a set of the N-type transistors NM and NT, at least one of the transistors coupled to the input node IN and the transistors coupled to the input node/IN may be provided.

Fifth Configuration Example: CTLE (NMOS Base)

FIG. 15 is a circuit diagram illustrating an example of a circuit configuration of the semiconductor circuit 3B according to the fifth configuration example of the fourth embodiment. As illustrated in FIG. 15, the semiconductor circuit 3B has, for example, a configuration in which P-type transistors PM34 and PM35 and P-type transistors PT30 to PT33 are added to the semiconductor circuit 3.

In the semiconductor circuit 3B, a circuit similar to the semiconductor circuit 3 is formed by P-type transistors PM30 and PM31, N-type transistors NM30 and NM31, resistors R30 to R32, a capacitance element CP30, constant current sources CS30 and CS31, and nodes ND30 to ND33.

A drain end of the P-type transistor PM34 is coupled to an input node/IN. A gate end of the P-type transistor PM34 is coupled to a gate end of the P-type transistor PM30. A drain end of the P-type transistor PM35 is coupled to an input node IN. A gate end of the P-type transistor PM35 is coupled to a gate end of the P-type transistor PM31.

The P-type transistor PT30 is coupled between a power supply node VDD and the P-type transistor PM30. The P-type transistor PT31 is coupled between a power supply node VDD and the P-type transistor PM34. The P-type transistor PT32 is coupled between a power supply node VDD and the P-type transistor PM31. The P-type transistor PT33 is coupled between a power supply node VDD and the P-type transistor PM35. Specifically, the source ends of the P-type transistors PT30 to PT33 are coupled to the power supply nodes VDD. A drain end of the P-type transistor PT30 is coupled to a source end of the P-type transistor PM30. A drain end of the P-type transistor PT31 is coupled to a source end of the P-type transistor PM34. A drain end of the P-type transistor PT32 is coupled to a source end of the P-type transistor PM31. A drain end of the P-type transistor PT33 is coupled to a source end of the P-type transistor PM35.

A control signal EN30 is input to a gate end of the P-type transistor PT30. A control signal EN31 is input to a gate end of the P-type transistor PT31. A control signal EN32 is input to a gate end of the P-type transistor PT32. A control signal EN33 is input to a gate end of the P-type transistor PT33. The control signals EN30 to EN33 are individually controllable by an external control circuit. The on/off state of each of the P-type transistors PT30 to NT33 can be controlled based on the control signals EN30 to EN33.

In the fifth configuration example of the fourth embodiment, the number of sets of the P-type transistors PM and PT (for example, the P-type transistors PM30 and PT30) coupled in series between the power supply nodes VDD and the input node IN or/IN may be one or more. In the fifth configuration example of the fourth embodiment, the plurality of P-type transistors PT included in the plurality of sets of P-type transistors PM and PT coupled in series between the power supply nodes VDD and the input node IN or/IN may be configured to be individually capable of controlling the on/off state. As a set of the P-type transistors PM and PT, at least one of the transistors coupled to the input node IN and the transistors coupled to the input node/IN may be provided.

Sixth Configuration Example: CTLE (PMOS Base)

FIG. 16 is a circuit diagram illustrating an example of a circuit configuration of the semiconductor circuit 3C according to the sixth configuration example of the fourth embodiment. As illustrated in FIG. 16, the semiconductor circuit 3C has, for example, a configuration in which N-type transistors NM34 and NM35 and N-type transistors NT30 to NT33 are added to the semiconductor circuit 3A.

In the semiconductor circuit 3C, a circuit similar to the semiconductor circuit 3A is formed by P-type transistors PM32 and PM33, N-type transistors NM32 and NM33, resistors R33 to R35, a capacitance element CP31, constant current sources CS32 and CS33, and nodes ND34 to ND37.

A drain end of the N-type transistor NM34 is coupled to the input node/IN. A gate end of the N-type transistor NM34 is coupled to a gate end of the N-type transistor NM32. A drain end of the N-type transistor NM35 is coupled to the input node IN. A gate end of the N-type transistor NM35 is coupled to a gate end of the N-type transistor NM33.

The N-type transistor NT30 is coupled between the N-type transistor NM32 and a ground node VSS. The N-type transistor NT31 is coupled between the N-type transistor NM34 and a ground node VSS. The N-type transistor NT32 is coupled between the N-type transistor NM33 and a ground node VSS. The N-type transistor NT33 is coupled between the N-type transistor NM35 and a ground node VSS. Specifically, the source end of each of the N-type transistors NT30 to NT33 is coupled to the ground node VSS. A drain end of the N-type transistor NT30 is coupled to a source end of the N-type transistor NM32. A drain end of the N-type transistor NT31 is coupled to a source end of the N-type transistor NM34. A drain end of the N-type transistor NT32 is coupled to a source end of the N-type transistor NM33. A drain end of the N-type transistor NT33 is coupled to a source end of the N-type transistor NM35.

A control signal EN30 is input to a gate end of the N-type transistor NT30. A control signal EN31 is input to a gate end of the N-type transistor NT31. A control signal EN32 is input to a gate end of the N-type transistor NT32. A control signal EN33 is input to a gate end of the N-type transistor NT33. The on/off state of each of the N-type transistors NT30 to NT33 can be controlled based on the control signals EN30 to EN33.

In the sixth configuration example of the fourth embodiment, the number of sets of the N-type transistors NM and NT (for example, the N-type transistors NM32 and NT30) coupled in series between the input node IN or/IN and the ground node VSS may be one or more. In the sixth configuration example of the fourth embodiment, the plurality of N-type transistors NT included in the plurality of sets of the N-type transistors NM and NT coupled in series between the input node IN or/IN and the ground node VSS may be configured to be individually capable of controlling the on/off state. As a set of the N-type transistors NM and NT, at least one of the transistors coupled to the input node IN and the transistors coupled to the input node/IN may be provided.

<4-2> Advantageous Effects of Fourth Embodiment

In each configuration example of the fourth embodiment described above, the number of transistors that feed back the voltage of the active inductor to the input node can be changed by the control signal EN. In other words, in each configuration example of the fourth embodiment, the adjustment amount of the gain near the direct current can be changed according to the input signal. As the number of transistors that feed back the voltage of the active inductor to the input node increases, the gain near the direct current can be reduced.

Therefore, in the semiconductor circuits 1B, 1C, 2B, 2C, 3B, and 3C according to the fourth embodiment, the gain in the vicinity of the direct current is adjusted by setting according to the input signal, so that it is possible to suppress the skew by more preferable setting such as realizing the full swing while maintaining the amplitude width of the signal, and it is possible to realize the high-speed operation.

<5> Fifth Embodiment

A fifth embodiment relates to a specific example of a semiconductor device using at least one of the semiconductor circuits 1, 1A to 1C, 2, 2A to 20, 3, and 3A to 3C described in the first to fourth embodiments. Hereinafter, details of the semiconductor device according to the fifth embodiment will be described.

<5-1> Configuration

First to eighth configuration examples of the fifth embodiment will be sequentially described below.

First Configuration Example: NAND Flash Memory

At least one of the semiconductor circuits 1, 1A to 1C, 2, 2A to 2C, 3, and 3A to 3C described in the first to fourth embodiments may be used for the NAND flash memory. Hereinafter, as an example of such a NAND flash memory, a semiconductor device 100 according to a first configuration example of the fifth embodiment will be described.

Configuration of Semiconductor Device 100

FIG. 17 is a block diagram illustrating an example of a configuration of the semiconductor device 100 (a NAND flash memory) according to the first configuration example of the fifth embodiment. As illustrated in FIG. 17, the semiconductor device 100 is configured to be controllable by a memory controller 110. The semiconductor device 100 includes, for example, a memory cell array 101, an input/output circuit 102, a logic controller 103, a register circuit 104, a sequencer 105, a driver circuit 106, a row decoder module 107, and a sense amplifier module 108.

The memory cell array 101 is a set of a plurality of memory cells (memory cell transistors) MC capable of storing data in a nonvolatile manner. The memory cell array 101 is divided into a plurality of blocks BLK. The block BLK is used, for example, as a data erasing unit. The block BLK includes a plurality of pages. The page includes a plurality of memory cells MC, and is used as a unit for writing and reading data. The memory cell array 101 is provided with a plurality of bit lines BL and a plurality of word lines WL. Each memory cell MC is associated with one bit line BL and one word line WL. In a case where a plurality of memory cells MC are associated with the same set of the bit line BL and the word line WL, these memory cells MC can be independently selected by using g a plurality of select transistors coupled between the bit line BL and each memory cell MC. Each memory cell MC is a field effect transistor having a stack gate structure having a charge storage layer. The charge storage layer may be a floating gate electrode or a charge trap film. The plurality of memory cells MC is arranged in a two-dimensional array or a three-dimensional array.

The input/output circuit 102 is, for example, a semiconductor integrated circuit configured to be able to transmit and receive an 8-bit wide signal DQ<7:0> and signals DQS and/DQS to and from the memory controller 110. The signal DQ may include data, status information, address information, a command, and the like. The signals DQS and/DQS are signals that define the transmission/reception timing of the signal DQ. The signals DQS and/DQS are signal pairs having phases opposite to each other. The input/output circuit 102 can transfer the received address information and a command to the register circuit 104. The input/output circuit 102 can transmit or receive data DAT to or from the sense amplifier module 58.

The input/output circuit 102 may be referred to as a memory interface circuit of the semiconductor device 100. The plurality of pads PD included in the semiconductor device 100 are coupled to an interface circuit of the memory controller 110. The plurality of pads PD are used for input and output of the signals DQ<7:0>, DQS, and/DQS. Note that the signal DQ<7:0> may be referred to as a “data signal”. The signals DOS and BDQS may be referred to as a “data strobe signal and its inverted signal”. The signals DQS and/or BDQS may be referred to as “clock signals”, “operating clock signals”, “strobe signals”, and “timing control signals”.

Note that the signal DQ is, for example, a pulse signal. Each pulse included in the signal DQ corresponds to the modulated data. As a modulation method of data, for example, pulse-amplitude modulation used. Pulse is amplitude modulation is a modulation method in which data is transmitted by voltages (amplitudes) of pulses at regular intervals. In a case where pulse amplitude modulation is used as a data modulation method, a voltage level of each pulse of the signal DQ corresponds to 1-bit data or multi-bit data. Note that the memory controller 110 may operate as a reception device, and the semiconductor device 100 may operate as a transmission device.

The logic controller 103 controls the input/output circuit 102 and the sequencer 105 based on the control signal received from the memory controller 110.

The register circuit 104 holds status information, address information, commands, and the like. The status information is updated according to the state of the semiconductor device 100. The upper status is output to the controller 110 based on an instruction from the memory memory controller 110. The address information may include a block address, a page address, a column address, and the like. The command includes a command related to various operations of the semiconductor device 100.

The sequencer 105 controls the entire operation of the semiconductor device 100. For example, the sequencer 105 can execute a read operation, a write operation, an erase operation, and the like based on a command and address information held in the register circuit 104.

The driver circuit 106 generates a voltage used in a read operation, a write operation, an erase operation, and the like. Then, the driver circuit 106 supplies the generated voltage to the memory cell array 101, the row decoder module 107, the sense amplifier module 108, and the like.

The row decoder module 107 is a circuit coupled to wiring (word lines WL and the like) in the row direction provided in the memory cell array 101. The row decoder module 107 includes a plurality of row decoders associated with the plurality of blocks BLK. Each row decoder includes a block decoder capable of decoding a block address. The row decoder module 107 selects the block BLK based on the decoding result of the block decoder of each row decoder. The row decoder module 107 transfers the voltage supplied from the driver circuit 106 to, for example, the word line WL in the selected block BLK via the associated row decoder RD.

The sense amplifier module 108 is a circuit coupled to wiring (bit line BL) in the column direction provided in the memory cell array 101. The sense amplifier module 108 includes a plurality of sense amplifier units associated with the plurality of bit lines BL, respectively. Each sense amplifier unit has a function of applying a voltage to the associated bit line BL, a function of determining data based on the voltage of the bit line BL, and a function of temporarily storing data. In the read operation, the sense amplifier module 108 reads data from the memory cell array 101 and transfers the read data to the input/output circuit 102. In the write operation, the sense amplifier module 108 applies a desired voltage to the bit line BL based on the data received from the input/output circuit 102.

Configuration of Input/Output Circuit 102

FIG. 18 is a block diagram illustrating an example of a configuration of an input/output circuit 102 included in a semiconductor device 100 (NAND flash memory) according to the first configuration example of the fifth embodiment. FIG. 18 illustrates a case where the memory controller 110 operates as a transmission device and the semiconductor device 100 operates as a reception device. As illustrated in FIG. 18, the semiconductor device 100 includes, for example, an input receiver (IREC) 111, a driver circuit 112, a write duty cycle adjuster (WDCA) 113, a plurality of data input circuits 114 to 0 to 114-7, and a processing circuit 115.

The IREC 111 is a circuit that transmits a signal inside a chip. The IREC 111 is coupled to a pad PD to which the signal DQS is input and a pad PD to which the signal BDOS is input. The output signal of the IREC 111 is input to the driver circuit 112. Since the IREC 111 directly receives external signals (DQS and BDQS) of small signals, a large circuit area is required.

The driver circuit 112 is a circuit that transmits a signal in the input/output circuit 102 after the IREC 111. The driver circuit 112 amplifies the signal input from the IREC 111 and inputs the amplified signal to the WDCA 113. The circuit area of the driver circuit 112 is, for example, smaller than each of the IREC 111 and the WDCA 113.

The WDCA 113 is, for example, a circuit that adjusts duty cycles of the signals DQS and BDQS received from the memory controller 110 at the time of the write operation. That is, the WDCA 113 compensates for the duty deviation of the signals DQS and BDQS. Then, the WDCA 113 distributes the signals DQS and BDQS in which the duty deviation is compensated to each data input circuit 114 as the clock signal CLK. Note that the WDCA 113 transmits a signal via a long-distance wiring in the input/output circuit 102, and thus requires a large circuit area. The length of the wiring connecting the WDCA 113 and the data input circuit 114 varies depending on the position of the data input circuit 114.

The plurality of data input circuits 114-0 to 114-7 are coupled to the plurality of pads PD, respectively. Each data input circuit 114 is a circuit that converts an electric signal input via the pad PD into a digital signal. Specifically, each data input circuit 114 samples data and the like included in the signal DQ input to the pad PD based on the clock signal CLK input from the WDCA 113 and the K (not inverted signal s/CLK of the clock signal CLK illustrated). Then, each data input circuit 114 inputs the sampled data to the processing circuit 115. The data input circuits 114-0 to 114-7 are associated with the signals DQ<0> to DQ<7>, respectively.

The processing circuit 115 is a circuit that handles data and the like input from the data input circuits 114-0 to 114-7. The processing circuit 115 is, for example, a register circuit 104, a sense amplifier module 108, or the like.

In a case where the semiconductor device 100 exchanges the signal DQ, a transmission side device (for example, the memory controller 110) transmits the signals DQS and/or DQS to a reception side device. Then, the receiving side device samples the signal DQ at timing based on the clock signal generated from the received signals DOS and/or DQS. For example, in a case where the reception side device is the semiconductor device 100, data sampled by the data input circuit 114 is stored in the memory cell array 101.

Note that each of the IREC 111, the driver circuit 112, and the WDCA 113 includes, for example, a differential amplifier circuit. In other words, at least one of the semiconductor circuits 2, 2A to 2C can be applied to each of the IREC 111, the driver circuit 112, and the WDCA 113.

Configuration of Data Input Circuit 114

FIG. 19 is a block diagram illustrating an example of a configuration of the data input circuit 114 in the semiconductor device 100 (NAND flash memory) according to the first configuration example of the fifth embodiment. The data input circuit 114 includes, for example, a C2C circuit 120, a full scale amplifier (FS) 121, a CTLE 122, and a sampler 123.

The C2C circuit 120 amplifies the clock signal CLK input from the WDCA 113 and an inverted signal/CLK of the clock signal CLK (not illustrated). The C2C circuit 120 corresponds to any one of the semiconductor circuits 1 and 1A described in the first embodiment. The C2C circuit 120 tends to have a small area because it is a circuit after a long-distance wiring from the WDCA 113.

The FS 121 is a circuit that converts a signal amplified via the C2C circuit 120 into a CMOS level. Then, the FS 121 inputs the clock signal CLK converted into the CMOS level to the sampler 123. In the present specification, the CMOS level is a logic level corresponding to "0" data or "1" data. Hereinafter, the voltage of the logic level corresponding to the "O" data is also referred to as an "L" level, and the voltage of the logic level corresponding to the "1" data is also referred to as an "H" level.

The CTLE 122 is an equalizer circuit that receives the electrical signal input to the data input circuit 114. The CTLE 122 compensates the input signal DO and inputs the signal DQ to the sampler 123. A plurality of CTLEs 122 may be provided in series between the pad PD that receives the signal DQ and the sampler 123. At this time, the wiring length connecting the plurality of CTLEs 122 may be long. As the CTLE 122, the semiconductor circuit 3, 3A, 3B, or 3C may be used.

The sampler 123 samples the data of the signal DQ based on the timing indicated by the clock signal CLK. Then, the sampler 123 transfers a sampling result (data DAT or the like) of the signal DQ to the processing circuit 115.

Configuration of C2C Circuit 120

FIG. 20 is a circuit diagram illustrating an example of a configuration of the C2C circuit 120 included in the data input circuit 114 in the semiconductor device (NAND flash memory) 100 according to the first configuration example of the fifth embodiment. As illustrated in FIG. 20, the C2C circuit 120 includes, for example, semiconductor circuits 1H and 1L. Each of the semiconductor circuits 1H and 1L has a circuit configuration similar to that of the semiconductor circuit 1 described in the first embodiment except for the connection relationship between the input nodes IN and/IN. For example, the clock signal CLK is input to the input node IN, and the inverted signal/CLK of the clock signal is input to the input node/IN.

Specifically, the gate end of the N-type transistor NM10 of the semiconductor circuit 1H is coupled to the input node IN. A gate end of the N-type transistor NM11 of the semiconductor circuit 1H is coupled to the input node/IN. A gate end of the N-type transistor NM10 of the semiconductor circuit 1L is coupled to the input node/IN. A gate end of the N-type transistor NM11 of the semiconductor circuit 1L is coupled to the input node IN. In other words, the N-type transistor NM10 of the semiconductor circuit 1H and the N-type transistor NM11 of the semiconductor circuit 1L are coupled to the input node IN. The N-type transistor NM11 of the semiconductor circuit 1H and the N-type transistor NM10 of the semiconductor circuit 1L are coupled to the input node/IN.

As a result, the semiconductor circuits 1H and 1L output complementary signals. For example, in a case where a HIGH level signal is output from the node ND11 of the semiconductor circuit 1H, a LOW level signal is output from the node ND11 of the semiconductor circuit 1L. Other configurations of the semiconductor circuits 1H and 1L are similar to those of the semiconductor circuit 1. When the semiconductor circuits 1H and 1L are used in combination, a constant current source CS may be added in order to suppress the influence of process variation.

FIG. 21 is a circuit diagram illustrating an example of a configuration of a C2C circuit 120A included in the data input circuit 114 in the semiconductor device 100 according to the first configuration example of the fifth embodiment. As illustrated in FIG. 21, the C2C circuit 120A includes semiconductor circuits 1H and 1L and a constant current source CS12.

The constant current source CS12 is coupled between the power supply node VDD and the P-type transistor PM12 of the semiconductor circuit 1H and between the power supply node VDD and the P-type transistor PM12 of the semiconductor circuit 1L. In other words, the input end of the constant current source CS12 is coupled to the power supply node VDD. The output end of the constant current source CS12 is coupled to each of the source of the P-type transistor PM12 of the semiconductor circuit 1H and the source of the P-type transistor PM12 of the semiconductor circuit 1L. With this configuration, the C2C circuit 120A can reduce the sensitivity to process variations, and can realize a highly accurate compensation circuit.

Second Configuration Example: NOR Type Flash Memory

At least one of the semiconductor circuits 1, 1A to 1C, 2, 2A to 2C, 3, and 3A to 3C described in the first to fourth embodiments may be used for a random accessible nonvolatile semiconductor memory device (for example, a NOR flash memory). Hereinafter, as an example of such a NOR flash memory, a semiconductor device 200 according to a second configuration example of the fifth embodiment will be described.

Figure 22:
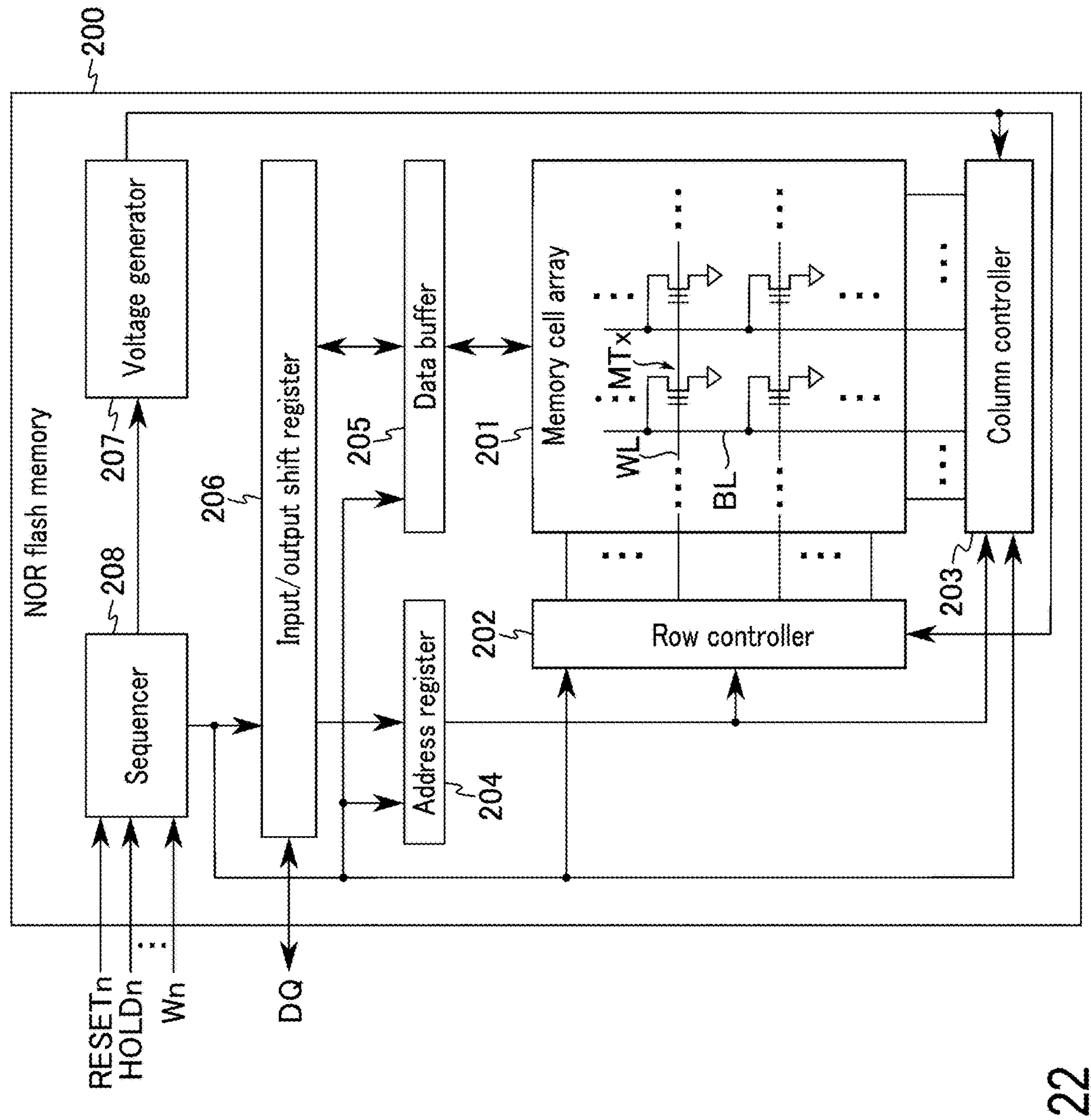
FIG. 22 is a block diagram illustrating an example of a configuration of a semiconductor device according to a second configuration example of the fifth embodiment.

FIG. 22 is a block diagram illustrating an example of a configuration of the semiconductor device 200 (NOR flash memory) according to the second configuration example of the fifth embodiment. As illustrated in FIG. 22, the semiconductor device 200 includes, for example, a memory cell array 201, a row controller 202, a column controller 203, an address register 204, a data buffer 205, an input/output shift register 206, a voltage generator 207, and a sequencer 208.

The memory cell array 201 includes a plurality of memory cells (memory cell transistors) MTx. In the semiconductor device 200, a gate end of each memory cell MTx is coupled to a corresponding one of the plurality of word lines WL. One end of the current path of each memory cell MTx is coupled to a corresponding one of the plurality of bit lines BL. The other end of the current path of each memory cell MTx is coupled to the source line and, for example, grounded. The plurality of memory cells MTx is arranged in a two-dimensional array or a three-dimensional array. The memory cell MTx is a field effect transistor having a stack gate structure having a charge storage layer. The charge storage layer may be a floating gate electrode or a charge trap film.

The row controller 202 selects a word line corresponding to the address information among the plurality of word lines WL. The row controller 202 applies a predetermined voltage to the selected word line (and the non-selected word line) according to the write operation, the read operation, the erase operation, and the like.

The column controller 203 selects a bit line corresponding to the address information among the plurality of bit lines BL. The column controller 203 applies a predetermined voltage to the selected bit line (and the unselected bit line) according to the write operation, the read operation, the erase operation, and the like.

The address register 204 temporarily stores the address information sent from the input/output shift register 206. The address register 204 transmits the address information to the row controller 202 and the column controller 203.

The data buffer 205 temporarily stores read data from the memory cell array 201 and write data from the input/output shift register 206.

The input/output shift register 206 temporarily stores a signal DQ transferred between the memory cell array 201 and the outside of the semiconductor device 200. The input/output shift register 206 transmits the address information to the address register 204. The input/output shift register 206 sends the write data to the data buffer 205. The input/output shift register 206 sends the read data supplied from the memory cell array 201 to the outside of the semiconductor device 200. The input/output shift register 206 can execute parallel-serial conversion of the data DQ.

The voltage generator 207 generates a plurality of types of voltages used for each of the write operation, the read operation, and the erase operation. The voltage generator 207 supplies the generated voltage to the row controller 202, the column controller 203, and the like.

The sequencer 208 controls the entire operation of the semiconductor device 200 based on various control signals such as a reset signal RESETn, a hold signal HOLDn, and a write protect signal Wn.

Note that the configuration of the semiconductor device 200 (NOR flash memory) is not limited thereto. The semiconductor device 200 may include other components such as a status register. The status register temporarily stores a status signal indicating an operation status inside the semiconductor device 200 and an execution result of the operation sequence.

In the semiconductor device 200 according to the second configuration example of the fifth embodiment, for example, the C2C circuit (semiconductor circuit 1, 1A, 1B, 1C) described in the above embodiment can be applied to the sequencer 208 and the input/output shift register 206.

Third Configuration Example: Dynamic Random Access Memory (DRAM)

At least one of the semiconductor circuits 1, 1A to 1C, 2, 2A to 2C, 3, and 3A to 3C described in the first to fourth embodiments may be used for a volatile semiconductor memory device (for example, a DRAM). Hereinafter, as an example of such a DRAM, a semiconductor device 300 according to a third configuration example of the fifth embodiment will be described.

FIG. 23 is a block diagram illustrating an example of a configuration of the semiconductor device 300 (DRAM) according to the third configuration example of the fifth embodiment. As illustrated in FIG. 23, the semiconductor device 300 includes, for example, a memory cell array 301, a row decoder 302, a column decoder 303, a command decoder 304, an address decoder 305, a command/address input circuit 306, a sense amplifier circuit 307, a transfer gate 308, a read/write amplifier (RWAMP) circuit 309, an input/output circuit 310, a clock input circuit 311, an internal clock generator 312, and a voltage generator 313.

The memory cell array 301 includes a plurality of memory cells MC. Each of the memory cells MC of the semiconductor device 300 includes a cell capacitor CC and a cell transistor CT. A gate of the cell transistor CT is coupled to a corresponding one of the plurality of word lines WL. One end of a current path of the cell transistor CT is coupled to the bit line BL. The other end of the current path of the cell transistor CT is coupled to one end of the cell capacitor CC. The other end of the cell capacitor CC is coupled to the ground node. The cell capacitor CC can store an amount of charge corresponding to data to be stored. The cell transistor CT switches conduction/non-conduction (selection/non-selection of the memory cell) between the memory cell MC and the bit line BL. The plurality of memory cells MC is arranged in a two-dimensional array or a three-dimensional array in the memory cell array 301. For example, the memory cell array 301 includes a plurality of banks. Each bank is a control unit including a plurality of memory cells MC. The plurality of banks may operate independently of one another.

The row decoder 302 controls selection/non-selection of the wiring (for example, the word line WL) in the row direction of the memory cell array 301 based on decoding result of the address information and the decoding result of the command.

The column decoder 303 controls selection/non-selection of the wiring (for example, the bit line BL) in the column direction of the memory cell array 301 based on the decoding result of the address information and the decoding result of the command.

The command decoder 304 decodes the command received from the command/address input circuit 306. Then, the command decoder 304 transmits the decoding result of the command to each of the row decoder 302 and the column decoder 303.

The address decoder 305 decodes the address information received from the command/address input circuit 306. Then, the address decoder 305 transmits the decoding result of the address information to each of the row decoder 302 and the column decoder 303.

The command/address input circuit 306 receives a command/address signal CA supplied from the outside. The command/address signal CA includes a command and address information. The command/address input circuit 306 transmits the command and the address information to the command decoder 304 and the address decoder 305, respectively.

The sense amplifier circuit 307 senses and amplifies the signal from the memory cell MC during the read operation. The sense amplifier circuit 307 transmits a signal from the memory cell MC as read data to the input/output circuit 310 via the transfer gate 308 and the RWAMP 309. The sense amplifier circuit 307 receives the write data from the input/output circuit 310 via the transfer gate 308 and the RWAMP 309. The sense amplifier circuit 307 outputs a signal corresponding to the write data to the bit line BL.

The transfer gate 308 controls data transfer between the sense amplifier circuit 307 and the RWAMP 309.

The RWAMP 309 amplifies the level (signal value) of the signal corresponding to the read data and the level of the signal corresponding to the write data.

The input/output circuit 310 functions as an interface circuit of a signal DQ transferred between the memory cell array 301 and the outside of the semiconductor device 300. The input/output circuit 310 sends write data to the memory cell array 301 at a timing synchronized with an internal clock CLK2. The input/output circuit 310 sends the read data to a device outside the semiconductor device 300 at a timing synchronized with the internal clock CLK2. For example, the input/output circuit 310 receives a data mask signal DM. The input/output circuit 310 performs mask processing on the signal DQ (data) based on the data mask signal DM.

The clock input circuit 311 receives a clock CLK1 from the outside (hereinafter, referred to as an external clock). The clock input circuit 311 sends the external clock CLK1 to the internal clock generator 312.

The internal clock generator 312 generates an internal clock CLK2 based on the external clock CLK1. The internal clock generator 312 sends the generated internal clock CLK2 to the input/output circuit 310 and the like.

The voltage generator 313 generates a plurality of voltages to be used for each of various operation sequences of the semiconductor device 300 by using a power supply voltage from the outside (a voltage applied to the power supply node VDD and a voltage applied to the ground node VSS). The voltage generator 313 sends the generated voltage to another circuit (for example, the RWAMP 309).

According to the third configuration example of the fifth embodiment, a case where the semiconductor device 300 is a DRAM is exemplified, but the present invention is not limited thereto. The semiconductor device 300 may be a random access memory other than the DRAM. For example, the semiconductor device 300 may be a static RAM (SRAM).

In the semiconductor device 300 according to the third configuration example of the fifth embodiment, for example, the CTLE (semiconductor circuits 3, 3A, 3B, and 3C) described in the above embodiment can be applied to the input/output circuit 310, the clock input circuit 311, and the internal clock generator 312.

Fourth Configuration Example: Cross-Point Memory

At least one of the semiconductor circuits 1, 1A to 1C, 2, 2A to 2C, 3, and 3A to 3C described in the first to fourth embodiments may be used for a cross-point memory. Hereinafter, as an example of such a cross-point memory, a semiconductor device 400 according to a fourth configuration example of the fifth embodiment will be described.

FIG. 24 is a block diagram illustrating an example of a configuration of the semiconductor device 400 (a cross-point memory) according to the fourth configuration example of the fifth embodiment. As illustrated in FIG. 24, the semiconductor device 400 operates under the control of a memory controller 410. The memory controller 410 can instruct the semiconductor device 400 to execute a read operation, a write operation, and the like in response to an instruction from an external host device. The semiconductor device 400 is a memory device using a magnetic tunnel junction (MTJ) element for a memory cell, and is a type of resistive random access memory. The MTJ element uses a magnetoresistance effect due to a magnetic tunnel junction. The MTJ element is also called a magnetoresistance effect element. The semiconductor device 400 includes, for example, a memory cell array 401, an input/output circuit 402, a control circuit 403, a row selection circuit 404, a column selection circuit 405, a writing circuit 406, and a read circuit 407.

The memory cell array 401 includes a plurality of memory cells MC, a plurality of word lines WL, and a plurality of bit lines BL. FIG. 24 illustrates a set of memory cells MC, word lines WL, and bit lines BL. The memory cell MC can store data in a nonvolatile manner. The memory cell MC is coupled between one word line WL and one bit line BL, and is associated with a set of a row and a column. A row address is assigned to the word line WL. A column address is allocated to the bit line BL. One or more memory cells MC can be identified by selecting one row and selecting one or more columns.

The input/output circuit 402 is coupled to the memory controller 410 and controls communication between the semiconductor device 400 and the memory controller 410. The input/output circuit 402 transfers a control signal CNT and a command CMD received from the memory controller 410 to the control circuit 403. The input/output circuit 402 transmits the row address and the column address included in the address signal ADD received from the memory controller 410 to the row selection circuit 404 and the column selection circuit 405, respectively. The input/output circuit 402 transfers the data DAT received from the memory controller 410 to the writing circuit 406. The input/output circuit 402 sends the data DAT received from the read circuit 407 to the memory controller 2.

The control circuit 403 controls the entire operation of the semiconductor device 400. For example, the control circuit 403 executes a read operation, a write operation, and the like based on the control instructed by the control signal CNT and the command CMD. For example, the control circuit 403 generates a voltage used for writing data in the write operation and supplies the voltage to the writing circuit 406. In addition, the control circuit 403 generates a voltage used for reading data in the read operation and supplies the voltage to the read circuit 407.

The row selection circuit 404 is coupled to the plurality of word lines WL. Then, the row selection circuit 404 selects one word line WL specified by the row address. The selected word line WL is electrically coupled to a driver circuit (not illustrated).

The column selection circuit 405 is coupled to the plurality of bit lines BL. Then, the column selection circuit 405 selects one or a plurality of bit lines BL specified by the column address. The selected bit line BL is electrically coupled to a driver circuit (not illustrated).

The writing circuit 406 supplies a voltage used for writing data to the column selection circuit 405 based on the control of the control circuit 403 and the data DAT (data requested to be written) received from the input/output circuit 402. When a current based on the data DAT flows through the memory cell MC, desired data is written to the memory cell MC.

The read circuit 407 includes a sense amplifier. The read circuit 407 supplies a voltage used for reading data to the column selection circuit 405 under the control of the control circuit 403. Then, the sense amplifier determines the data stored in the memory cell MC based on the voltage or the current of the selected bit line BL. Then, the read circuit 407 sends data DAT (data read from the memory cell array 401) corresponding to the determination result to the input/output circuit 402.

In the fourth configuration example of the fifth embodiment, the case where the semiconductor device 400 is the MRAM has been exemplified, but the present invention is not limited thereto. The semiconductor device 400 may be another resistive random access memory. For example, the semiconductor device 400 may be a memory device (for example, a resistance change type memory such as a resistive random access memory (ReRAM)) using a transition metal oxide element having a variable resistance characteristic as a memory element, a memory device (for example, a phase change memory such as a phase change random access memory (PCRAM)) using a phase change element as a memory element, or a memory device (for example, a ferroelectric memory such as a ferroelectric random access memory (FeRAM)) using a ferroelectric element as a memory element.

In the semiconductor device 400 according to the fourth configuration example of the fifth embodiment, for example, the CTLE (semiconductor circuits 3, 3A, 3B, and 3C) described in the above embodiment can be applied to the input/output circuit 402 and the control circuit 403.

Fifth Configuration Example: Image Sensor

At least one of the semiconductor circuits 1, 1A to 1C, 2, 2A to 2C, 3, and 3A to 3C described in the first to fourth embodiments may be used for an image sensor. Hereinafter, as an example of such an image sensor, a semiconductor device 500 according to a fifth configuration example of the fifth embodiment will be described.

FIG. 25 is a block diagram illustrating an example of a configuration of the semiconductor device 500 (image sensor) according to the fifth configuration example of the fifth embodiment. As illustrated in FIG. 25, the semiconductor device 500 includes, for example, a pixel array 501, a row scanning circuit 502, a column processing circuit 503, a column scanning circuit 504, a system controller 505, and a signal processing circuit 506.

The pixel array 501 includes a plurality of pixels PX. The plurality of pixels PX are arranged in a two-dimensional lattice shape along the row direction and the column direction. Each pixel PX includes a photoelectric conversion element. The photoelectric conversion element generates a charge corresponding to the amount of received light and accumulates the generated charge. A filter may be provided in the pixel array 501 for a light incident surface of each pixel PX. For example, the arrangement pattern of the plurality of filters is, for example, a Bayer pattern. In the pixel array 501, the plurality of pixels PX arranged in the row direction are commonly coupled to a pixel drive line PDL. In the pixel array 501, the plurality of pixels PX arranged in the column direction are commonly coupled to the corresponding one of a plurality of vertical signal lines VSL.

The row scanning circuit 502 is coupled to one ends of the plurality of pixel drive lines PDL. The row scanning circuit 502 generates a drive signal for performing signal reading drive from the pixel PX. The row scanning circuit 502 drives all the pixels PX of the pixel array 501 simultaneously or row by row via the plurality of pixel drive lines PDL. Signals output from the plurality of pixels PX driven by the row scanning circuit 502 are supplied to the column processing circuit 903 via the corresponding vertical signal line VSL for each pixel PX arranged in the row direction.

The column processing circuit 503 performs predetermined signal processing on the signal supplied via the vertical signal line VSL. With his configuration, the column processing circuit 503 can generate a pixel signal. Furthermore, the column processing circuit 503 can temporarily store the generated pixel signal. The column processing circuit 503 can execute, for example, noise removal processing, analog-digital conversion (AD conversion) processing, and the like. The digital signal obtained by the AD conversion is output to the signal processing circuit 506.

The column scanning circuit 504 sequentially selects reading circuits corresponding to the arrangement of the pixel signals of the column processing circuit 503. By selective scanning by the column scanning circuit 504, pixel signals subjected to signal processing for each pixel in the column processing circuit 503 are output based on a predetermined order.

The system controller 505 receives a system clock signal and the like via a controller (not illustrated) outside the semiconductor device 500. The system controller 505 includes a timing generator and the like. The timing generator generates various timing signals based on the system clock signal. With this configuration, the system controller 505 drives the row scanning circuit 502, the column processing circuit 503, the column scanning circuit 504, and the like based on the generated various timing signals.

The signal processing circuit 506 has at least an arithmetic processing function. The signal processing circuit 506 executes various types of signal processing such as arithmetic processing on the pixel signal output from the column processing circuit 503.

Note that the digital signal output from the signal processing circuit 506 is output to an image processing circuit 507 outside the semiconductor device 500. The image processing circuit 507 executes predetermined processing on the digital signal. Then, the image processing circuit 507 generates an image signal for displaying an image on a predetermined display device.

In the semiconductor device 500 according to the fifth configuration example of the fifth embodiment, for example, the CTLE (semiconductor circuits 3, 3A, 3B, and 3C) described in the above embodiment can be applied to the system controller 505 that receives a system clock signal.

Sixth Configuration Example: Communication Interface

At least one of the semiconductor circuits 1, 1A to 1C, 2, 2A to 2C, 3, and 3A to 3C described in the first to fourth embodiments may be used for a communication interface. Hereinafter, as an example of such a communication interface, a semiconductor device 600 according to a sixth configuration example of the fifth embodiment will be described. Note that the communication interface may be a circuit compatible with wired communication such as light or Ethernet (registered trademark), or may be a circuit compatible with wireless communication such as RF.

Figure 26:
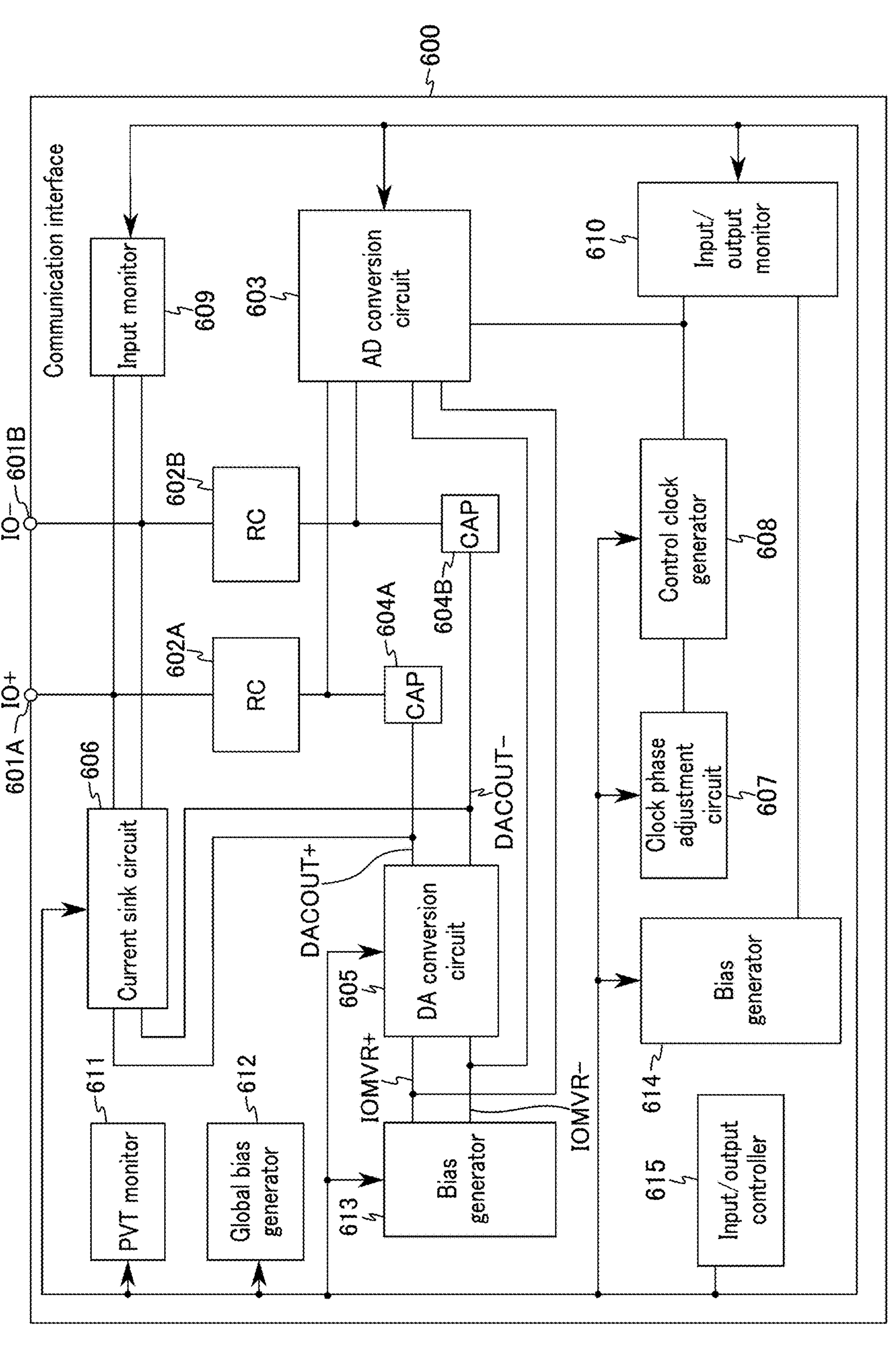
FIG. 26 is a block diagram illustrating an example of a configuration of a semiconductor device according to a sixth configuration example of the fifth embodiment.

FIG. 26 is a block diagram illustrating an example of a configuration of the semiconductor device 600 (a communication interface) according to the sixth configuration example of the fifth embodiment. As illustrated in FIG. 26, the semiconductor device 600 is a differential transmission type input/output interface circuit (for example, a transceiver). Specifically, the semiconductor device 600 includes input/output terminals 601A and 601B, resistor-capacitor (RC) circuits 602A and 602B, an analog-digital (AD) conversion circuit 603, capacitor circuits 604A and 604B, a digital-analog (DA) conversion circuit 605, a current sink circuit 606, a clock phase adjustment circuit 607, a control clock generator 608, an input monitor 609, an input/output monitor 610, a PVT monitor 611, a global bias generator 612, bias generators 613 and 614, and an input/output controller 615.

The input/output terminals 601A and 601B are a pair of differential input/output terminals. The semiconductor device 600 can transmit and receive the differential signals IO+ and IO− via the input/output terminals 601A and 601B, respectively. The two differential signals IO+ and IO− have a complementary relationship with each other. Note that the two input/output terminals 601A and 601B that form a pair to perform differential transmission may be referred to as a differential input/output terminal pair. A pair of signal lines for differential transmission in the semiconductor device 600 may be referred to as a differential transmission path.

The RC circuits 602A and 602B are provided corresponding to the input/output terminals 601A and 601B, respectively. The RC circuit 602A is coupled to a signal path of the input/output terminal 601A. The RC circuit 602B is coupled to a signal path of the input/output terminal 601B. The RC circuits 602A and 602B control a time constant related to the supplied signal. The RC circuits 602A and 602B include a resistor and a capacitor, and can be designed (programmed) after mounting. The RC circuit may be referred to as an RC network.

The AD conversion circuit 603 receives the differential signals IO+ and IO− input to the semiconductor device 600 via the RC circuits 602A and 602B. The AD conversion circuit 603 receives the reference signals IOMVR+ and IOMVR− from the bias generator 613. The AD conversion circuit 603 converts the signals IO+ and IO− from analog signals to digital signals based on the reference signals IOMVR+ and IOMVR−.

The capacitor circuit 604A is provided between the RC circuit 602A and the DA conversion circuit 605. The capacitor circuit 604B is provided between the RC circuit 602B and the DA conversion circuit 605. The capacitor circuit 604A is coupled to the RC circuit 602A. The capacitor circuit 604B is coupled to the RC circuit 602B. The capacitor circuits 604A and 604B include a plurality of capacitors. The capacitor circuits 604A and 604B perform signal smoothing.

The DA conversion circuit 605 receives digital signals. The DA conversion circuit 605 receives the reference signals IOMVR+ and IOMVR− from the bias generator 613. The DA conversion circuit 605 generates analog signals DACOUT+ and DACOUT− based on the received digital signals and reference signals IOMVR+ and IOMVR−. The analog signals DACOUT+ and DACOUT− are signals having a complementary relationship with each other. The DA conversion circuit 605 sends the generated analog signal DACOUT+ to the input/output terminal 601A via the capacitor circuit 604A and the RC circuit 602A. The DA conversion circuit 605 sends the generated analog signal DACOUT− to the input/output terminal 601B via the capacitor circuit 604B and the RC circuit 602B. With this configuration, the signals DACOUT+ and DACOUT− are output to the outside of the semiconductor device 600 as differential signals IO+ and IO−, respectively. Furthermore, the DA conversion circuit 605 sends the analog signals DACOUT+ and DACOUT− to the current sink circuit 606.

The current sink circuit 606 controls the magnitude of the current flowing through the input/output terminals 601 and the signal lines within an allowable range based on the specification of the communication interface.

The clock phase adjustment circuit 607 adjusts the phase of the reference clock signal and generates various clock signals used in the semiconductor device 600.

The control clock generator 608 adjusts the phase of the reference clock signal and generates various clock signals used in the semiconductor device 600.

The input monitor 609 monitors each of the signal IO+ at the input/output terminal 601A and the signal IO− at the input/output terminal 601B.

The input/output monitor 610 monitors a plurality of clock signals received from the control clock generator 608.

The PVT monitor 611 monitors various band gap voltages and bias voltages in the semiconductor device 600. The band gap voltage is a voltage serving as a reference (reference voltage) for signal voltage amplitude. The bias voltage is a voltage for operation of each circuit block in the semiconductor device 600.

The global bias generator 612 generates a main bias voltage used for each circuit block in the semiconductor device 600.

The bias generator 613 generates a voltage serving as a reference of a bias voltage (bias signal) of the AD conversion circuit 603 and the DA conversion circuit 605.

The bias generator 614 generates a bias voltage for the AD conversion circuit 603 and the input/output controller 615.

The input/output controller 615 generates a control signal for each circuit block in the semiconductor device 600. The input/output controller 615 supplies the generated control signal to each circuit block.

In the semiconductor device 600 according to the sixth configuration example of the fifth embodiment, for example, the CTLE (semiconductor circuit 3, 3A, 3B, and 3C) described in the above embodiment can be applied to the control clock generator 608. Furthermore, in the semiconductor device 600 according to the sixth configuration example of the fifth embodiment, the differential amplifier circuit (semiconductor circuits 2, 2A, 2B, and 2C) described in the above embodiment can be applied to a circuit that handles differential signals (for example, the AD conversion circuit 603, the DA conversion circuit 605, the current sink circuit 606, the input monitor 609, and the bias generator 613).

Seventh Configuration Example: Wireless Device

At least one of the semiconductor circuits 1, 1A to 1C, 2, 2A to 2C, 3, and 3A to 3C described in the first to fourth embodiments may be used for a wireless device. Hereinafter, as an example of such a wireless device, a semiconductor device 700 according to a seventh configuration example of the fifth embodiment will be described.

Figure 27:
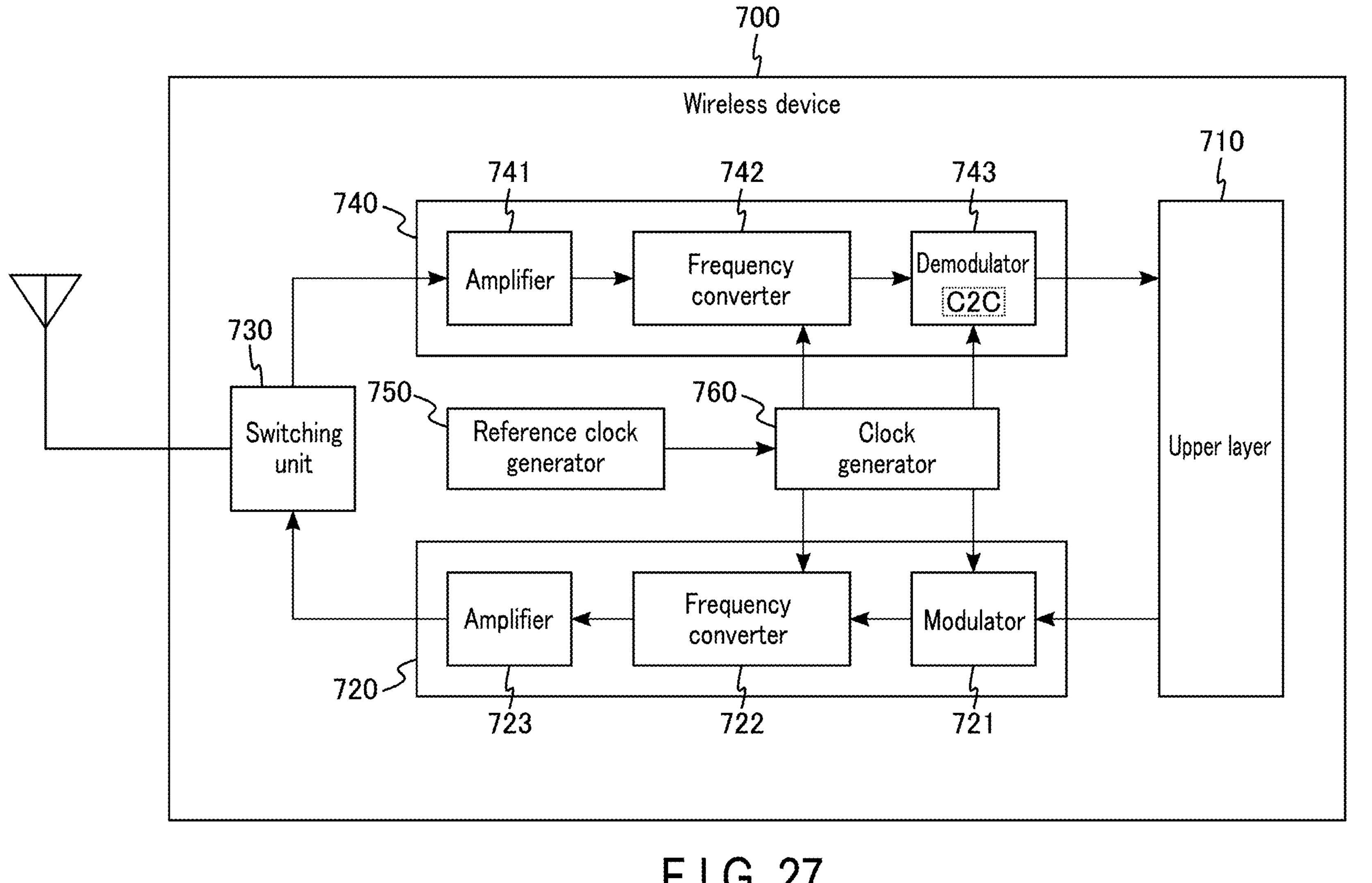
FIG. 27 is a block diagram illustrating an example of a configuration of a semiconductor device according to a seventh configuration example of the fifth embodiment.

FIG. 27 is a block diagram illustrating an example of a configuration of the semiconductor device 700 (a wireless device) according to the seventh configuration example of the fifth embodiment. As illustrated in FIG. 27, the semiconductor device 700 includes, for example, an upper layer 710, a transmission unit 720, a switching unit 730, a reception unit 740, a reference clock generator 750, and a clock generator 760.

The upper layer 710 is a functional block that handles frames transmitted and received by the semiconductor device 700. The upper layer 710 can execute processing of an MAC layer, for example. For example, the upper layer 710 generates a frame by using traffic generated from an application of the wireless device, and inputs the generated frame to the transmission unit 720. In addition, the upper layer 710 extracts data from the frame received from the reception unit 740 and inputs the extracted data to the application.

The transmission unit 720 converts the frame input from the upper layer 710 into a radio signal and transmits the radio signal via an antenna. The transmission unit 720 includes, for example, a modulator 721, a frequency converter 722, and an amplifier 723. The modulator 721 inputs a signal obtained by modulating the input frame to the frequency converter 722. The frequency converter 722 converts the frequency of the input signal into a desired frequency and inputs the frequency to the amplifier 723. The amplifier 723 is a solid state power amplifier (SSPA) that amplifies an input signal. The amplifier 723 includes, for example, an amplifier circuit, an isolator, and a low-pass filter. The signal output from the amplifier 723 is radiated from the antenna via the switching unit 730.

The switching unit 730 is a circuit capable of switching connection with the antenna between the transmission unit 720 and the reception unit 740.

The reception unit 740 extracts a frame from a radio signal received via the antenna and inputs the frame to the upper layer 710. The reception unit 740 includes, for example, an amplifier 741, a frequency converter 742, and a demodulator 743. The amplifier 741 amplifies the signal received via the antenna and inputs the amplified signal to the frequency converter 742. The amplifier 741 includes, for example, a band pass filter and an amplifier circuit. The frequency converter 742 converts the frequency of the input signal into a desired frequency and inputs the frequency to the demodulator 743. The demodulator 743 demodulates the input signal and extracts a frame included in the radio signal. Then, the demodulator 743 inputs the extracted frame to the upper layer 710.

The reference clock generator 750 generates a reference clock signal used in the semiconductor device 700.

The clock generator 760 generates a plurality of clock signals used in the semiconductor device 700 based on the reference clock signal. Then, the clock generator 760 inputs the generated clock signal to, for example, the modulator 721, the frequency converters 722 and 742, and the demodulator 743.

In the semiconductor device 700 according to the seventh configuration example of the fifth embodiment, for example, the C2C circuit (semiconductor circuits 1, 1A, 1B, and 1C) described in the above embodiment can be applied to the demodulator 743.

Eighth Configuration Example: Microcontroller

At least one of the semiconductor circuits 1, 1A to 1C, 2, 2A to 2C, 3, and 3A to 3C described in the first to fourth embodiments may be used for a microcontroller. Hereinafter, as an example of such a microcontroller, a semiconductor device 800 according to an eighth configuration example of the fifth embodiment will be described.

Figure 28:
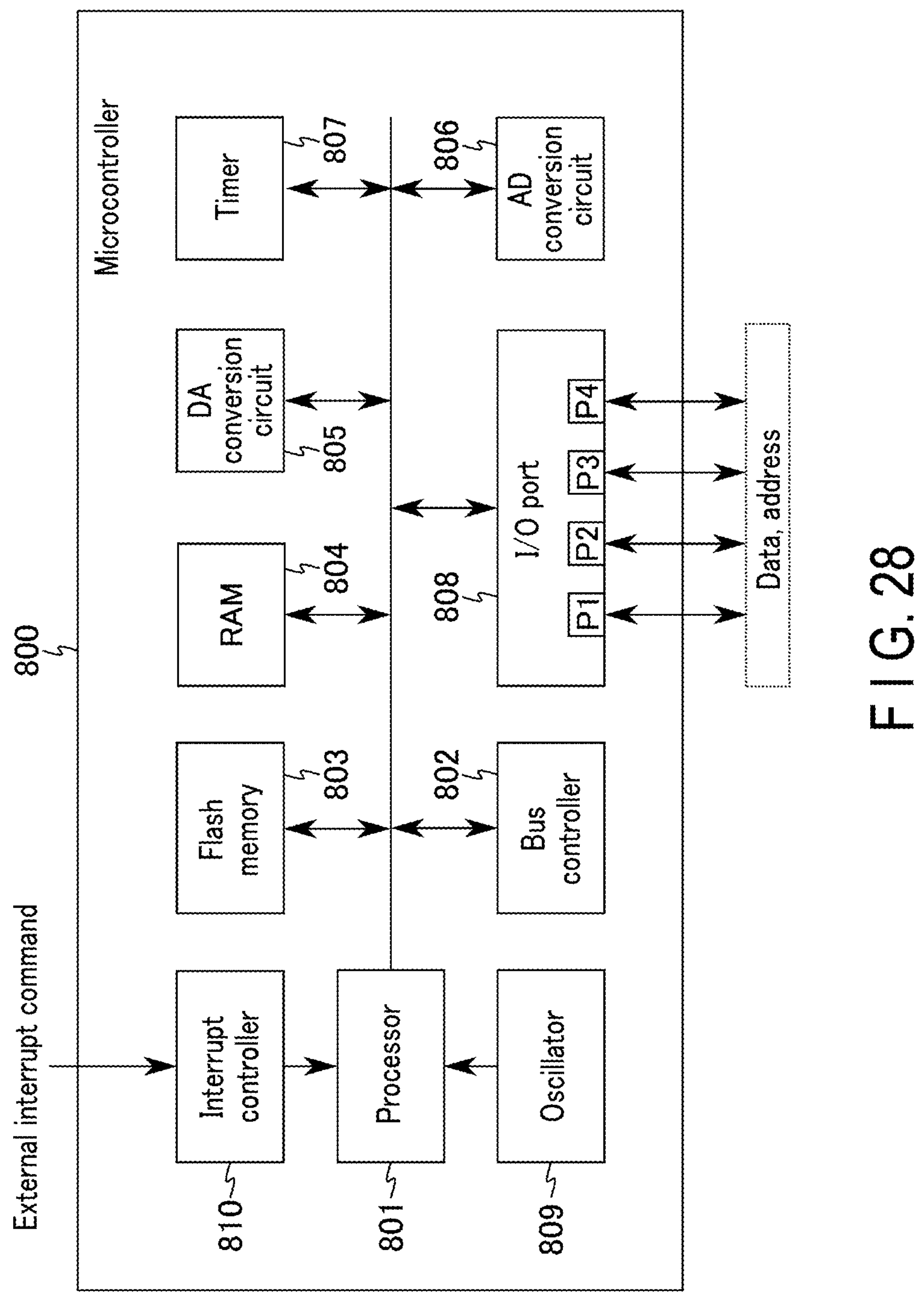
FIG. 28 is a block diagram illustrating an example of a configuration of a semiconductor device according to an eighth configuration example of the fifth embodiment.

FIG. 28 is a block diagram illustrating an example of a configuration of the semiconductor device 800 (a microcontroller) according to the eighth configuration example of the fifth embodiment. As illustrated in FIG. 28, the semiconductor device 800 includes, for example, a processor 801, a bus controller 802, a flash memory 803, a RAM 804, a DA conversion circuit 805, an AD conversion circuit 806, a timer 807, an input/output (I/O) port 808, an oscillator 809, and an interrupt controller 810. The bus of the semiconductor device 800 is coupled to the processor 801, the bus controller 802, the flash memory 803, the RAM 804, the DA conversion circuit 805, the AD conversion circuit 806, the timer 807, and the input/output port 808. The bus of the semiconductor device 800 is a signal and data transmission path in the semiconductor device 800.

The processor 801 executes various processes in the semiconductor device 800. The processor 801 performs various processes on the supplied data. The processor 801 is, for example, a CPU.

The bus controller 802 controls the bus of the semiconductor device 800. The bus controller 802 may be provided in the processor 801.

The flash memory 803 is a storage device capable of storing data in a nonvolatile manner. The flash memory 803 is, for example, a NOR flash memory. The flash memory 803 may be a NAND flash memory.

The RAM 804 is a storage device that temporarily stores data. The RAM 804 is, for example, a random access memory such as SRAM or DRAM.

The DA conversion circuit 805 converts a digital signal (digital value) into an analog signal (analog value).

The AD conversion circuit 806 converts an analog signal into a digital signal.

The timer 807 manages time (operation timing) in the semiconductor device 800.

The input/output port 808 functions as an interface circuit in the semiconductor device 800. The input/output port 808 includes, for example, four ports P1, P2, P3, and P4. The number of ports included in the input/output port 808 may be three or less, or may be five or more. The input/output port 808 receives a signal including data, an address, and the like from the outside of the semiconductor device 800 via each of the ports P1, P2, P3, and P4. The input/output port 808 transmits a signal such as data to the outside of the semiconductor device 800 via each of the ports P1, P2, P3, and P4. The input/output port 808 conforms to, for example, a general purpose input/output (GPIO) standard, a universal synchronous/asynchronous receiver transmitter (USART) standard, an inter-integrated circuit (I2C) standard, or the like.

The oscillator 809 outputs a clock signal as a synchronization signal to the processor 801. The clock signal has a certain period (number of clocks). With this configuration, the processor 801 performs various types of processing at timing synchronized with the clock signal. The cycle of the clock signal is, for example, 4 MHZ, 8 MHz, 12 MHz, 24 MHz, or the like.

The interrupt controller 810 receives an external interrupt command. For example, the interrupt controller 810 has a register for managing the status of interrupt requests. The interrupt controller 810 sends various interrupt requests to the processor 801 based on the received external interrupt command. In response to the interrupt request, the processor 801 temporarily interrupts the processing being executed and executes the processing of the interrupt request. After completion of the processing of the interrupt request, the processor 801 resumes the suspended processing.

In the semiconductor device 800 according to the eighth configuration example of the fifth embodiment, the microcontroller 1C the present embodiment may be a system on a chip (SoC), a system in package (SIP), or a system on package (SoP). The semiconductor device 800 is used in, for example, an embedded system. The semiconductor device 800 may be used for, for example, an in-vehicle device, a home electric appliance, a computer, an industrial machine, a railway vehicle, an aircraft, a ship, and the like.

Furthermore, the semiconductor device 800 may be classified based on a bus width, a memory structure, a command set, and the like. The bus width indicates a size of the data bus. For example, the semiconductor device 800 is classified into an 8-bit microcontroller, a 16 bit-microcontroller, or a 32 bit-microcontroller based on the bus width. The semiconductor device 800 can obtain better performance with a high bus width.

In the semiconductor device 800 according to the eighth configuration example of the fifth embodiment, for example, the CTLE (semiconductor circuits 3, 3A, 3B, and 3C) described in the above embodiment can be applied to the input/output port 808. Furthermore, in the semiconductor device 800 according to the eighth configuration example of the fifth embodiment, for example, the C2C circuit (semiconductor circuits 1, 1A, 1B, and 1C) described in the above embodiment can be applied to the processor 801.

<5-2> Advantageous Effects of Fifth Embodiment

As the storage capacity of the NAND flash memory increases, the frequency of a signal transmitted and received between the semiconductor memory device and the memory controller increases, and data transfer of the signal transmission circuit in the input/output circuit 102 becomes difficult. For example, since the wiring length from the WDCA 113 to each data input circuit 114 is different, a variation in skew may occur in each of the plurality of data input circuits 114 receiving the different signals DO.

Therefore, in the first configuration example of the fifth embodiment, the input/output circuit 102 of the semiconductor device 100 (NAND flash memory) includes the C2C circuit described in the above embodiment. With this configuration, the input/output circuit 102 can reduce the gain in the vicinity of the direct current, and can suppress variations in skew for each data input circuit 114. As a result, the semiconductor device 100 according to the first configuration example of the fifth embodiment can use a high-frequency signal, and can realize high-speed transmission of data and the like with the memory controller 110.

Similarly to the first configuration example of the fifth embodiment, the second to eighth configuration examples of the fifth embodiment can realize high-speed signal transmission by using at least one of the C2C circuit, the differential amplifier circuit, and the CTLE described in the first to fourth embodiments, that is, at least one of the semiconductor circuits 1, 1A to 1C, 2, 2A to 2C, 3, and 3A to 3C.

<6> Others

In the present specification, the voltage at the "H" level corresponds to a voltage equal to or higher than a threshold when data is determined by binary. The voltage at the "L" level corresponds to a voltage lower than a threshold in determining data by binary. In the present specification, the "logic level" corresponds to either the "H" level or the "L" level. In the present specification, "connection" indicates electrical connection, and does not exclude that another element is interposed therebetween, for example. The "electrically coupled" may be via an insulator as long as it can operate in the same manner as the electrically coupled one.

In the present specification, each of one end and the other end of the transistor corresponds to a source end or a drain end of the transistor. In the present specification, "conductivity type" corresponds to "N type" or "P type". For example, the transistor of the first conductivity type corresponds to one of the N-type transistor and the P-type transistor, and the transistor of the second conductivity type corresponds to the other of the N-type transistor and the P-type transistor. One end and the other end may be referred to as a "first end" and a "second end". The ground node VSS may be referred to as a power supply node. The input end and the output end of the constant current source CS correspond to one end and the other end of the current path of the constant current source CS, respectively. One end of the constant current source CS corresponds to one of the input end and the output end, and the other end of the constant current source CS corresponds to the other of the input end and the output end.

In the above embodiment, each of the constant current sources CS 10, CS 20, CS 30, and CS 31 includes, for example, one N-type MOS transistor. Each of the constant current sources CS 11, CS 12, CS 21, CS 32, and CS 33 includes, for example, one P-type MOS transistor. Note that the constant current source CS may include a plurality of transistors. For example, the constant current source CS may include a current mirror circuit including two transistors. In this case, each of the constant current sources CS 10, CS 20, CS 30, and CS 31 includes a current mirror circuit including an N-type MOS transistor, and each of the constant current sources CS 11, CS 12, CS 21, CS 32, and CS 33 includes a current mirror circuit including a P-type MOS transistor.

FIG. 29 is a circuit diagram illustrating an example of a circuit configuration of a constant current source CS including an N-type transistor (hereinafter, referred to as a constant current source CSN). As illustrated in FIG. 29, the constant current source CSN includes, for example, N-type transistors NM90 and NM91 and nodes ND90 to ND92. A drain end and a gate end of the N-type transistor NM90 are coupled to the node ND90. A drain end of the N-type transistor NM91 is coupled to the node ND91. A gate end of the N-type transistor NM91 is coupled to the node ND90. Source ends of the N-type transistors NM90 and NM91 are coupled to the node ND92. The node ND92 is coupled to, for example, a ground node VSS. In the constant current source CSN, the voltage of the node ND90 is controlled so that the current flowing through the N-type transistor NM91 becomes constant. In other words, the input end of the constant current source CSN corresponds to the node ND91. An output end of the constant current source CSN corresponds to the node ND92.

FIG. 30 is a circuit diagram illustrating an example of a circuit configuration of a constant current source CS including a P-type transistor (hereinafter, referred to as a constant current source CSP). As illustrated in FIG. 30, the constant current source CSP includes, for example, P-type transistors PM90 and PM91 and nodes ND93 to ND95. The node ND93 is coupled to a power supply node VDD. Source ends of the P-type transistors PM90 and PM91 are coupled to the node ND93. A gate end and a drain end of the P-type transistor PM90 are coupled to the node ND94. A gate end of the P-type transistor PM91 is coupled to the node ND94. A drain end of the P-type transistor PM91 is coupled to the node ND95. In the constant current source CSP, the voltage of the node ND94 is controlled so that the current flowing through the P-type transistor PM91 becomes constant. In other words, the input end of the constant current source CSP corresponds to the node ND93. An output end of the constant current source CSP corresponds to the node ND95.

In the present specification, the sizes of the transistors are compared using the gate width, for example in the case of planar MOSFETs. In the present specification, the sizes of the transistors are compared using the number of fins, for example, in the case of a FinFET. In the present specification, for example, in the case of a Nanosheet transistor, the sizes of the transistors are compared by using the number of stacked layers of the Nanosheet which is a semiconductor layer.

In the FinFET, the gate electrode faces two or more surfaces of the channel region. The channel region is formed in a convex shape formed on the surface of the semiconductor substrate, and the convex semiconductor region is referred to as a fin. One transistor may have a plurality of fins. In a case where the number of fins in one transistor is smaller than the number of fins in the other transistors, one transistor is smaller than the other transistors. In a case where the ratio between the size of one transistor (for example, the P-type transistor PM12) and the size of the other transistor (for example, the P-type transistor PM10) is 1:1.2 to 7, for example, when the number of fins of one transistor is one, the number of fins of the other transistor is two to seven, and when the number of fins of one transistor is two, the number of fins of the other transistor is three to fourteen.

In the Nanosheet, the gate electrodes face each other so as to wrap the channel region. The channel region is formed in a flat plate-shaped semiconductor layer (Nanosheet). A plurality of flat-plate-shaped semiconductor layers may be stacked apart from each other. In a case where the number of semiconductor layers in one transistor is smaller than the number of semiconductor layers in the other transistors, one transistor is smaller than the other transistors. In a case where the ratio of the size of one transistor (for example, the P-type transistor PM12) and the size of the other transistor (for example, the P-type transistor PM10) is 1:1.2 to 7, for example, when the semiconductor layer of one transistor is one layer, the semiconductor layer of the other transistor is two to seven layers, and when the semiconductor layer of one transistor is two layers, the number of stacked semiconductor layers of the other transistor is three to fourteen layers.

In the present specification, "NMOS base" indicates that a transistor that receives an input signal is an N-type transistor. "PMOS base" indicates that the transistor that receives the input signal is a P-type transistor. Current mode logic (CML) is a circuit that transmits an analog small signal. The CMOS strictly means a CMOS inverter, and is a circuit that transmits a digital large signal. The C2C circuit corresponds to a circuit that converts an analog small signal into a digital large signal. A fixed pattern in which the signal at the "L" level is continuous or a pattern in which the signal at the "H" level is continuous may be regarded as the DC signal.

Although some embodiments of the present invention have been described, these embodiments have been presented as examples, and are not intended to limit the scope of the invention. These novel embodiments can be implemented in various other forms, and various omissions, substitutions, and changes can be made without departing from the gist of the invention. These embodiments and modifications thereof are included in the scope and gist of the invention and are included in the invention described in the claims and the equivalent scope thereof.

What is claimed is:

1. A semiconductor circuit comprising:

first to third first-conduction-type transistors;

first and second second-conduction-type transistors; and a constant current source, wherein one end and another end of the first first-conduction-type transistor are respectively coupled to a first power supply node and a first node, and a gate end of the first first-conduction-type transistor is coupled to the first node via a resistor, one end and another end of the second first-conduction-type transistor are respectively coupled to the first power supply node and a second node, the second node is coupled to an output node, and a gate end of the second first-conduction-type transistor is coupled to the first node, one end and another end of the first second-conduction-type transistor are respectively coupled to the first node and a third node, and a gate end of the first second-conduction-type transistor is coupled to a first input node, one end and another end of the second second-conduction-type transistor are respectively coupled to the second node and the third node, and a gate end of the second second-conduction-type transistor is coupled to a second input node, one end and another end of the constant current source are respectively coupled to the third node and a second power supply node, and one end and another end of the third first-conduction-type transistor are respectively coupled to the first power supply node and the second input node, and a gate end of the third first-conduction-type transistor is coupled to a gate end of the first first-conduction-type transistor.

2. The semiconductor circuit according to claim 1, wherein the first-conduction-type is a P-type, the second-conduction-type is an N-type, and a voltage higher than a voltage of the second power supply node is applied to the first power supply node.

3. The semiconductor circuit according to claim 1, wherein the first-conduction-type is an N-type, the second-conduction-type is a P-type, and a voltage lower than a voltage of the second power supply node is applied to the first power supply node.

4. The semiconductor circuit according to claim 1, further comprising fourth to sixth first-conduction-type transistors, wherein one end and another end of the fourth first-conduction-type transistor are respectively coupled to the first power supply node and the second input node, and a gate end of the fourth first-conduction-type transistor is coupled to the gate end of the first first-conduction-type transistor, the fifth first-conduction-type transistor is coupled between the first power supply node and the third first-conduction-type transistor, the sixth first-conduction-type transistor is coupled between the first power supply node and the fourth first-conduction-type transistor, and different control signals are input to a gate end of the fifth first-conduction-type transistor and a gate end of the sixth first-conduction-type transistor.

5. The semiconductor circuit according to claim 1, wherein the third first-conduction-type transistor is smaller than the first first-conduction-type transistor.

6. The semiconductor circuit according to claim 1, wherein a first clock signal is input to the first input node, and a second clock signal that is an inverted signal of the first clock signal is input to the second input node.

7. A semiconductor device comprising:
a data input circuit including the semiconductor circuit according to claim 6;
a first pad that is coupled to the data input circuit and receives a first signal from outside;
a second pad that receives a second signal from outside;
a third pad that receives a third signal from outside;
an amplifier circuit configured to generate the first clock signal based on the second signal and the third signal; and
a processing circuit configured to handle data output from the data input circuit,
wherein the data input circuit is configured to sample the first signal based on the first clock signal and outputs sampled data to the processing circuit.

8. The semiconductor device according to claim 7, wherein
the data input circuit includes
a conversion circuit configured to convert the first clock signal amplified via the semiconductor circuit into a CMOS level,
a continuous-time linear equalizer configured to compensate and output the first signal, and
a sampler configured to sample an output signal of the continuous-time linear equalizer based on the first clock signal converted into the CMOS level by the conversion circuit, and output sampled data to the processing circuit.

9. A semiconductor circuit comprising:
first to fourth first-conduction-type transistors;
first and second second-conduction-type transistors; and
a constant current source, wherein
one end and another end of the first first-conduction-type transistor are respectively coupled to a first power supply node and a first node, a gate end of the first first-conduction-type transistor is coupled to the first node via a first resistor, and the first node is coupled to a first output node,
one end and another end of the second first-conduction-type transistor are respectively coupled to the first power supply node and a second node, a gate end of the second first-conduction-type transistor is coupled to the second node via a second resistor different from the first resistor, and the second node is coupled to a second output node,
one end and another end of the first second-conduction-type transistor are respectively coupled to the first node and a third node, and a gate end of the first second-conduction-type transistor is coupled to a first input node,
one end and another end of the second second-conduction-type transistor are respectively coupled to the second node and the third node, and a gate end of the second second-conduction-type transistor is coupled to a second input node,
one end and another end of the constant current source are respectively coupled to the third node and a second power supply node,
one end and another end of the third first-conduction-type transistor are respectively coupled to the first power supply node and the second input node, and a gate end of the third first-conduction-type transistor is coupled to the gate end of the first first-conduction-type transistor, and
one end and another end of the fourth first-conduction-type transistor are respectively coupled to the first power supply node and the first input node, and a gate end of the fourth first-conduction-type transistor is coupled to the gate end of the second first-conduction-type transistor.

10. The semiconductor circuit according to claim 9, wherein
the first-conduction-type is a P-type,
the second-conduction-type is an N-type, and
a voltage higher than a voltage of the second power supply node is applied to the first power supply node.

11. The semiconductor circuit according to claim 9, wherein
the first-conduction-type is an N-type,
the second-conduction-type is a P-type, and
a voltage lower than a voltage of the second power supply node is applied to the first power supply node.

12. The semiconductor circuit according to claim 9, further comprising
fifth to seventh first-conduction-type transistors, wherein
one end and another end of the fifth first-conduction-type transistor are respectively coupled to the first power supply node and the second input node, and a gate end of the fifth first-conduction-type transistor is coupled to the gate end of the first first-conduction-type transistor,
the sixth first-conduction-type transistor is coupled between the first power supply node and the third first-conduction-type transistor,
the seventh first-conduction-type transistor is coupled between the first power supply node and the fifth first-conduction-type transistor, and
different control signals are input to a gate end of the sixth first-conduction-type transistor and a gate end of the seventh first-conduction-type transistor.

13. The semiconductor circuit according to claim 12, further comprising
eighth to tenth first-conduction-type transistors, wherein
one end and another end of the eighth first-conduction-type transistor are respectively coupled to the first power supply node and the first input node, and a gate end of the eighth first-conduction-type transistor is coupled to the gate end of the second first-conduction-type transistor,
the ninth first-conduction-type transistor is coupled between the first power supply node and the fourth first-conduction-type transistor,
the tenth first-conduction-type transistor is coupled between the first power supply node and the eighth first-conduction-type transistor, and
different control signals are input to a gate end of the ninth first-conduction-type transistor and a gate end of the tenth first-conduction-type transistor.

14. A semiconductor circuit comprising:
first and second first-conduction-type transistors;
first and second second-conduction-type transistors;
first to third resistors;
a capacitor; and
first and second constant current sources, wherein
the first resistor is coupled between a first power supply node and a first node, and the first node is coupled to a first output node,
the second resistor is coupled between the first power supply node and a second node, and the second node is coupled to a second output node,
one end and another end of the first second-conduction-type transistor are respectively coupled to the first node and a third node, and a gate end of the first second-conduction-type transistor is coupled to a first input node, one end and another end of the second second-conduction-type transistor are respectively coupled to the second node and a fourth node, and a gate end of the second second-conduction-type transistor is coupled to a second input node, one end and another end of the first constant current source are respectively coupled to the third node and a second power supply node, one end and another end of the second constant current source are respectively coupled to the fourth node and the second power supply node, the third resistor and the capacitor are coupled in parallel between the third node and the fourth node, one end and another end of the first first-conduction-type transistor are respectively coupled to the first power supply node and the second input node, and a gate end of the first first-conduction-type transistor is coupled to the first node, and one end and another end of the second first-conduction-type transistor are respectively coupled to the first power supply node and the first input node, and a gate end of the second first-conduction-type transistor is coupled to the second node.

15. The semiconductor circuit according to claim 14, wherein the first-conduction-type is a P-type, the second-conduction-type is an N-type, and a voltage higher than a voltage of the second power supply node is applied to the first power supply node.

16. The semiconductor circuit according to claim 14, wherein the first-conduction-type is an N-type, the second-conduction-type is a P-type, and a voltage lower than a voltage of the second power supply node is applied to the first power supply node.

17. The semiconductor circuit according to claim 14, further comprising third to fifth first-conduction-type transistors, wherein one end and another end of the third first-conduction-type transistor are respectively coupled to the first power supply node and the second input node, and a gate end of the third first-conduction-type transistor is coupled to the gate end of the first first-conduction-type transistor, the fourth first-conduction-type transistor is coupled between the first power supply node and the first first-conduction-type transistor, the fifth first-conduction-type transistor is coupled between the first power supply node and the third first-conduction-type transistor, and different control signals are input to a gate end of the fourth first-conduction-type transistor and a gate end of the fifth first-conduction-type transistor.

18. The semiconductor circuit according to claim 17, further comprising sixth to eighth first-conduction-type e transistors, wherein one end and another end of the sixth first-conduction-type transistor are respectively coupled to the first power supply node and the first input node, and a gate end of the sixth first-conduction-type transistor is coupled to the gate end of the second first-conduction-type transistor, the seventh first-conduction-type transistor is coupled between the first power supply node and the second first-conduction-type transistor, the eighth first-conduction-type transistor is coupled between the first power supply node and the sixth first-conduction-type transistor, and different control signals are input to a gate end of the seventh first-conduction-type transistor and a gate end of the eighth first-conduction-type transistor.

19. A semiconductor device comprising:

a data input circuit including the semiconductor circuit according to claim 14;

a first pad that is coupled to the first input node and receives a first signal from outside;

a second pad that receives a second signal from outside;

a third pad that receives a third signal from outside;

an amplifier circuit that generates a clock signal based on the second signal and the third signal; and a processing circuit that handles data output from the data input circuit, wherein the data input circuit includes a sampler configured to sample an output signal of the semiconductor circuit generated based on the first signal based on the clock signal and output sampled data to the processing circuit.

20. The semiconductor device according to claim 19, wherein the data input circuit includes a plurality of the semiconductor circuits, and the plurality of semiconductor circuits are coupled in series between the first pad and the sampler.

* * * * *